US006496972B1

(12) United States Patent
Segal

(10) Patent No.: US 6,496,972 B1
(45) Date of Patent: Dec. 17, 2002

(54) METHOD AND SYSTEM FOR CIRCUIT DESIGN TOP LEVEL AND BLOCK OPTIMIZATION

(75) Inventor: Russell B. Segal, Sunnyvale, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 09/395,025

(22) Filed: Sep. 13, 1999

(51) Int. Cl.[7] .............................................. G06F 17/50
(52) U.S. Cl. .................................. 716/18; 716/3; 716/5; 716/6; 716/7; 716/13; 716/14; 716/16; 716/17; 716/18
(58) Field of Search .............................. 716/1–6, 12–18, 716/7

(56) References Cited

U.S. PATENT DOCUMENTS

| | | | | |
|---|---|---|---|---|
| 5,313,398 A | * | 5/1994 | Rohrer et al. | 364/468 |
| 5,331,568 A | * | 7/1994 | Pixley | 364/489 |
| 5,459,673 A | * | 10/1995 | Carmean et al. | 364/489 |
| 5,644,498 A | * | 7/1997 | Joly et al. | 364/489 |
| 5,651,012 A | * | 7/1997 | Jones, Jr. | 371/22.1 |
| 5,751,593 A | * | 5/1998 | Pullela et al. | 364/488 |
| 5,757,658 A | * | 5/1998 | Rodman et al. | 364/491 |
| 5,933,356 A | * | 8/1999 | Rostoker et al. | 364/489 |
| 6,049,659 A | * | 4/2000 | Matsumoto et al. | 395/500.02 |
| 6,066,177 A | * | 5/2000 | Hatsuda | 703/19 |
| 6,182,247 B1 | * | 1/2001 | Herrmann et al. | 714/39 |
| 6,205,572 B1 | * | 3/2001 | Dupenloup | 716/5 |

* cited by examiner

Primary Examiner—Vuthe Siek
Assistant Examiner—Granvill D Lee, Jr.
(74) Attorney, Agent, or Firm—Wagner, Murabito & Hao LLP

(57) ABSTRACT

In a computer-implemented synthesis system, a method of optimizing a design of an integrated circuit device. The optimization process includes the computer-implemented steps of accessing a circuit netlist representing an integrated circuit design to be realized in physical form, wherein the circuit netlist includes a top-level block and at least a first and a second circuit block. The top-level block includes glue logic for coupling the first and second circuit blocks. The process creates a first model of the first circuit block and a second model of the second circuit block, the first model and the second model each operable for independently abstracting embodying circuitry of the first and second circuit blocks, respectively. The circuit netlist is optimized by independently optimizing the first circuit block and the second circuit block, and the top-level block to yield a fully optimized circuit netlist. The first and second circuit blocks are both independently optimized. Then, the first and second circuit blocks within the top-level block are replaced with the first and second models respectively. The top-level block is then optimized with the first and second models included therein, thereby reducing the computer resources required to optimize the top-level block. Subsequently, a fully optimized circuit netlist is generated by combining the optimized first and second circuit blocks with the optimized top-level block.

28 Claims, 36 Drawing Sheets

1600 CONT.

METHOD AND SYSTEM FOR CIRCUIT DESIGN TOP LEVEL AND BLOCK OPTIMIZATION

FIELD OF THE INVENTION

The field of the present invention pertains to the field of integrated circuit design optimization using electronic design automation tools. More particularly, aspects of the present invention pertain to a circuit design optimization process for use in the design of complex integrated circuits with computer aided design (CAD) tools.

BACKGROUND OF THE INVENTION

Computer systems, software applications, and the devices and processes built around them are continually growing in power and complexity. Society's reliance on such systems is likewise increasing, making it critical that the systems deliver the expected performance and obey the properties that their designers intended. As each successive generation of computer and software implemented systems and processes become more powerful, the task of designing and fabricating them becomes increasingly difficult.

The design and manufacture of increasingly complex integrated circuits involves extensive use of CAD tools. The development of ASICs (application specific integrated circuits) and other complex integrated circuits using CAD tools is referred to as electronic design automation, or EDA. The design, checking, and testing of large-scale integrated circuits are so complex that the extensive use of CAD and EDA tools are required for realization of modern, complex integrated circuits.

The development of a new integrated circuit device begins with a design phase involving extensive use of CAD tools to facilitate various aspects of designing the new integrated circuit device. Typically, CAD tools function in part by decomposing the overall desired behavior of the integrated circuit into simpler functions which are more easily manipulated and processed by the CAD tool. The CAD tool performs considerable computation to generate an efficient layout of a resulting "network" of design elements (e.g., logic gates, storage elements, etc.). The resulting network, commonly referred to as a netlist, comprises a detailed specification defining the integrated circuit, typically in terms of a particular fabrication technology (e.g., CMOS). The netlist can be regarded as a template for the fabrication of the physical embodiment of the integrated circuit using transistors, routing resources, etc.

Netlists for integrated circuit designs can represent a particular integrated circuit in different levels of abstraction, such as the register transfer level (RTL) and the logical level, using a hardware description language (HDL), also called high level design language. Design engineers typically define netlists using one of two popular forms of HDL, Verilog, and VHDL. Via the HDL defined netlist, the integrated circuit can be represented by different layers of abstractions (e.g., behavioral levels, structural levels, and gate levels). For example, an RTL level netlist is an intermediary level of abstraction between the behavioral and structural levels. HDL descriptions (e.g., netlists) can represent all of these levels.

The HDL description is used along with a set of circuit constraints as an input to a computer-implemented compiler (also called a "silicon compiler" or "design compiler"). The compiler program processes the HDL description of the integrated circuit and generates therefrom a low-level netlist comprised of detailed lists of logic components and the interconnections between these components. The components specified by the netlist can include primitive cells such as full-adders, NAND gates, NOR gates, XOR gates, latches, and D-flip flops, etc., and their interconnections.

Prior art FIG. 1 shows an exemplary flow chart diagram of a typical prior art logic synthesis process 100. Process 100 is implemented in a CAD environment within a computer system. Process 100 begins in step 101, where an HDL description of the integrated circuit is received (e.g., from a design application). In step 102, the HDL description is compiled by a specialized HDL compiler tool. The compiler (also called an HDL compiler, RTL synthesizer, or architectural optimizer) inputs the HDL description and compiles this description using logic optimization procedures and mapping procedures which interface with a technology-dependent cell library 103 (e.g., from LSI, VLSI, TI or Xilinx technologies, etc.). The cell library 103 contains specific information regarding the cells of the specific technology selected. Such information includes, for example, the cell logic, number of gates, area consumption, power consumption, pin descriptions, etc., for each cell in the library 103. The compiling procedure of step 102 ultimately generates a gate level mapped netlist that is technology dependent, having cells specifically selected in accordance with the particular manufacturing technology being used to fabricate the integrated circuit device.

In step 104, the compiler then performs optimization processing on the resulting mapped netlist from step 102. The optimization processing is performed using a set of design constraints 105. The gate level netlist received from step 102 is processed in light of the design constraints 105. Design constraints 105 include the set of performance constraints applicable to the design, which typically include timing, area, power consumption, and other performance-related limitations that the compiler (e.g., in step 102) will attempt to satisfy when synthesizing the integrated circuit design. These constraints can also include non-performance related constraints such as structural and routing constraints.

Referring still to step 104 of prior art FIG. 1, constraints are used to guide the optimization and mapping of a design towards feasible realization in terms of area, performance, costs, testability, power consumption, and other physical limitations. The constraints provide the goals for the optimization and synthesis tools to achieve. Performance and area constraints are. the two most common constraints. For example, for behavioral synthesis, the area constraints are usually specified at the architectural level where a designer specifies the number of function units, registers, and busses to be used on the RTL structure. The timing constraints are specified as the expected clock frequency of each clock signal.

Technology libraries 103 and design constraints 105 typically contain all the information needed by the synthesis tool to make correct choices in building the structure of the integrated circuit. They contain descriptions of the behavior of a cell and information such as the area of the cell, the timing of the cell, the capacitance loading of the cell, the rise and fall delay values for the basic cells, etc. The objective of the optimization process is to generate the most efficient detailed layout of the integrated circuit possible.

Subsequently, in step 106, the resulting optimized netlist is simulated to verify its performance. In step 107, if the optimized netlist performs as desired, the resulting verified netlist proceeds to subsequent fabrication processing and is fabricated into a resulting integrated circuit device.

However, should performance of the optimized netlist prove sub-standard, additional optimization processing and simulation is performed until the netlist can be verified.

The increasing size and complexity of modern integrated circuit devices lead to numerous problems with prior art process 100. The compiling and optimization of large integrated circuit designs are very resource and computer intensive. The compiling and optimization a large integrated circuit designs typically require one, or more, of the most powerful CAD workstations. Large amounts of memory required to store the details regarding the various aspects of the netlist and large amounts of CPU time are required to perform the various compilation and optimization routines on the netlist.

Thus, large complex integrated circuit designs do not lend themselves to efficient optimization using prior art processes, such as process 100. Optimization processing on large design as shown by the steps 104–107 is often cost and time prohibitive. This leads to a number of serious consequences. For example, successive passes through steps 104–107, as is often required in order to optimize a design completely, can be very impractical. Because of this, large designs are typically not optimized is vigorously as smaller designs. This leads to fabricated integrated circuit devices which are less than optimally efficient (e.g., larger than necessary die size, slower performance, greater power consumption, and the like).

For this reason, it is typical for large integrated circuit designs to be broken down into separate circuit blocks which each block independently being subjected to one or more of the steps of process 100. Specifically, "characterization" refers to the process of setting up distinct circuit blocks of a large circuit design to be optimized independently, outside of the whole integrated circuit design. For instance, assume a circuit design, E, contains circuit blocks: A; B; C; and D. Circuit E has specified timing constraints and timing exceptions. Characterization automatically generates timing constraints and exceptions which are appropriate for the optimization of blocks A, B, C and D, independently. When optimizing the blocks, the optimization tool 104 (FIG. 1) need only load and process one block at a time. This decreases the demand of the tool on the computer resources. After the blocks have been optimized, they are then re-assembled back into circuit E. One example of the characterization described above is the "characterize" command found in the above referenced Design Compiler tool from Synopsys.

Accordingly, what is required is a system capable of efficiently optimizing large complex integrated circuit designs. What is acquired is a system capable of vigorously optimizing a complex integrated circuit design within the reasonable time and resource constraints of modern EDA design synthesis processes. What is further required is a system capable of optimizing all portions and all aspects of a complex integrated circuit design. The present invention provides a novel solution to these requirements.

SUMMARY OF THE INVENTION

The present invention provides a system capable of efficiently optimizing large complex integrated circuit designs. The present invention provides a method and system for vigorously optimizing a complex integrated circuit design within the reasonable time and resource constraints of modern EDA design synthesis processes. Additionally, the present invention provides a method and system capable of optimizing all portions and all aspects of a complex integrated circuit design.

In one embodiment, the present invention is implemented as an optimization process within a computer-implemented synthesis system. The optimization process functions with other design synthesis tools within the synthesis system (e.g., a CAD workstation) to optimize a gate level netlist of an integrated circuit device in light of specific design constraints. Using modeling technology in accordance with the present invention, optimization occurs in an incremental manner, at a top level of the netlist and at the one or more included circuit block levels of the netlist, such that the entire netlist is optimized while efficiently utilizing the memory and processing resources of the CAD workstation.

The optimization process includes the computer-implemented steps of accessing a circuit netlist representing an integrated circuit design to be realized in physical form (e.g., from a design application), wherein the circuit netlist includes a top-level block and at least a first and a second circuit block. The top-level block includes glue logic and other types of connection circuitry and couples/interfaces the first and second circuit blocks. The optimization process creates a first model of the first circuit block and a second model of the second circuit block. The models are created using modeling technology in accordance with the present invention, wherein the models include sufficient information to describe timing aspects and timing exceptions that are applicable to the first and second circuit blocks respectively.

With this information, the first and second models function by abstracting the embodying circuitry of the first block and the second block, including design constraint dependencies, such as timing constraints and timing exceptions. The first and second models require much less memory and computer resources to store and simulate than the first and second circuit blocks themselves. Hence, the first and second circuit blocks within the top-level block are replaced by their respective models, thereby greatly reducing the amount of memory and computer resources required to store and simulate the top-level block. This allows the entirety of the integrated circuit device to be optimized in a piece-wise fashion wherein multiple blocks can be optimized simultaneously, e.g., in parallel.

In block and top optimization, the entire circuit netlist is optimized by independently optimizing the first circuit block and the second circuit block using characterization. The first and second circuit blocks within the top-level block are replaced by their respective models, thereby allowing the top-level block to be independently optimized within the finite resources of the CAD workstation. Then, the optimized top-level block and the optimized first and second circuit blocks are recombined, yielding a fully optimized circuit netlist. In so doing, all portions and all aspects of the complex integrated circuit design are efficiently optimized, at both the top level and the one or more included circuit blocks.

In a bottle optimization embodiment of the present invention, the circuit blocks are optimized simultaneously with a selected part of the top-level circuit block. Each circuit block has a unique selected part of the top-level circuit which does not overlap the selection of any other part. This selected part of the top-level circuit is the glue logic and connections which are connected closest to the outputs of a particular circuit block. The particular circuit block is optimized with the selected part of the top level circuit.

In an in-context embodiment of the present invention, the circuit blocks are individually optimized within the context of the top level circuit. In-context optimization runs at the top-level of the chip. It is enabled by the use of models in place of all but one or just a few circuit blocks. Optimization is then run at the top-level. This allows the optimization of the remaining circuit blocks (those not replaced by models) with the top level circuit.

BRIEF DESCRIPTION OF THE DRAWINGS

The present invention is illustrated by way of example and not by way of limitation, in the figures of the accompanying drawings and in which like reference numerals refer to similar elements and in which.

Prior art

DETAILED DESCRIPTION OF THE INVENTION

Figure 1:
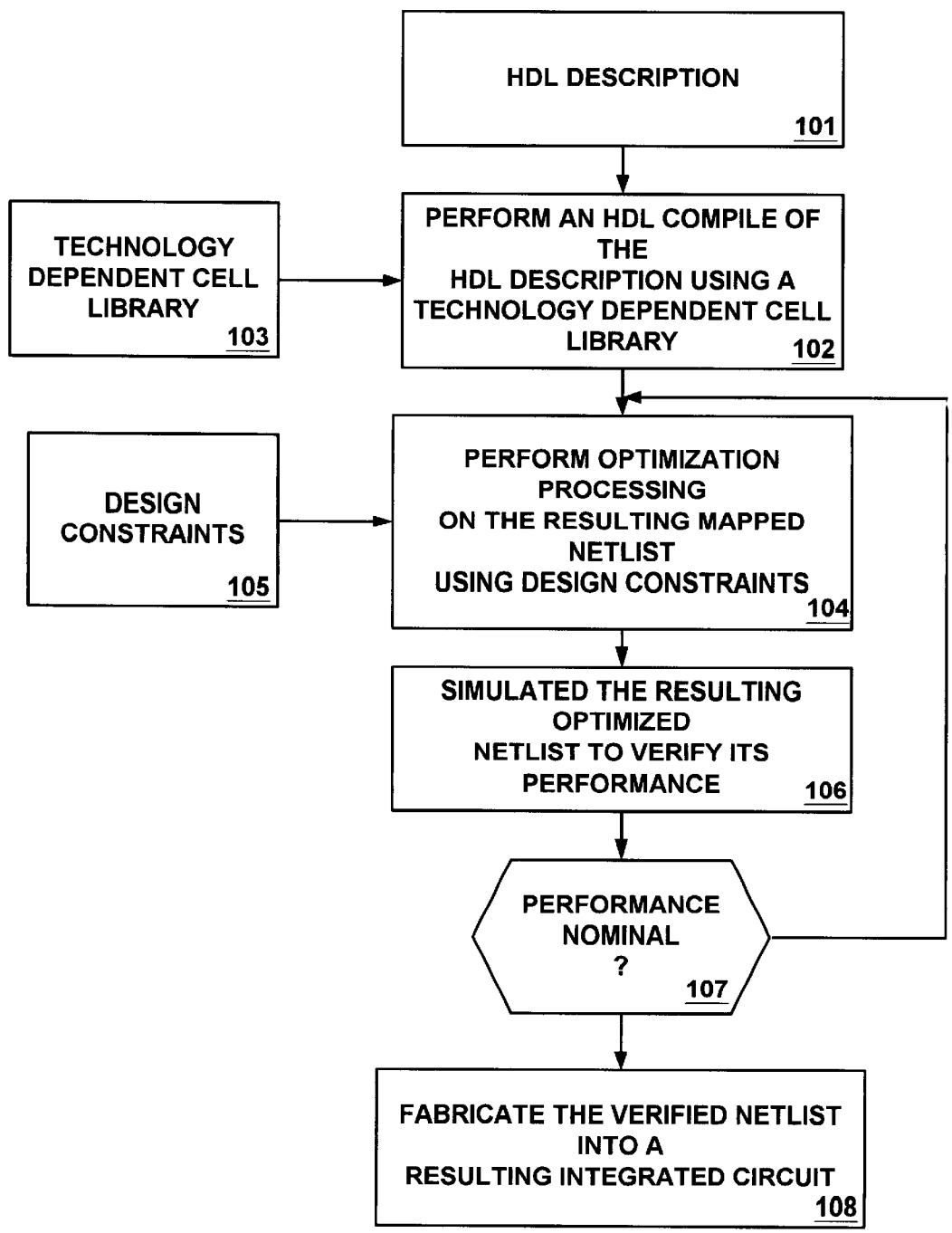
FIG. 1 shows an exemplary flowchart diagram of a typical prior art logic synthesis process, including an optimization process.

Reference will now be made in detail to the embodiments of the invention, a method and system for circuit design top-level and block optimization, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

The present invention provides a system capable of efficiently optimizing large complex integrated circuit designs. The present invention provides a method and system for incrementally optimizing a complex integrated circuit design within the reasonable time and resource constraints of modern EDA design synthesis processes. Additionally, the present invention provides a method and system capable of optimizing portions and aspects of a complex integrated circuit design. The present invention and its benefits are further described below.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing," "computing," "translating," "instantiating," "determining," "optimizing," "recognizing," or the like, refer to the action and processes of a computer system, or similar electronic computing device, that manipulates and transforms data represented as physical (electronic) quantities within the computer system's registers and memories into other data similarly represented as physical quantities within the computer. system registers or memories or other such information storage, transmission, or display devices.

Computer System Environment

Figure 2:
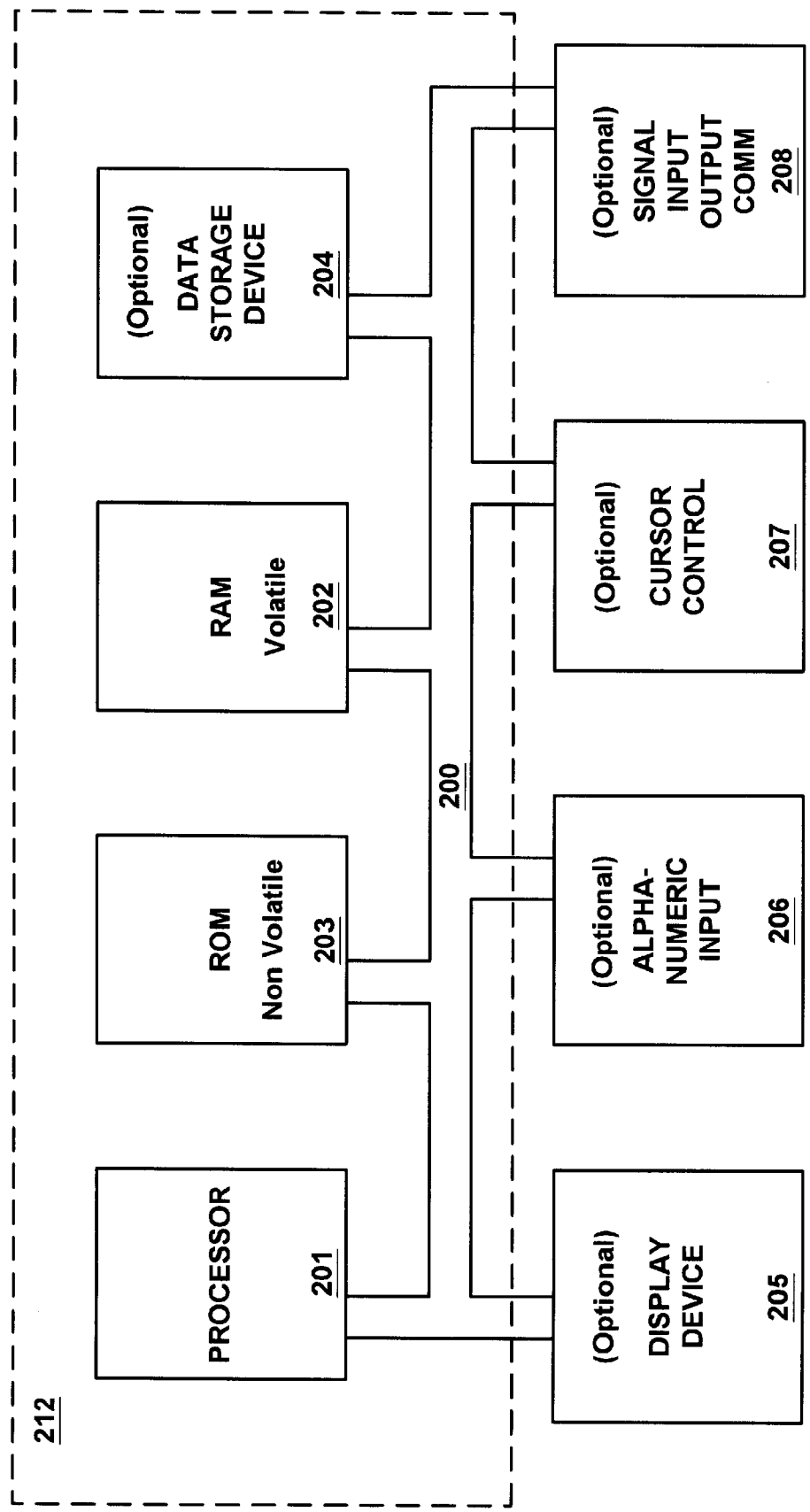
FIG. 2 shows a computer system in accordance with one embodiment of the present invention.

Referring to FIG. 2, a computer system 212 is illustrated. Within the following discussions of the present invention, certain processes and steps are discussed that are realized, in one embodiment, as a series of instructions (e.g., software program) that reside within computer readable memory units of system 212 and executed by processors of system 212. When executed, the instructions cause computer system 212 to perform specific actions and exhibit specific behavior which is described in detail to follow.

Specific aspects of the present invention are operable within a programmed computer aided design (CAD) system. A CAD system 212 operable to implement the elements of the present invention is shown in FIG. 2. In general, the CAD system 212 of the present invention includes an address/data bus 200 for communicating information, one or more central processor(s) 201 coupled with bus 200 for processing information and instructions, a computer readable volatile memory unit 202 (e.g., random access memory, static RAM, dynamic RAM, etc.) coupled with bus 200 for storing information and instructions for the central processor(s) 201, and a computer readable non-volatile memory unit 203 (e.g., read only memory, programmable ROM, flash memory, EPROM, EEPROM, etc.) coupled with bus 200 for storing static information and instructions for processor(s) 201. System 212 can optionally include a mass storage computer readable data storage device 204, such as a magnetic or optical disk and disk drive coupled with bus 200 for storing information and instructions. Optionally, system 212 can also include a display device 205 coupled to bus 200 for displaying information to the computer user, an alphanumeric input device 206 including alphanumeric and function keys coupled to bus 200 for communicating information and command selections to central processor(s) 201, a cursor control device 207 coupled to bus for communicating user input information and command selections to the central processor(s) 201, and a signal input/output device 208 coupled to the bus 200 for communicating messages, command selections, data, etc., to and from processor(s) 201.

Program instructions executed by the CAD system can be stored in RAM 202, ROM 203, or the storage device 204 and, when executed in a group, can be referred to as logic blocks or procedures. It is appreciated that data produced at the various logic synthesis stages of the present invention, including representations of the different levels of abstraction of the integrated circuit design, can also be stored in RAM 202, ROM 203, or the storage device 204 as shown in FIG. 2.

The display device 205 of FIG. 2 utilized with the computer system 212 of the present invention may be a liquid crystal device, cathode ray tube, or other display device suitable for creating graphic images and alphanumeric characters recognizable to the user. The cursor control device 207 allows the computer user to signal dynamically the two dimensional movement of a visible pointer on a display screen of the display device 205. Many implementations of the cursor control device are known in the art including a trackball, mouse, joystick, or special keys on the alphanumeric input device 205 capable of signaling movement of a given direction or manner of displacement.

General Definitions

Following are general definitions various terms and processes used in the description of the method and system of the present invention and its various aspects.

Circuit optimization: Circuit optimization, or "optimization," as used herein refers to the process of mapping one representation of functionality for an electronic circuit to another. The representation may be in terms of a circuit netlist (an abstract interconnection of electronic components), a circuit layout (an interconnection of components and their associated physical placement and wiring), or an abstract functional description which simply describes the function a circuit should perform without fully specifying circuit details. In general, optimization attempts to improve some aspect of the functionality of a circuit, such as, for example, its size, its speed, its power consumption, or some other circuit characteristic.

Circuit block: circuit block as used herein refers to a distinct component of functionality of a circuit design. For example, in very large integrated circuit, it is common to split the functionality of the integrated circuit into distinct circuit blocks. The circuit blocks are often designed and built separately and assembled into a larger circuit. The choice of boundaries between blocks can be arbitrary, depending upon any particular requirements of a user.

Circuit block pin: A circuit block pin, often referred to simply as a "pin," is the point at which a circuit block connects to the circuit around it.

Circuit block model: A circuit-block model, often referred to as a "circuit model" or "model," is a replacement for a circuit block. Circuit blocks can be pulled out of a top-level circuit and replaced by circuit models. Models are generally much smaller than their corresponding circuit blocks in terms of complexity and the computer memory needed to represent them. In typical cases, models cannot be used as universal replacements for circuit blocks and are typically designed for a specific purpose such as timing analysis (see definition of timing analysis below). However, as further described below, circuit block models in accordance with the present invention include sufficient information to allow their use in the optimization of top-level blocks.

Model pin: A model pin as used herein refers to the point at which a model connects to the circuit around it. Model pins have a one-to-one correspondence with the pin of the circuit block that the model replaces.

Top-level circuit: The top-level circuit, or top-level block, represents the complete electronic integrated circuit that is being designed which is usually a complete computer chip. Within the top-level block is one or more circuit blocks which are to be assembled together.

Incremental optimization: As used herein, incremental optimization refers to a process of optimizing an integrated circuit design in portions (e.g., piece-wise), rather than all at once. For example, an integrated circuit design which contains two interconnected circuit blocks can be optimized all at once, or incrementally, first one circuit blocks then the other, then the connections between the two. In incremental optimization, while the circuit blocks are optimized incrementally of other blocks, generally, they can nevertheless be optimized in parallel to save processing time.

Glue logic: Glue logic refers to the electronic circuitry required to interface two or more circuit blocks. When circuit blocks are assembled into a larger circuit, it is common to put electronic circuitry (or electrical connections) between the circuit blocks to couple and make them operate together. The circuitry which sits between circuit blocks is called glue logic.

Circuit path: A circuit path is a sequence of circuit components along which a logical signal is propagated. For instance, a circuit path can be a logic signal which starts at component A, is passed through component B, through C, and is used at component D.

Circuit delay: Circuit delay describes the speed at which a logic signal can be passed along a circuit path.

Timing constraints: As used herein, timing constraints are a type of design constraints resulting from, for example, a circuit designer specifying his goals for the speed (timing) of a circuit. If a designer specifies a "tight" timing constraint, then the circuit optimization should attempt to make a circuit fast. For instance, a timing constraint may specify that circuit delays should be made to be 10 nanoseconds or less.

Timing exception: A timing exception overrides the general timing constraints of a circuit and generally associates a circuit path. For example, the timing constraint may specify that a circuit should complete its processing in 10 nanoseconds. A timing exception can then specify that the circuit delay between point A and point B within the circuit should be 20 nanoseconds instead. Another exception can specify that the circuit delay between C and D is not important at all and should be ignored for the purpose of optimization.

Arrival time: As used herein, arrival time can be defined for any arbitrary chosen place in a circuit. Its value represents the actual circuit delay leading from a predetermined start point to the chosen place within the circuit.

Required time: As used herein, required time can be defined for any arbitrary chosen place in a circuit. Its value represents the desired circuit delay leading from a predetermined start point to the chosen place. The required time varies with timing constraints and timing exceptions of the circuit. In accordance with the present embodiment, the goal of optimization is to make the arrival time at a point less than or equal to the required time.

Static timing analysis: Static timing analysis is the process by which a computer program calculates the circuit delays of a circuit. In a simple embodiment, timing analysis merely adds the individual delays along a circuit path to obtain a circuit delay. In a more general embodiment, timing analysis calculates arrivals times and required times, taking into account timing constraints and timing exceptions.

Circuit Optimization Generally

The present invention provides a method and system for efficiently optimizing large complex integrated circuit designs. In so doing, the present invention overcomes the problems posed by the optimization analysis of very large integrated circuit designs. Modern high-performance integrated circuits are growing larger and larger. When the designs of such circuits become very large, they place a huge burden on optimization and analysis tools which try to process them. In particular, with the increasing size of integrated circuits, the tools require increasingly large amounts of computer memory and CPU time to process the circuits in their entirety.

Embodiments of the present invention optimize large complex integrated circuits in part by using novel modeling technology to partition an overall integrated circuit design into two or more circuit blocks (e.g., a top-level block and one or more lower-level blocks). Modeling technology of the present invention represents a circuit block in a more compact form so that it requires less computer memory to represent and process while retaining specific information required to optimize circuitry interacting with the circuit block. In addition, the modeling technology of the present invention provides sufficient information to properly calculate timing in the presence of timing exceptions. These attributes allow embodiments of the present invention to optimize large complex integrated circuits piece-wise, with individual circuit blocks being optimized independently, as opposed to optimizing the entire integrated circuit at once. In so doing, the resources of the CAD workstation performing the optimization (e.g., memory, CPU cycles, bus bandwidth, etc.) are more efficiently utilized since the large complex integrated circuit can be optimized in a piece-wise and parallel manner. Alternatively, since the circuit blocks can be optimized independently, the individual circuit blocks comprising the large integrated circuit can be optimized in parallel, using, for example, a number of CAD workstations.

As described above, optimization as performed by embodiments of the present invention refers to the process of mapping one representation of functionality for an electronic circuit to another. The representation may be in terms of a circuit netlist (an abstract interconnection of electronic components), a circuit layout (an interconnection of components and their associated physical placement and wiring), or an abstract functional description which simply describes the function that a circuit should perform without fully specifying circuit details.

In general, optimization attempts to improve some aspect of the functionality of a circuit, such as, for example, its size, its speed, its power consumption, or some other circuit characteristic. Characterization refers to the process of setting up distinct circuit blocks of a large circuit to be optimized independently, outside of the whole circuit. For example, given a circuit E which contains blocks A, B, C, and D, in a case where circuit E has specified timing constraints and timing exceptions, characterization will automatically generate timing constraints and exceptions which are appropriate for the optimization of A, B, C, and D. When optimizing the circuit blocks, the optimization tool needs only to load and process one circuit block at a time, thereby decreasing the demand on the tool. In accordance with one embodiment of the present invention, blocks A, B, C, and D are replaced by respective models within circuit E, thereby allowing the optimization of circuit E (since the models of the present invention require much less storage resources than the actual circuit blocks). After the circuit blocks have been optimized, they are then re-assembled back into circuit E.

Modeling Generally

Modeling in accordance with the present invention represents a circuit block in a more compact form so that it requires less computer memory to represent. Usually, models achieve their smaller memory requirements by omitting details about the original block in the model. Because details are omitted from them, models generally cannot be used as a universal replacement for a circuit block. Usually models can only be used for very specific purposes. A model can be used in a circuit to evaluate the timing, as in a case where models are used for replacing prepackaged, self-contained circuit blocks. In accordance with embodiments of the present invention, additional information is included in the models, enabling their use in general applications such as optimization.

Specific Optimization Methods

As described above, the present invention utilizes new modeling technology to allow automated circuit optimization to be performed on extremely large circuits without the need to load all of the details of the circuit into computer memory. The new modeling technology of the present invention provides models for circuit blocks which include sufficient information to calculate properly timing, even in the presence of timing exceptions. In so doing, the present invention allows large complex real-world circuits to be processed and completely optimized, even in the presence of timing exceptions.

Figure 3A:
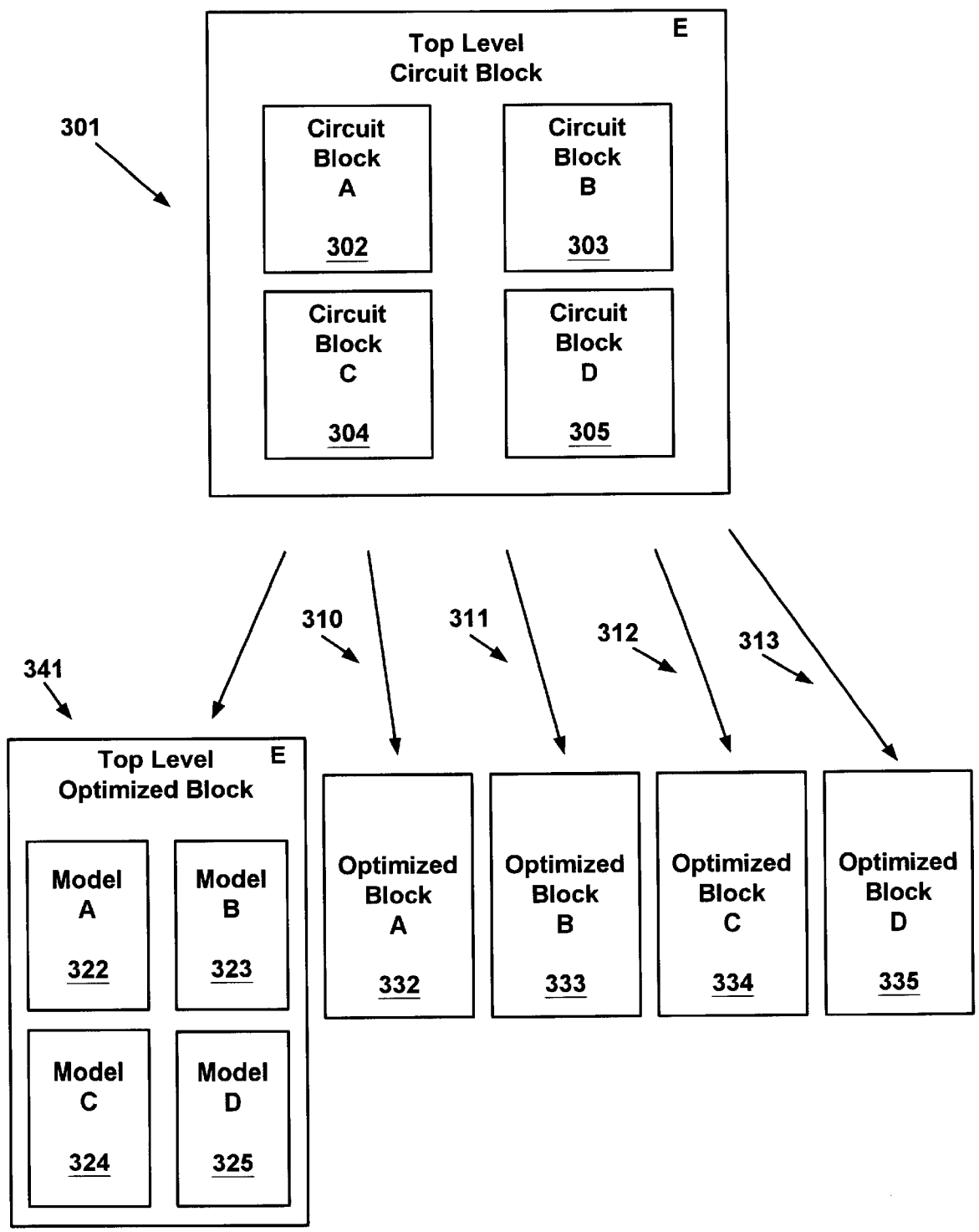
FIG. 3A shows a block diagram of an integrated circuit including a top-level block and a plurality of sub-portion circuit blocks in accordance with one embodiment of the present invention.

Referring now to FIG. 3A, a diagram of an integrated circuit 300 including a top-level circuit block 301 and sub-portion circuit blocks 302–305 is shown. As depicted in FIG. 3A, top-level circuit block E includes glue logic of integrated circuit 300 as required to integrate the various circuit blocks 302–305. Circuit blocks A-D (circuit blocks 302–305) each comprises distinct functional entities of circuitry comprising integrated circuit 300. As described above, it is common to split the functionality of a large circuit into distinct circuit blocks, the circuit blocks often being designed and built separately for assembly into the larger top-level circuit.

Figure 3B:
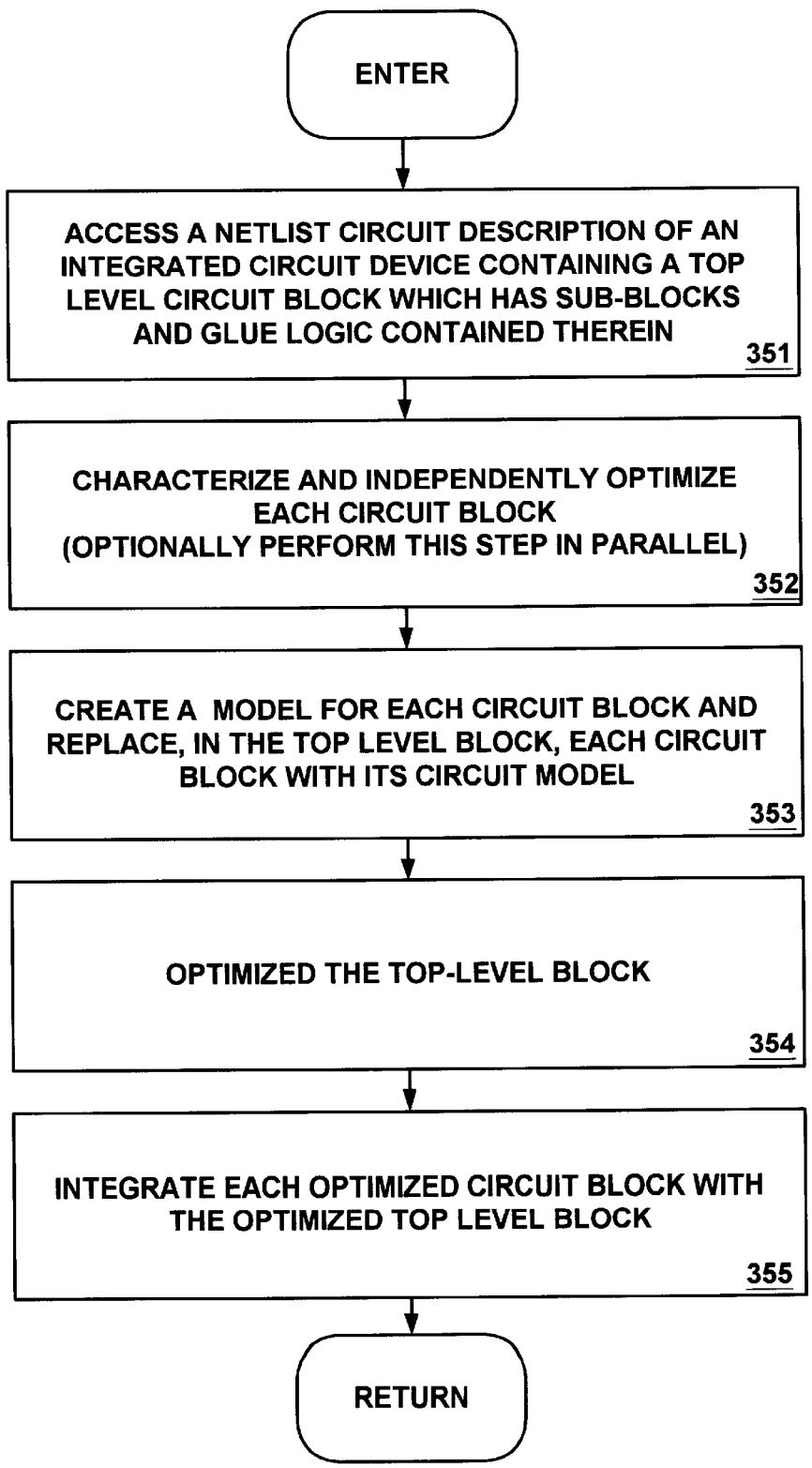
FIG. 3B shows a flow chart of the steps of a block and top optimization process in accordance with one embodiment of the present invention.

FIG. 3A depicts a "block and top" optimization process in accordance with one embodiment of the present invention, and FIG. 3B shows the steps of a block and top optimization process 350 in accordance with one embodiment of the present invention. In this embodiment, the overall integrated circuit 300 is partitioned into its component pieces, top-level circuit block 301, circuit block 302, circuit block 303, circuit block 304, and circuit block 305. Each of circuit blocks 302–305 is then optimized independently using characterization as shown by arrows 310–313, yielding optimized circuit blocks 332–335. After each of circuit blocks 302–305 has been optimized, and top-level circuit block 301 has been optimized, optimized circuit blocks 332–335 are reinserted into the optimized top-level circuit block 341 to yield a fully optimized integrated circuit. These steps are shown in FIG. 3B below.

Referring to process 350 of FIG. 3B, process 350 begins in step 351 where a netlist circuit description is accessed. The netlist circuit description includes a top level block 301 and circuit blocks 302–305. As described above, the top level block includes glue logic required to interface circuit blocks 302–305. Process 350 includes steps 351–355 as shown.

In step 352, the circuit blocks 302–305 are independently optimized using characterization. As described above, the characterization process includes setting up the distinct circuit blocks 302–305 of a large circuit 300 to be optimized independently, outside of the whole circuit 300. Each of the distinct circuit blocks 302–305 has specified timing constraints and timing exceptions. Characterization automatically generates timing constraints and exceptions which are appropriate for the optimization of circuit blocks 302–305. Additionally, in accordance with the present embodiment, it should be noted that blocks 302–305 are optimized independently with respect to top-level circuit block 301 and with respect to each other. Thus, when optimizing blocks 302–305, the optimization process of the present embodiment needs only to load and process one circuit block at a time, thereby decreasing resource demands on the CAD workstation (e.g., CAD workstation 212 of FIG. 2). This allows the circuit blocks 302–305 to optionally be optimized in parallel, for example, each being optimized using a separate CAD workstation, or each being optimized using a separate CPU within a single CAD workstation, or the like, using multiple optimizers.

Referring still to FIG. 3B, in step 353, models 322–325 are created for each of the circuit blocks 302–305. The models are used to respectively replace circuit blocks 302–305 within the top level block 301. Each of models 322–325 include sufficient information to calculate timing properly, even in the presence of timing exceptions, thereby enabling the optimization of top level block 301.

In step 354, as circuit blocks 302–305 are independently optimized (step 352), top-level circuit block 301 (e.g., the top-level glue logic and interconnection between the circuit blocks 302–305) is optimized. In accordance with the present embodiment, to optimize top level block 301, the circuit blocks 302–305 are replaced in top level block 301 with their respective models 322–325. In step 355, after each of circuit blocks 302–305 has been optimized, and top-level circuit block 301 has been optimized, optimized circuit blocks 332–335 are reinserted into the optimized top-level circuit block 341 to yield a fully optimized integrated circuit.

It should be noted that after the top-level circuit block 301 is optimized, various timing constraints and timing exceptions for circuit blocks 302–305 may have changed. Thus, after the top-level circuit block 301 is optimized, the optimizations of circuit blocks 302–305 can optionally be repeated.

In addition, in an alternative embodiment, the top-level optimization of top-level circuit block 301 is performed first. This provides optimized timing constraints and timing exceptions for use in the optimization of circuit blocks 302–305, which are optimized subsequently.

Figure 4A:
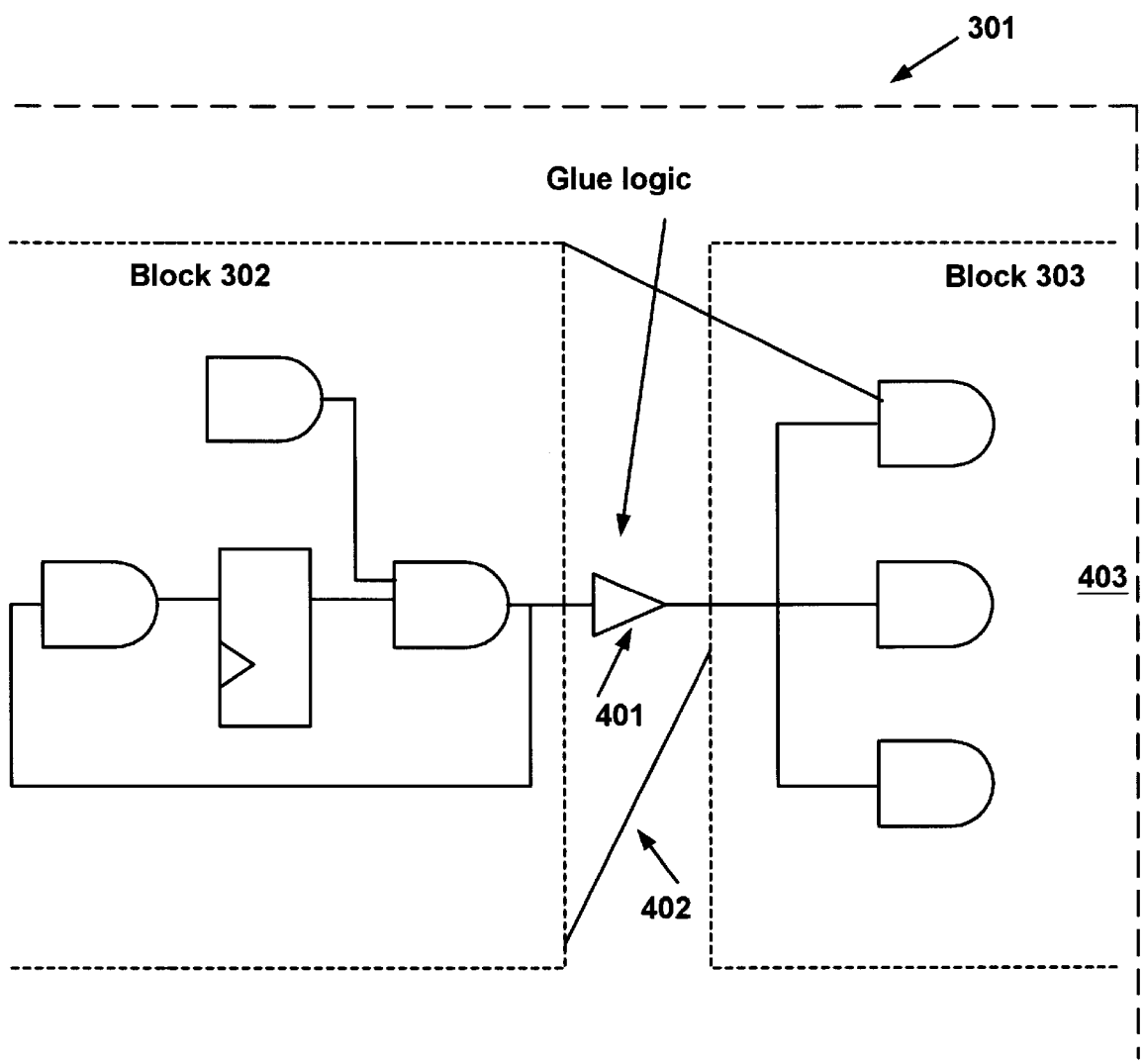
FIG. 4A shows a circuit diagram of block circuitry and glue logic used in a bottle optimization process in accordance with one embodiment of the present invention.
Figure 4B:
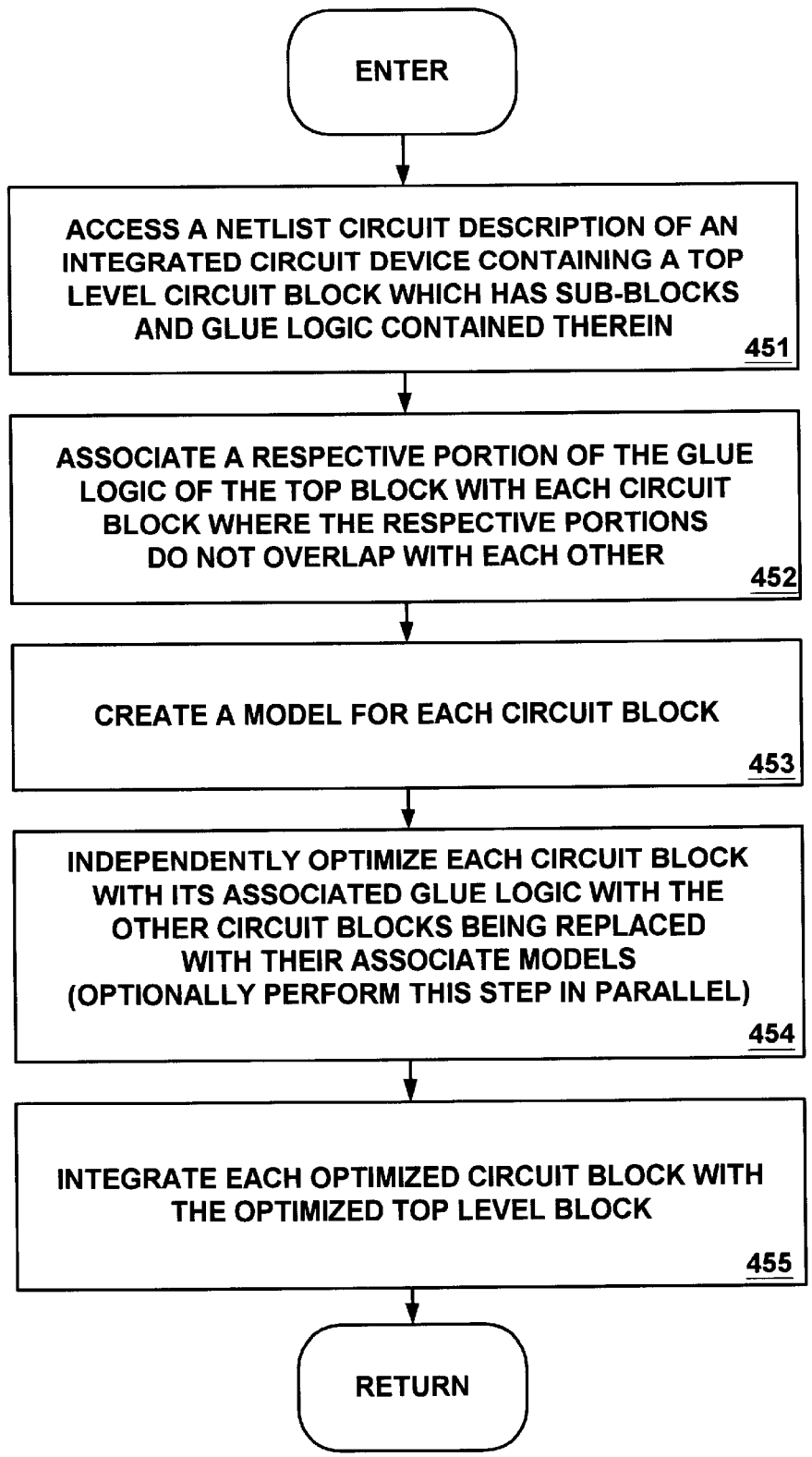
FIG. 4B shows a flow chart of the steps of a bottle optimization process in accordance with one embodiment of the present invention.

FIG. 4A shows a diagram of a "bottle optimization" process in accordance with one embodiment of the present invention and FIG. 4B shows a flow chart of the steps of a bottle optimization process 450 in accordance with one embodiment of the present invention. As depicted in FIG. 4A, circuit block 302 and circuit block 303 are shown, along with a portion of the top-level circuit block 301, depicted as glue logic indicated by arrow 401.

In accordance with present embodiment, bottle optimization is similar to block and top optimization, except that circuit blocks are optimized simultaneously with a selected part of the top-level circuit. Each circuit block 302–305 of the design 300 has a unique selected part of the top-level circuit 301 which does not overlap the selection of any other part. In the present embodiment, this selected part of the top-level circuit 301 is the glue logic 401 and connections which are connected closest to the outputs of circuit block 302. This is illustrated in FIG. 4 by line 402 encompassing circuit block 302 and extending to encompass glue logic 401 up to the edge of circuit block 303. Hence, with bottle optimization, the circuitry encompassed by line 402 (e.g., block 302 and glue logic 401) is optimized together but independently of other circuit blocks and their associated glue logic. The area within the dotted line 402 represents the area which will be optimized in a single optimization. Accordingly, the area of circuit block 303 (and its associated glue logic, which is not shown) is also independently optimized in a different run. The steps of the bottle optimization process are shown in FIG. 4B.

Referring now to FIG. 4B, process 450 begins in step 451 where, as with process 350 of FIG. 3B, the netlist description of the circuit is accessed. In step 452, a respective portion of the glue logic of the top level block 301 is associated with each circuit block 302–305. As described above, the respective portions do not overlap with each other. In step 453, models are created for each of circuit blocks 302–305. In step 454, the circuit blocks 302–305 are independently optimized with their associated glue logic. Then in step 455, the optimized circuit blocks are integrated with the optimized top level block.

Figure 5:
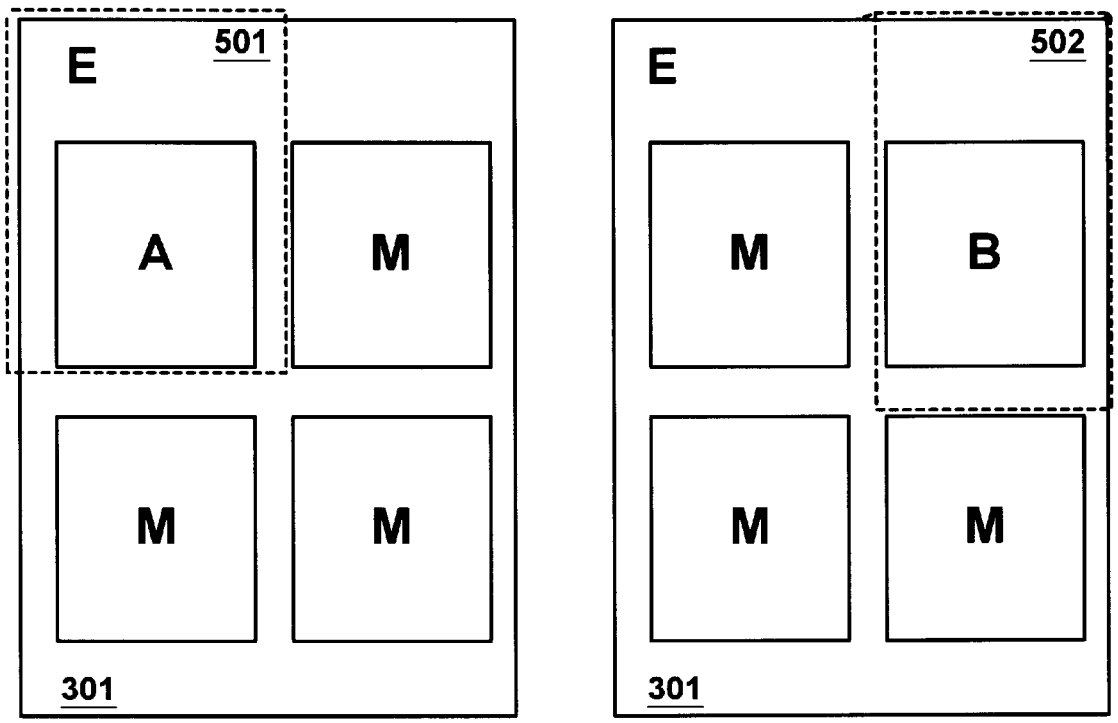
FIG. 5 shows a diagram of four bottle optimizations on four circuit blocks included within a top-level block in accordance with one embodiment of the present invention.
Figure 5:
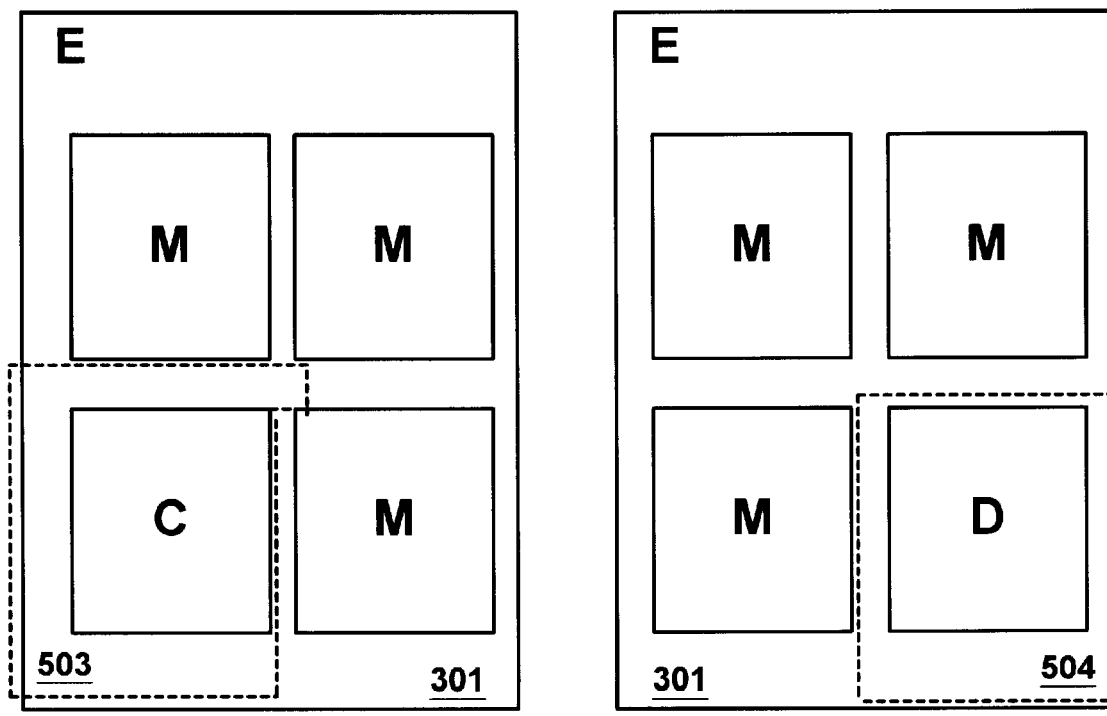

FIG. 5 shows four bottle optimizations 501–504 on the four included circuit blocks. Each of areas 501–504 within the dashed portion shows the part of the circuit to be optimized and include a circuit block and its associated top level glue logic. The circuit blocks which are not being optimized in the current optimization are replaced by models (depicted as a letter "M"). As depicted in FIG. 5, bottle optimization can be done for one circuit block at a time or for many circuit blocks in parallel, for example, using multiple optimizers. In the present embodiment, area 501 depicts the optimization of step 454 for block 302, area 502 depicts the optimization of block 303, area 503 depicts the optimization of block 304, and area 504 depicts the optimization of block 305.

Figure 6:
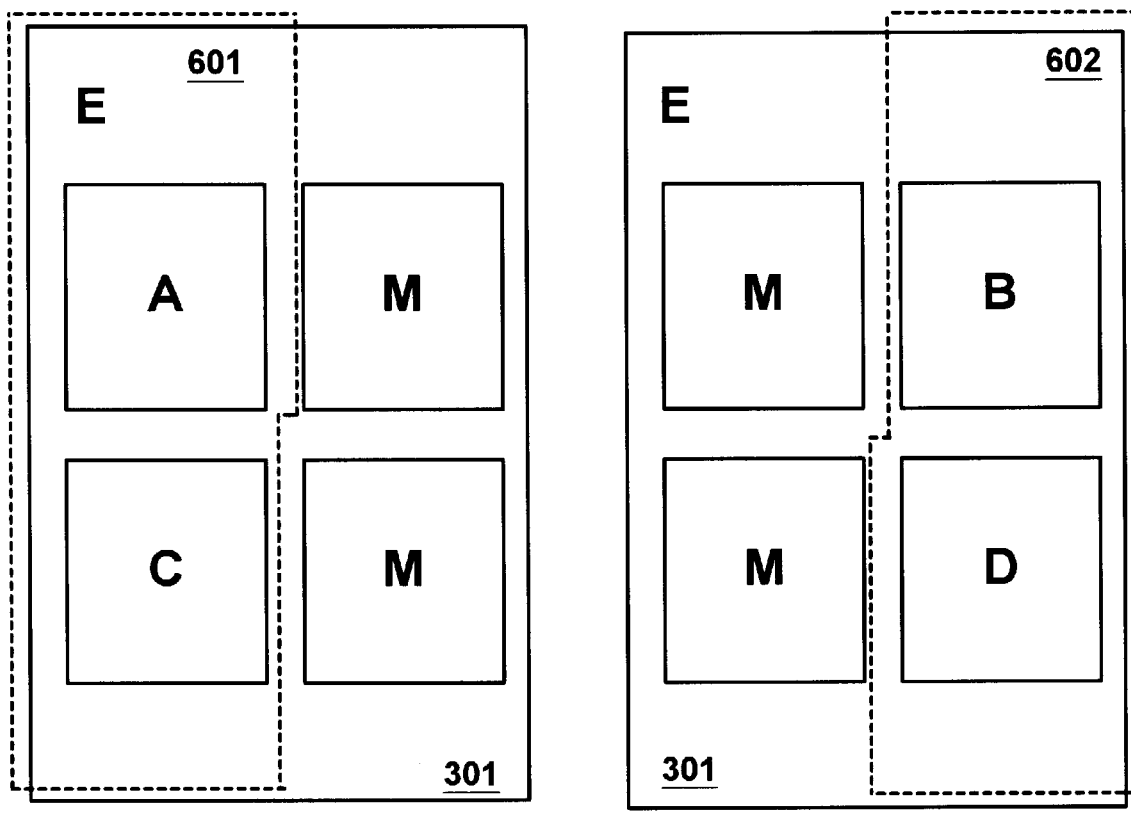
FIG. 6 shows an alternate bottle optimization embodiment where more than one block and its associated top level glue logic and connections are optimized in a single run in accordance with one embodiment of the present invention.

FIG. 6 shows an alternate bottle optimization embodiment where more than one block and its associated top-level glue logic and connections are optimized within a single run. Area 601 and 602 each shows two blocks and the associated portion of the glue logic being optimized. As with the above embodiments, the two optimization runs may be performed sequentially, or in parallel using multiple optimizers.

Figure 7:
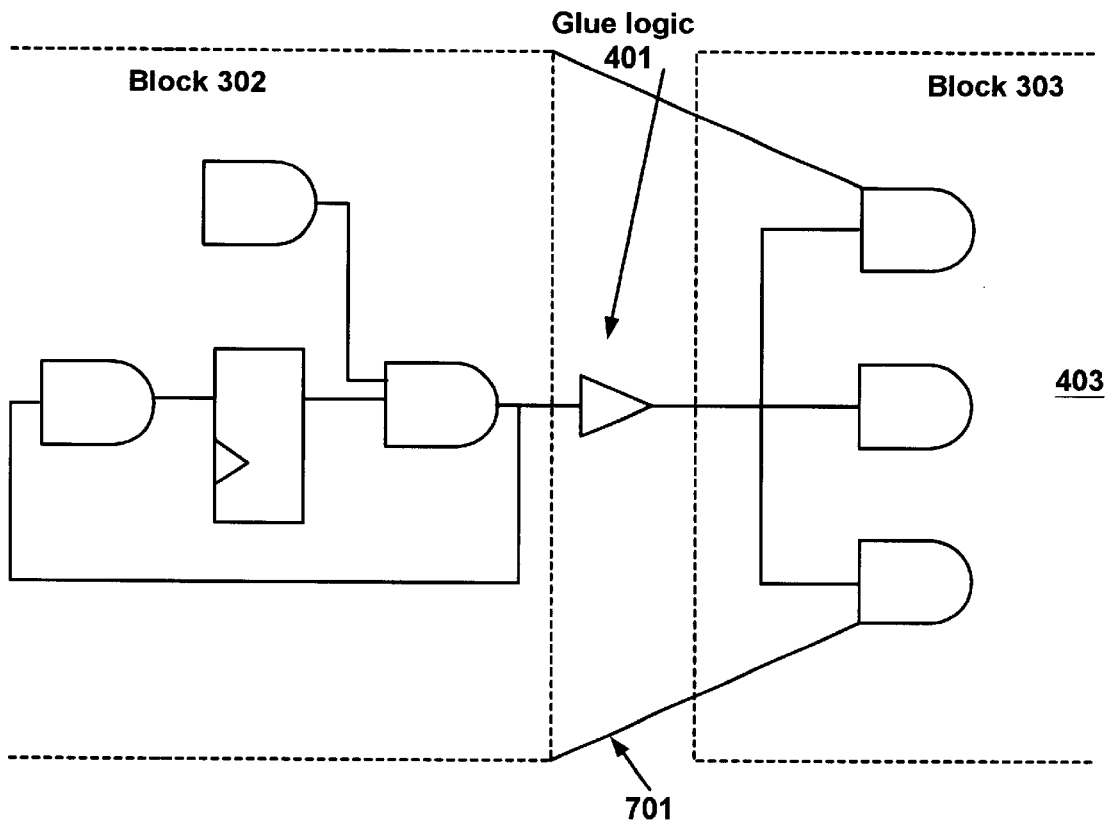
FIG. 7 shows a diagram of a modified version of bottle optimization in accordance with one embodiment of the present invention.

Referring now to FIG. 7, in another embodiment, bottle optimization is modified. In this embodiment, optimization is run on a selected circuit block, some top-level glue logic as before but also on connections and buffer gates and connections at the input of a neighboring circuit block. This is depicted in FIG. 7 where line 701 encompasses all of block 302 glue logic 401 and a portion 403 of block 303. The area encompassed by line 701 is optimized independently of the remainder of the netlist.

When the neighboring circuit block (e.g., circuit block 303) is optimized, the buffers and connections 403 which were optimized with the first circuit block 302 will not be optimized. This way, there are no two optimizations which work on the same portion of the overall circuit. This property allows optimizations to be run in parallel (using multiple optimizers) as shown in FIG. 8 below.

Figure 8:
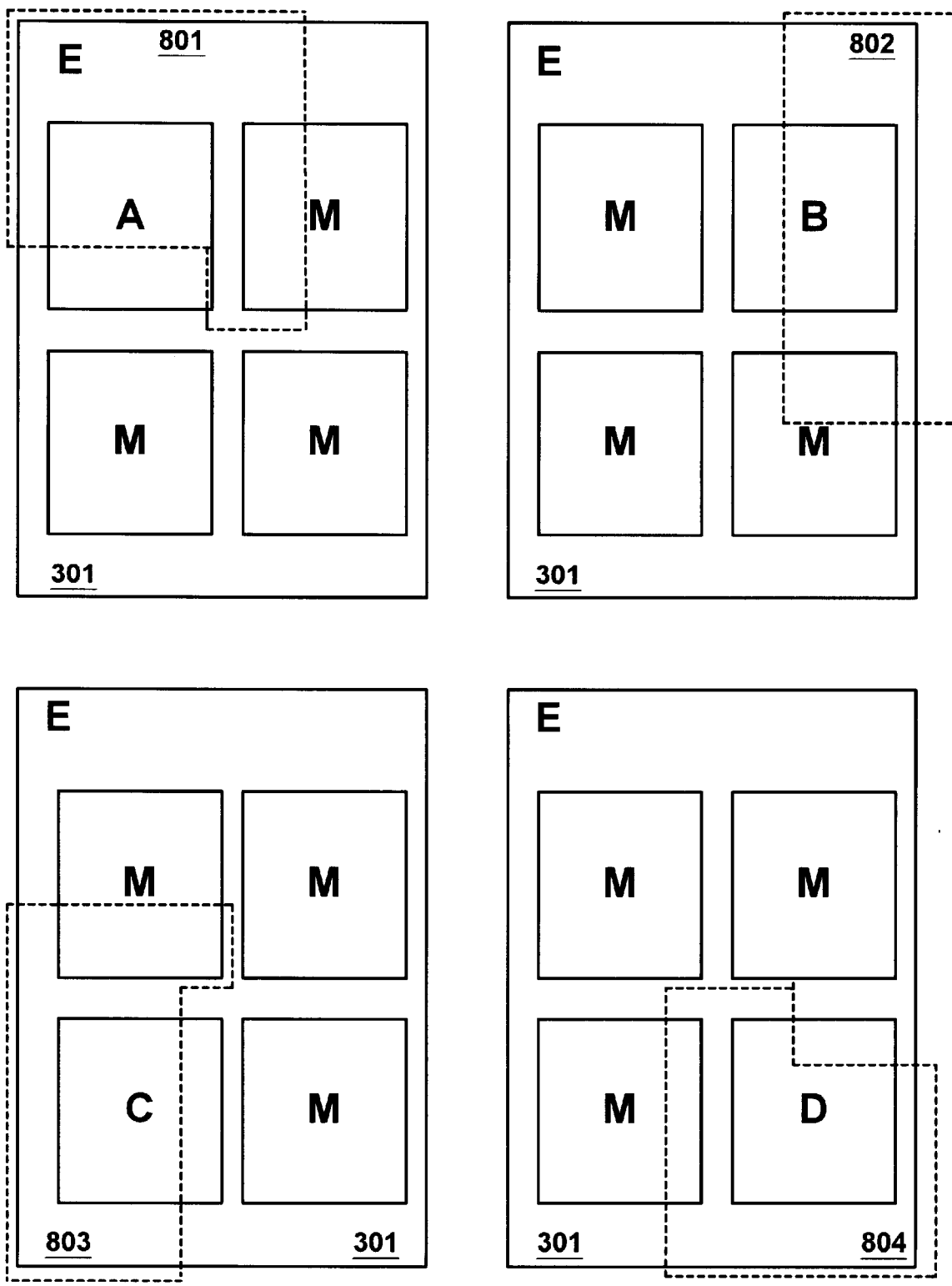
FIG. 8 shows an example of four bottle optimizations as performed on a top-level block and a plurality of included circuit blocks in accordance with one embodiment of the present invention.

FIG. 8 shows an example of four modified bottle optimizations as performed on top level block 301 and the included circuit blocks. The four modified bottle optimizations 801–804 are each run on a selected circuit block, some associated top-level glue logic and connections, and a portion of a neighboring circuit block. As depicted in FIG. 8, the areas optimized by optimizations 801–804 do not overlap, allowing the optimizations to be run in parallel using multiple optimizers.

Figure 9A:
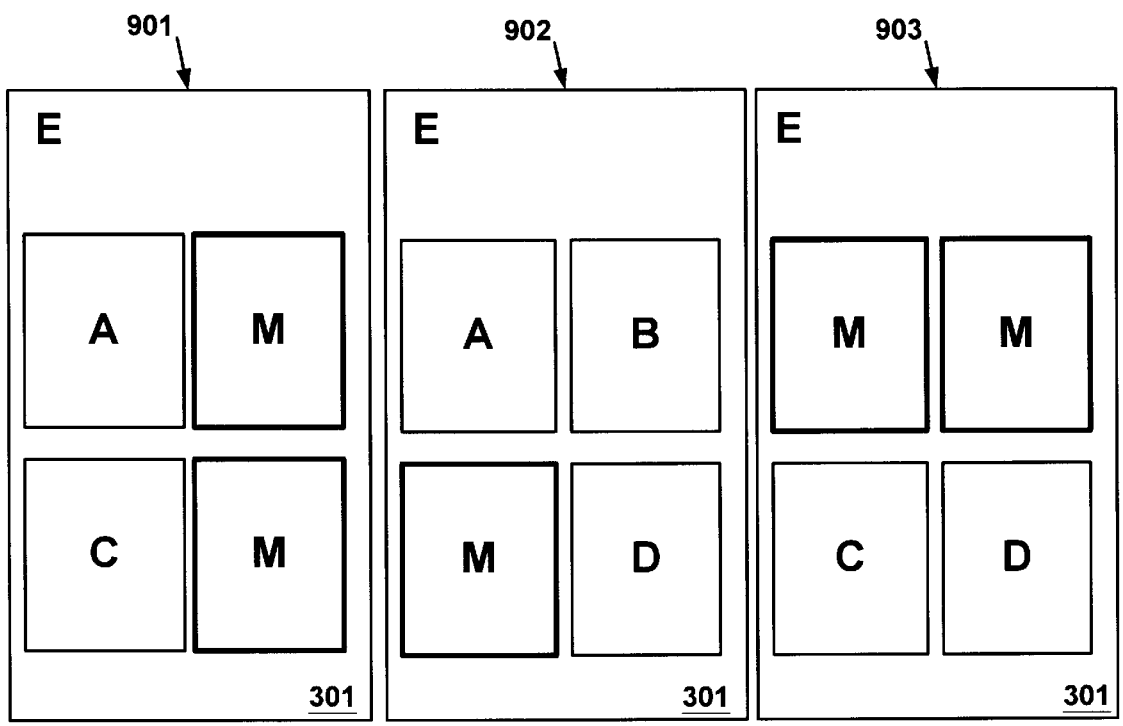
FIG. 9A shows a diagram of in-context optimization in accordance with one embodiment of the present invention.
Figure 9B:
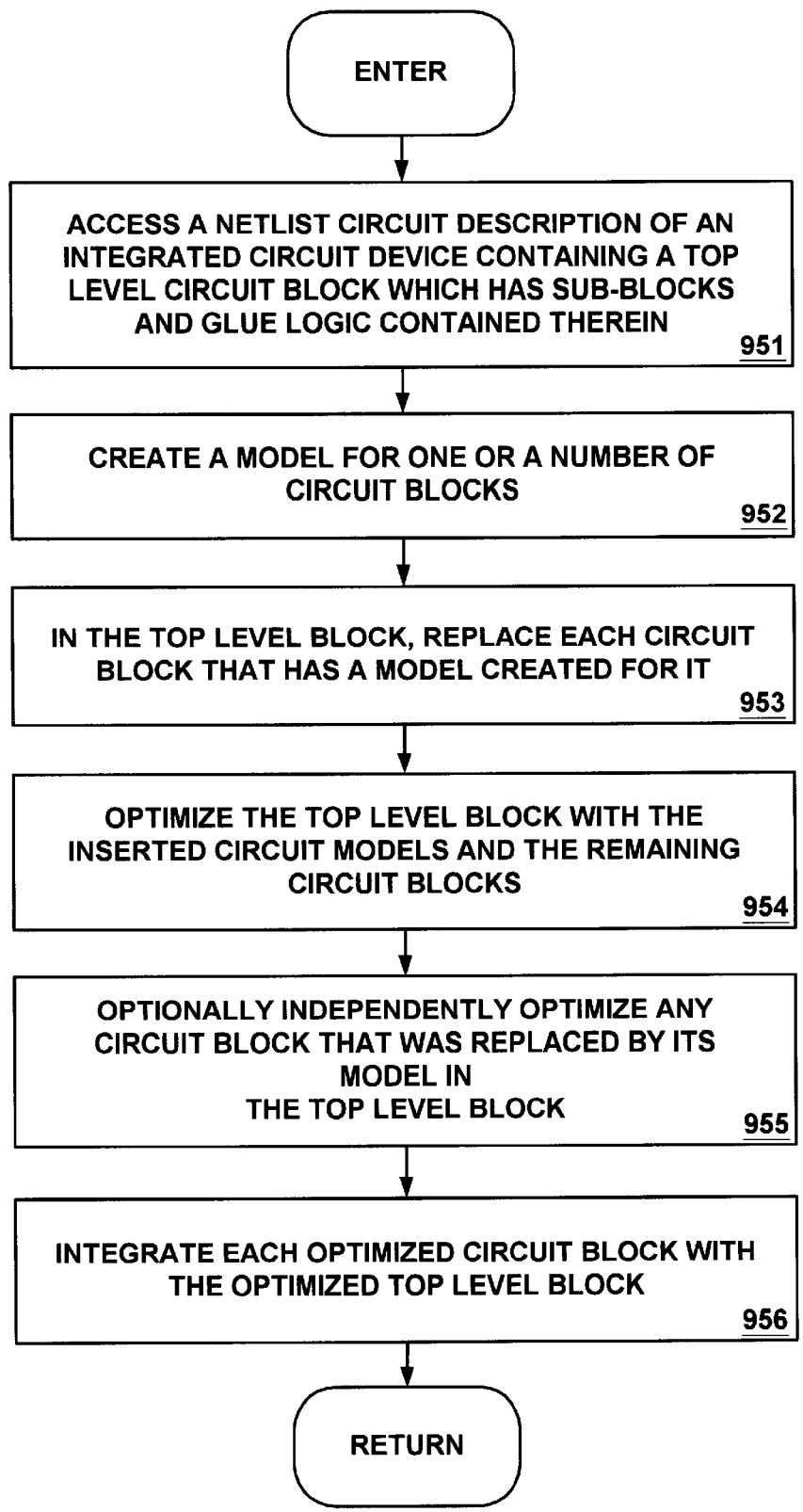
FIG. 9B shows a flow chart of the steps of an in-context optimization process in accordance with one embodiment of the present invention.

FIG. 9A shows an example of "in-context" optimization in accordance with one embodiment of the present invention and FIG. 9B shows the steps of an in-context optimization process 950 in accordance with one embodiment of the present invention. In-context optimization runs at the top-level of the chip. It is enabled by the use of models in place of all but one or just a few circuit blocks. Optimization is then run at the top-level as normal. As depicted in FIG. 9A, three separate optimizations 901–903 are shown. The shaded areas of optimizations 901–903 denote areas which are being optimized. Blocks with "M" represent where models have replaced circuit blocks.

Referring to FIG. 9B, a flow chart of the steps of one in-context optimization process 950 in accordance with one embodiment of the present invention is shown. In step 951, the netlist description of the integrated circuit device is accessed. In step 952, respective models for the one or more circuit blocks included within the top level block are created. In step 953, the one or more circuit blocks are replaced within the top level block with the respective models. In step 954, the top level block is optimized with the inserted circuit models and the remaining circuit blocks. Optionally, in step 955, any circuit block that was replaced by its model in the top level block is independently optimized. Then, in step 956, each of the optimized circuit blocks and the optimized top level block are integrated.

Thus, the in-context optimization method allows multiple circuit blocks to be optimized together without the need to load the entirety of the overall circuit into memory. Many in-context optimizations can be run in succession to optimize many combinations of circuit blocks together. The examples shown in FIG. 9A show only three of many possible combinations.

Figure 10:
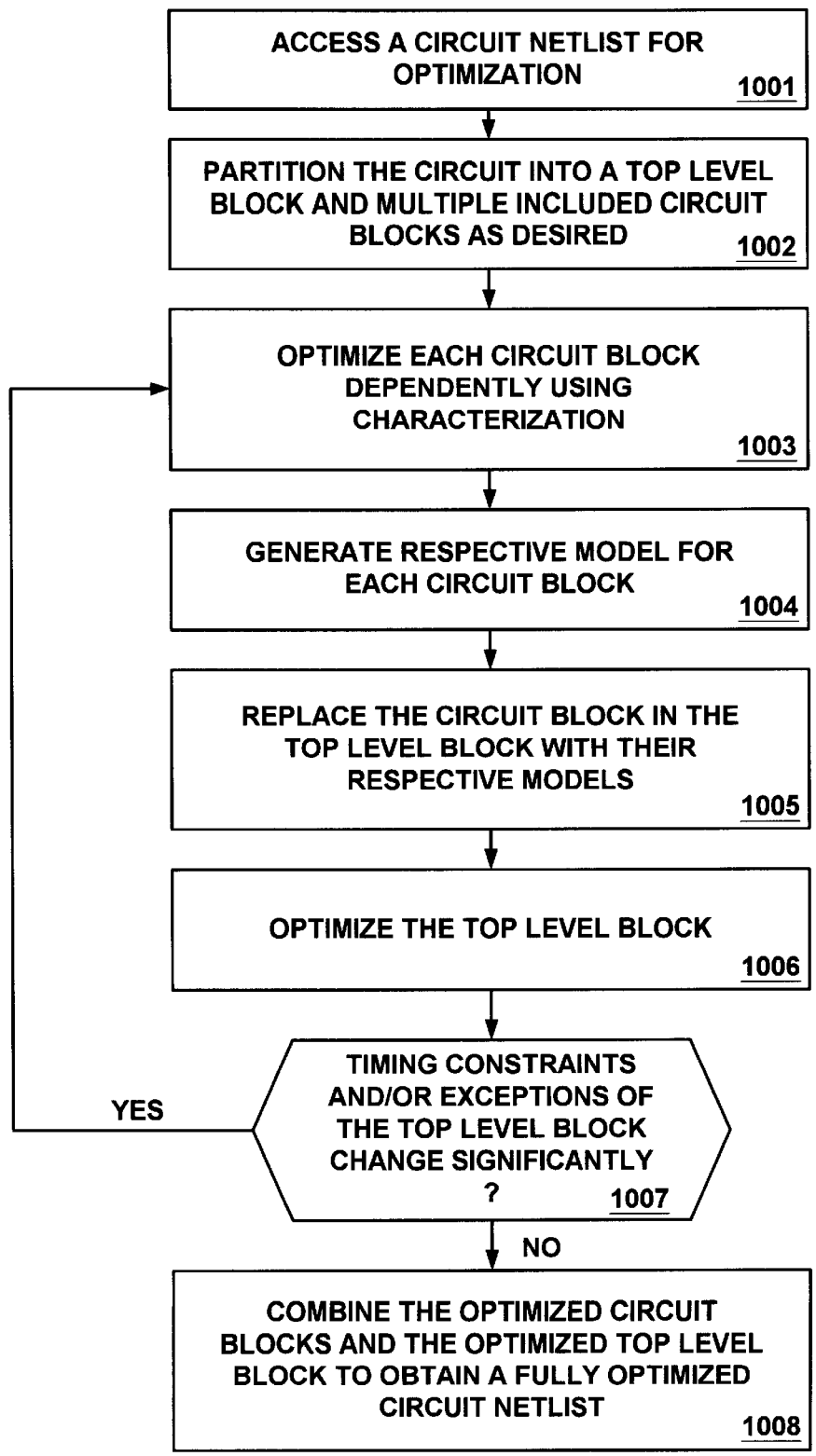
FIG. 10 shows a flow chart of the steps of an optimization process in accordance with one embodiment of the present invention.

Referring now to FIG. 10, a flow chart of the steps of an optimization process 1000 in accordance with one embodiment of the present invention is shown. As depicted in FIG. 10, optimization process 1000 shows the steps involved in receiving a circuit design from, for example, a design application, and performing optimization processing on each component part of the circuit design. The steps 1001–1008 of process 1000 depict a basic optimization scenario of a circuit having a top level netlist and at least two circuit blocks, wherein the optimization process of the present invention can be modified to perform optimization using block and top, bottle, modified bottle, or in-context variants.

Process 1000 begins in step 1001, where a circuit netlist is accessed by an optimization tool in accordance with one embodiment of the present invention. As described above, the circuit netlist received in step 1001 can represent an integrated circuit to be realized in physical form at various levels of abstraction. The netlist is typically created by a design tool (e.g., an HDL compiler) and is passed as an input to the optimization tool.

In step 1002, the optimization tool partitions the circuit into a top-level block and, in this case, two circuit blocks included within the top-level block. As described above, a circuit block is a distinct component of functionality and associated embodying circuitry. The choice of boundaries between circuit blocks, depending upon the requirements of the user, are chosen in accordance with whether block and top optimization, bottle optimization, modified bottle optimization, or in-context optimization is to be performed, as described above. In many cases, the choice of boundaries is predetermined as previous circuit block designs are "reused" and incorporated into new designs.

Referring still to process 1000 of FIG. 10, in step 1003, each of the circuit blocks and any included glue logic (as defined by their respective partitioning) is optimized independently using characterization techniques. As described above, the characterization process allows the circuit blocks to be optimized in parallel, for example, using multiple optimizers running on multiple CAD workstations. In step 1004, respective models are generated for each circuit block. As described above, the modeling technology of the present invention provides models for circuit blocks which includes sufficient information to calculate timing properly, even in the presence of timing exceptions. In step 1005, the circuit blocks within the top-level block are replaced with their respective models. Then, in step 1006, the top-level block, including the models, is optimized. The models require much less memory to store and much less CPU processing power to simulate; thus, in accordance with the present invention, the top-level block can be more efficiently optimized.

In step 1007, process 1000 then examines whether the timing constraints and/or timing exceptions of the top-level block have changed significantly as a result of the optimization. If there is significant change, process 1000 of the present embodiment proceeds back to step 1003 and again optimizes the circuit blocks with the new timing exceptions and constraints. In this manner, the entire circuit can again be optimized, at both the circuit block level and the top level, to a higher degree. Then, in step 1007, where there is no longer any significant changes or improvements in the timing exceptions and constraints, process 1000 proceeds to step 1008, where the optimized top-level block and the optimized circuit blocks are combined to obtain a fully optimized circuit netlist.

Thus, the present invention provides a system capable of efficiently optimizing large complex integrated circuit designs. The present invention provides a method and system for vigorously optimizing a complex integrated circuit design within the reasonable time and resource constraints of modern EDA design synthesis processes. Additionally, the present invention provides a method and system capable of optimizing all portions and all aspects of a complex integrated circuit design.

Circuit Block Modeling with Timing Exception Information

Embodiments of the present invention include a circuit model having timing exception information associated therewith, a method for generating the circuit model and also circuit optimization processes that use the circuit model. Because the model of the present invention contains timing exception information, it is particularly well suited for use by incremental circuit optimization processes (e.g., as described above) for performing efficient and effective incremental optimizations on large integrated circuit designs.

The model of the present invention includes information regarding arrival and required tags that exist at the input/output pins of the model boundary. Tags are data structures which aid in the calculation of circuit delay when timing exceptions are present within a circuit design. Their primary use is to keep the delays calculated for one timing exception separate from delays for another timing exception. Arrival tags, e.g., tags associated with arrival times, and required tags, tags associated with required times, are described herein. In addition, a detailed description of tags can also be found in copending patent application Ser. No. 09/093,817, filed Jun. 8, 1998, entitled, "Method and Apparatus for Tag-based Static Timing Analysis with Exceptions," assigned to the assignee of the present invention, which is hereby incorporated by reference. It is appreciated that FIGS. 11 and 12 of the above referenced patent application are particularly useful in showing the use of tags in timing analysis.

The circuit model of the present invention allows automated circuit optimization to be performed on extremely large circuits without the need to load all of the details of the circuit into computer memory thereby saving computer memory resources. Since the models are smaller, they can also be processed faster. Prior art modeling technology was not sufficiently advanced to allow real-world circuits to be processed. In particular, prior art models did not work properly in the presence of timing exceptions. The models of the present invention include all of the information provided by prior art models and, in addition, provide sufficient information to properly calculate timing in the presence of timing exceptions.

Figure 11A:
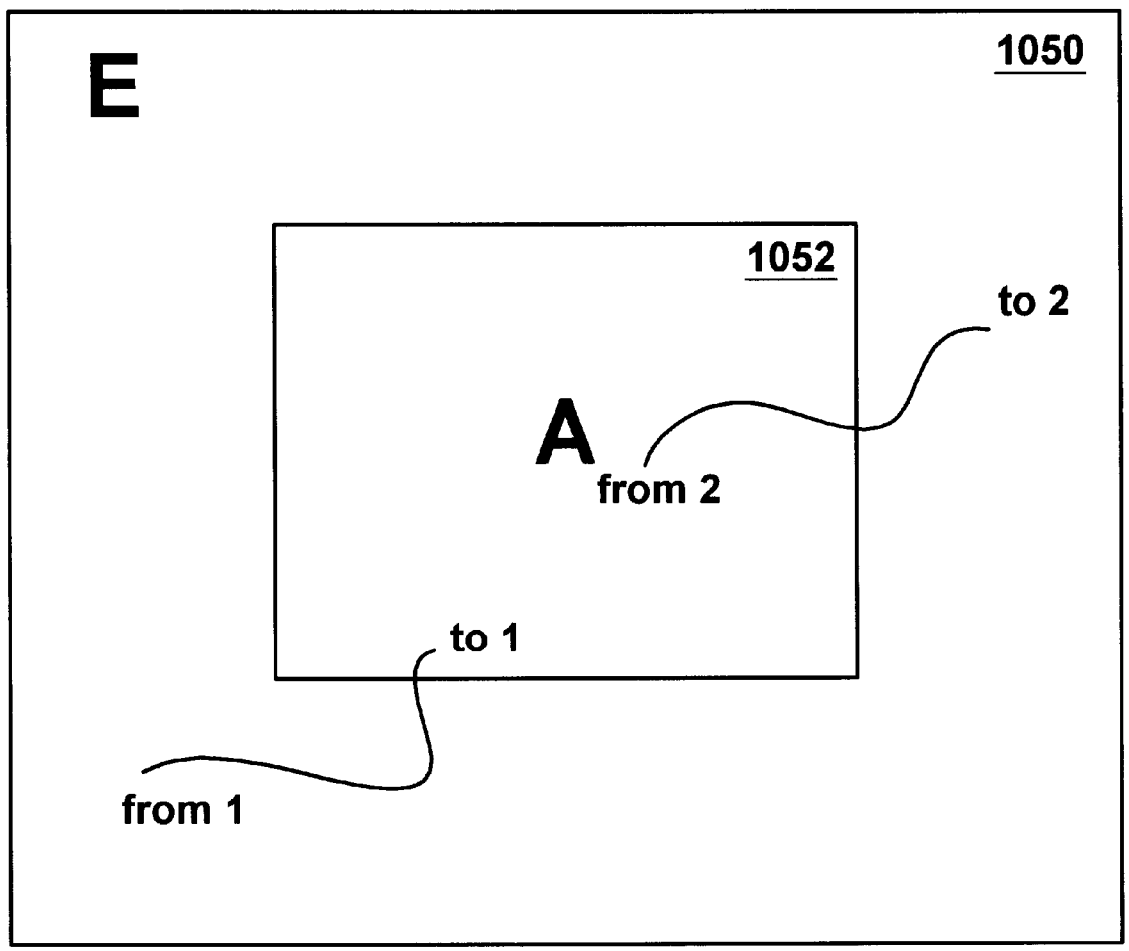
FIG. 11A illustrates an integrated circuit design having a circuit block therein and included are paths with timing exceptions that are not self-contained within the circuit block.

FIG. 11A illustrates an exemplary circuit design 1050 including an exemplary circuit block 1052. The most common timing exception is defined to run along timing paths between two points of a circuit which are defined as the "from" point and the "to" point. Modeling timing exceptions can be difficult when the exceptions are not fully self-contained within the circuit block that is to be modeled. For example, an exception is not self-contained in the circuit block when one of the "from" or "to" pins may be inside the circuit block but the other point may be outside. Two examples are shown with respect to FIG. 11A. The "from1" point and "to2" point are located outside of circuit block 1052, and the "to1" point and "from2" point are located inside circuit block 1052. This configuration leads to the formation of two circuit paths that are not self-contained within circuit block 1052.

In the process of creating a circuit model ("model") in accordance with the present invention, the goal is to remove as much internal detail about a circuit block as possible to reduce the computer resources required in processing and storing its model. In the case of circuit block 1052, this could include the removal of the "to1" point, as well as half of the timing path which connects the "from1" point and the "to1" point. If these elements were removed without replacing them with new information, the model would not be usable for analyzing or optimizing in the presence of the exception paths (as is the result for prior art models). In accordance with the present invention, a data structure for representing missing parts of an exception path is introduced and makes the model of the present invention useful where prior art models are not.

Figure 11B:
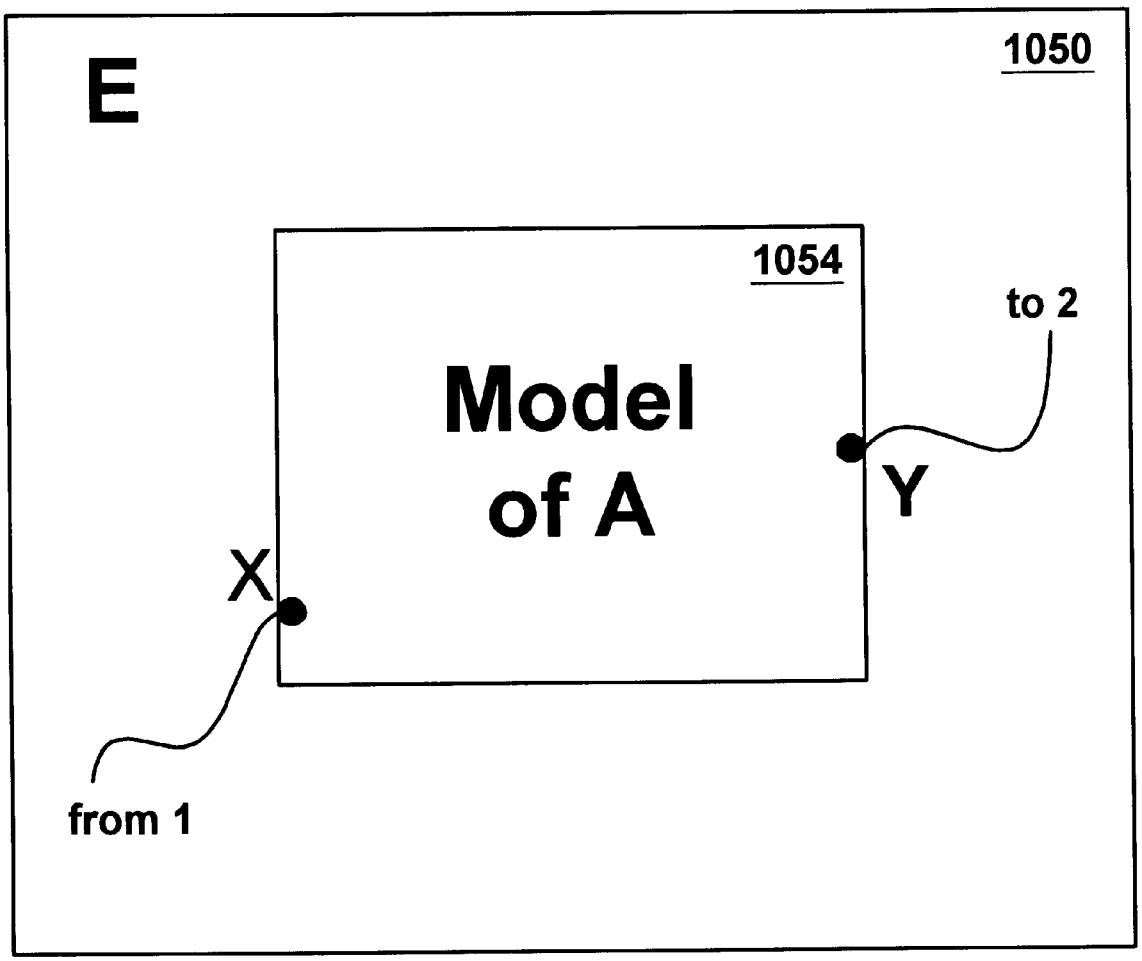
FIG. 11B illustrates a circuit model in accordance with an embodiment of the present invention that effectively models the timing information associated with the timing exceptions of the circuit block of FIG. 11A.

FIG. 11B illustrates the same top-level circuit 1050, with a model 1054 of circuit block 1052 inserted in place of circuit block 1052 (FIG. 11A). In the model of the present invention, information is added at the model pins (e.g., input pin X and output pin Y) to represent the parts of the exception paths that are eliminated from the model 1054 but were present in the circuit block 1052 (FIG. 11A). Because of the added exception information on pins X and Y, it is possible to correctly and efficiently optimize (using a tool such as Design Compiler from Synopsys, Inc.) circuit 1050 using the model 1054 of the present invention. It is appreciated that prior art models would not allow for correct optimization with the model inserted, forcing optimization to be performed with the original, and much larger, circuit block 1052 (FIG. 11A). The following discussion describes the type of exception information added within the models of the present invention and also describes the manner in which this information is generated in accordance with embodiments of the present invention.

Arrival Times and Required Times

Figure 12A:
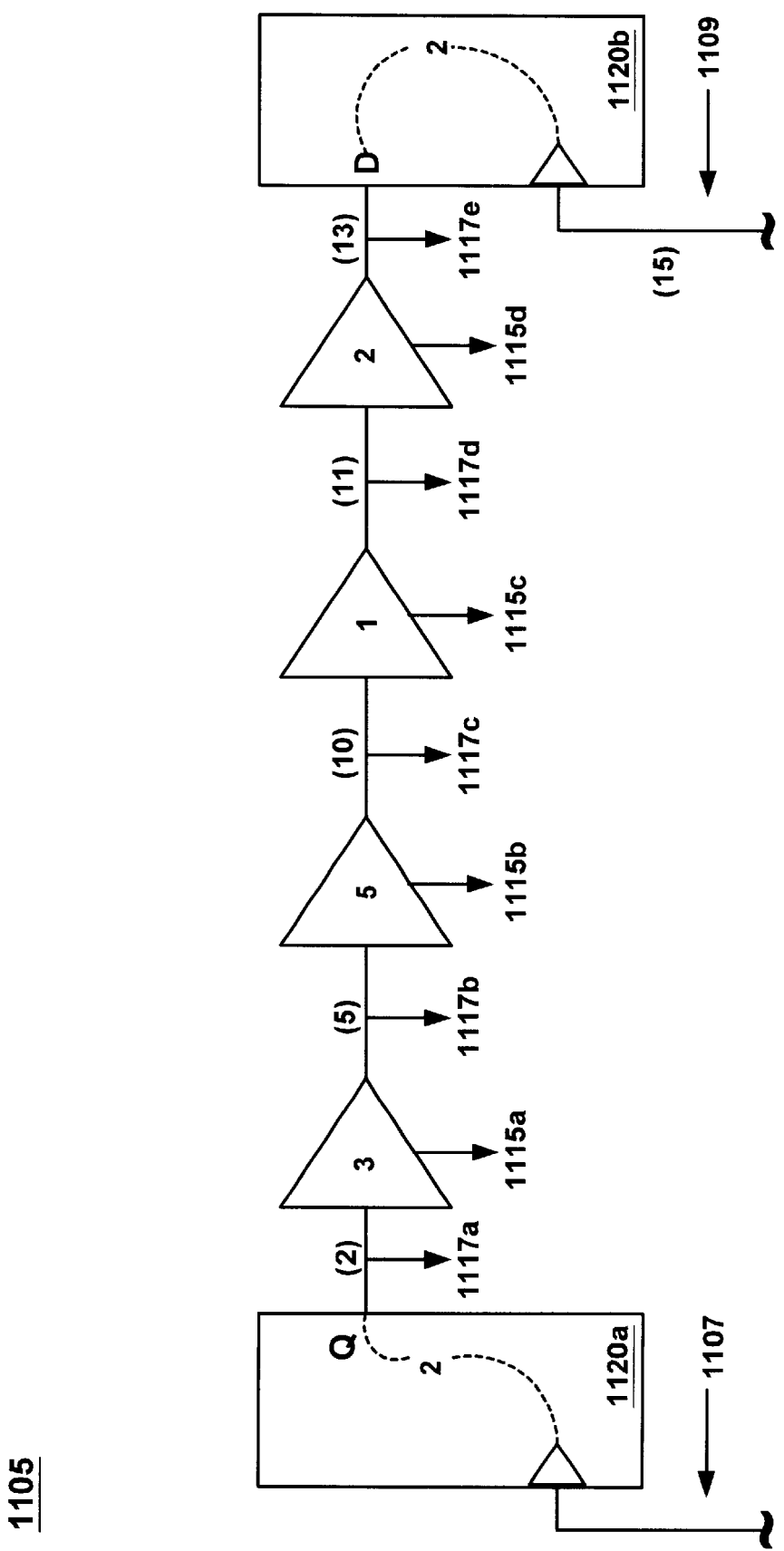
FIG. 12A illustrates an exemplary logic circuit having exemplary arrival times (associated with an arrival tag) defined at each circuit segment.

FIG. 12A illustrates an exemplary circuit 1105 having two sequential circuits 1120*a*–1120*b* and a number of serially coupled gates 1115*a*–1115*d* located between the sequential circuits 1120*a*–1120*b*. Circuit 1105 is illustrated to describe arrival times. Arrival time can be defined for any arbitrary chosen place in a circuit. Its value represents the actual circuit delay leading from a predetermined start point to the chosen place. Specifically, arrival times are measured from a starting point, are referenced from a launch clock, and measure the time it takes a particular signal to reach a given point along a particular path. The path in this case starts from the input of the sequential circuit 1120*a* and is referenced from clock signal 1107. Each circuit gate has an associated exemplary delay. The delay associated with circuit 1120*a* is 2 nanoseconds (ns). The delays (in ns) of circuits 1115*a*–1115*d*, respectively, are 3, 5, 1, and 2. The delay associated with circuit 1120*b* is 2 ns. To calculate the arrival time along each segment 1117*a*–1117*e*, the expected delays from each traversed gate are summed. Therefore, the arrival times at points 1117*a*–1117*e*, respectively, are 2, 5, 10, 11 and 13 ns.

Therefore, a signal seen at the input of gate 1120*a* will take 13 ns to reach the input of circuit 1120*b*. As discussed below, measured arrival times are associated with tags which define the circuit path to which the arrival times are pertinent. Tags provide a mechanism for separating arrival time totals that are associated with different paths that traverse the same circuit point. Arrival times are useful in circuit optimization because they allow a comparison between actual signal propagation delays and design constraints which dictate the maximum allowed delays.

Figure 12B:
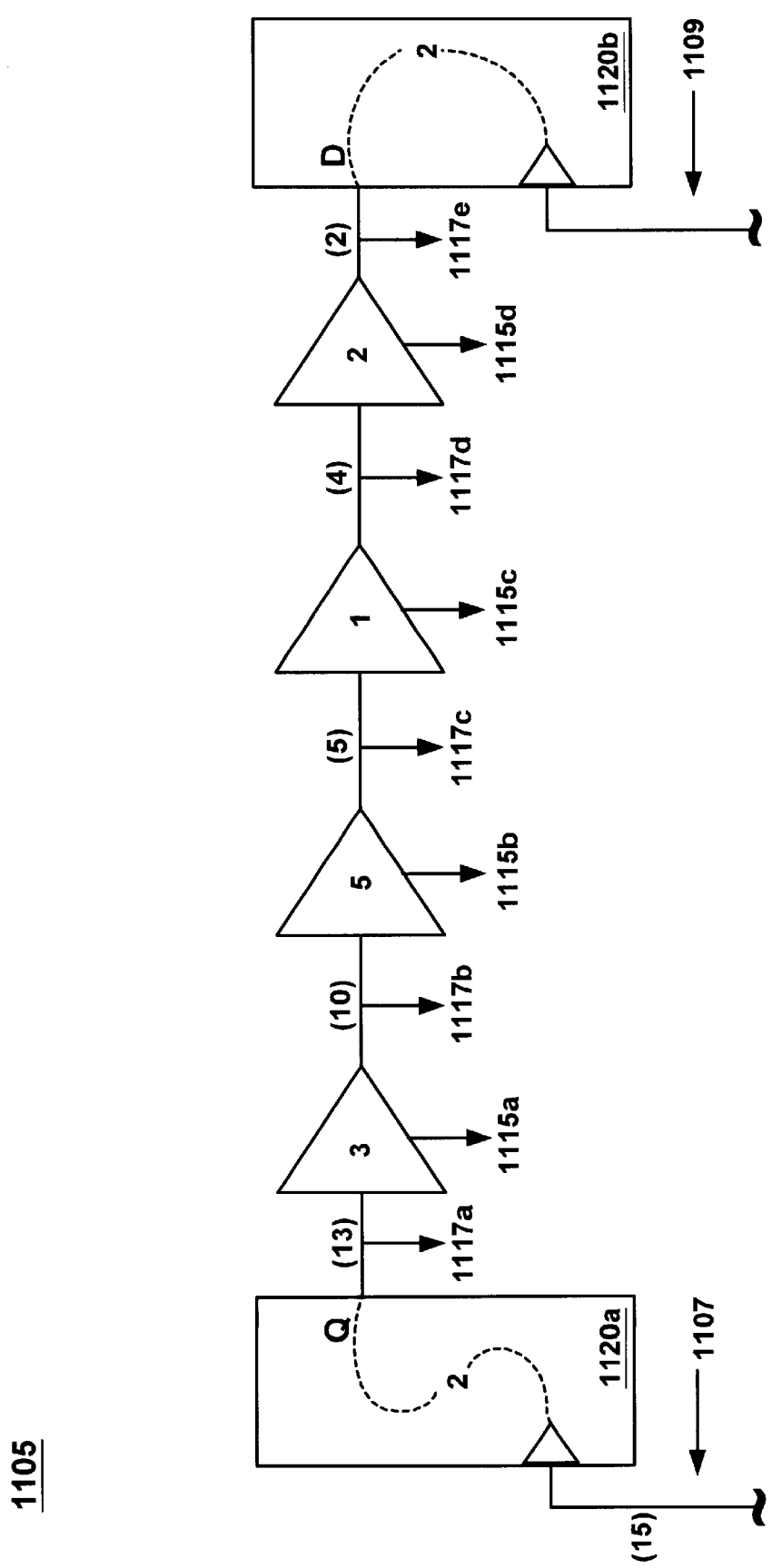
FIG. 12B illustrates an exemplary logic circuit having exemplary required times (associated with a required tag) defined in a first format at each circuit segment.

FIG. 12B illustrates the exemplary circuit 1105 and is illustrated to describe required times. Required time can be defined for any arbitrary chosen place in a circuit. Its value represents the desired circuit delay leading from a predetermined start point to the chosen place. The required time varies with timing constraints and timing exceptions of the circuit. The goal of optimization is to make the arrival time at a point less than or equal to the required time. The required time in the example of FIG. 12B is measured from sequential circuit 1120*b*. The signal reaching the input to circuit 1120*b* should arrive 2 ns before the capture clock 1109 therefore, the required time at point 1117*e* is 2 ns. Propagating backwards, the required times at points 1117*d*–1117*a*, respectively, are 4, 5, 10, and 13 ns. Therefore, a signal at point 1117*a* must arrive at point 1117*a* 13 ns (or more) before the capture clock 1109 to be valid.

Figure 12C:
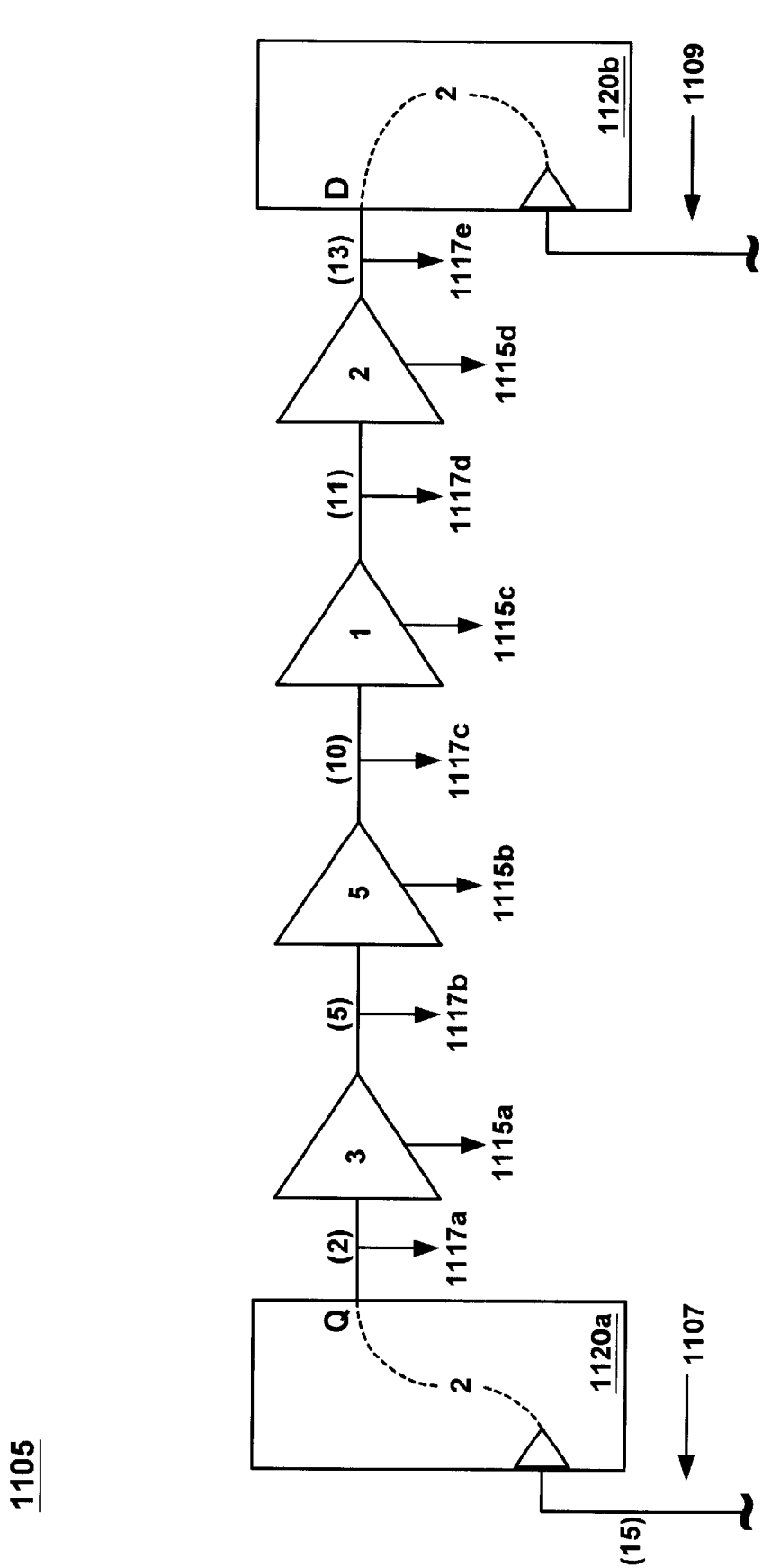
FIG. 12C illustrates an exemplary logic circuit having exemplary required times (associated with a required tag) defined in a second format at each circuit segment.

Required times can be expressed in another format that is based on the timing constraint of the circuit path. FIG. 12C illustrates this other format. Assume a 15 ns constraint is defined for the exemplary path of circuit 1105. In this format, all required times (of the format of FIG. 12B) are subtracted from the constraint amount (e.g., 15 ns). Therefore, the required time at point 1117*e* becomes 15-2 or 13 ns. The other required times for points 1117*d*–1117*a* likewise become, respectively, 11, 10, 5, and 2. It is appreciated that any discussions herein with respect to required times can be applied to and operate with any of these two formats.

It is appreciated that static timing analysis processes generate both required times and arrival times for circuit segments. For instance, circuit point 1117*c* has an arrival time of 10 ns (FIG. 12A) and a required time of 10 ns (FIG. 12C). By subtracting the arrival time and the required time of a particular circuit point, for a particular timing exception, the slack in the circuit can be determined for that point. For point 1117*c*, there is no slack (e.g., 10–10=0).

Tags are used in static timing analysis and arrival times and required times are associated with tags. By using tags, any point in the circuit may have one or more sets of arrival times or required times ("totals") computed for it. Each set of totals will be associated with a tag. The tag describes how the totals should be used and generally describes a timing exception for a particular circuit path that traverses the point. For instance, a tag might say that the data in an associated total might be used to evaluate the default timing constraint. Or a tag might say that the data in an associated total might be used to evaluate the timing described in a timing exception, e.g., timing exception one. In general, a tag that is associated with a total specifies the following information: (1) the "launch clock" of the total which specifies the set of starting points for calculating arrival times; (2) zero or more timing exception identifiers specify if this total should be used to calculate timing for the given timing exceptions and if no timing exceptions are identified the total should be used to calculate the default timing constraint; and (3) a "state" tells how many through pins have been encountered for each timing exception identifier. Other information may be associated with a tag if necessary.

It is appreciated that an arrival time and a required time are often referred to as a "total." The total includes a group of values that define the rise time total, the fall time total, the minimum total time and the maximum total time, etc., for that tag at a given point. For simplicity of discussion, a required total can be expressed as a "required time" and an arrival total can be expressed as an "arrival time."

Copending patent application Ser. No. 09/093,817, filed Jun. 8, 1998, and entitled, "Method and Apparatus for Tag-based Static Timing Analysis with Exceptions," describes the timing analysis of a circuit progressing from a starting point and moving forward into the circuit. As the timing analysis progresses forward, arrival times are calculated in the totals. The tags which are associated with the arrival time totals are called "arrival tags." An analogous timing analysis of a circuit progresses from an ending point, moving backwards in a circuit. As the timing analysis progresses backwards, required times are calculated in the totals. The tags which are associated with the required time totals are called "required tags." The required tag calculation is symmetric to arrival tag processing of the above referenced copending patent application.

Figure 13:
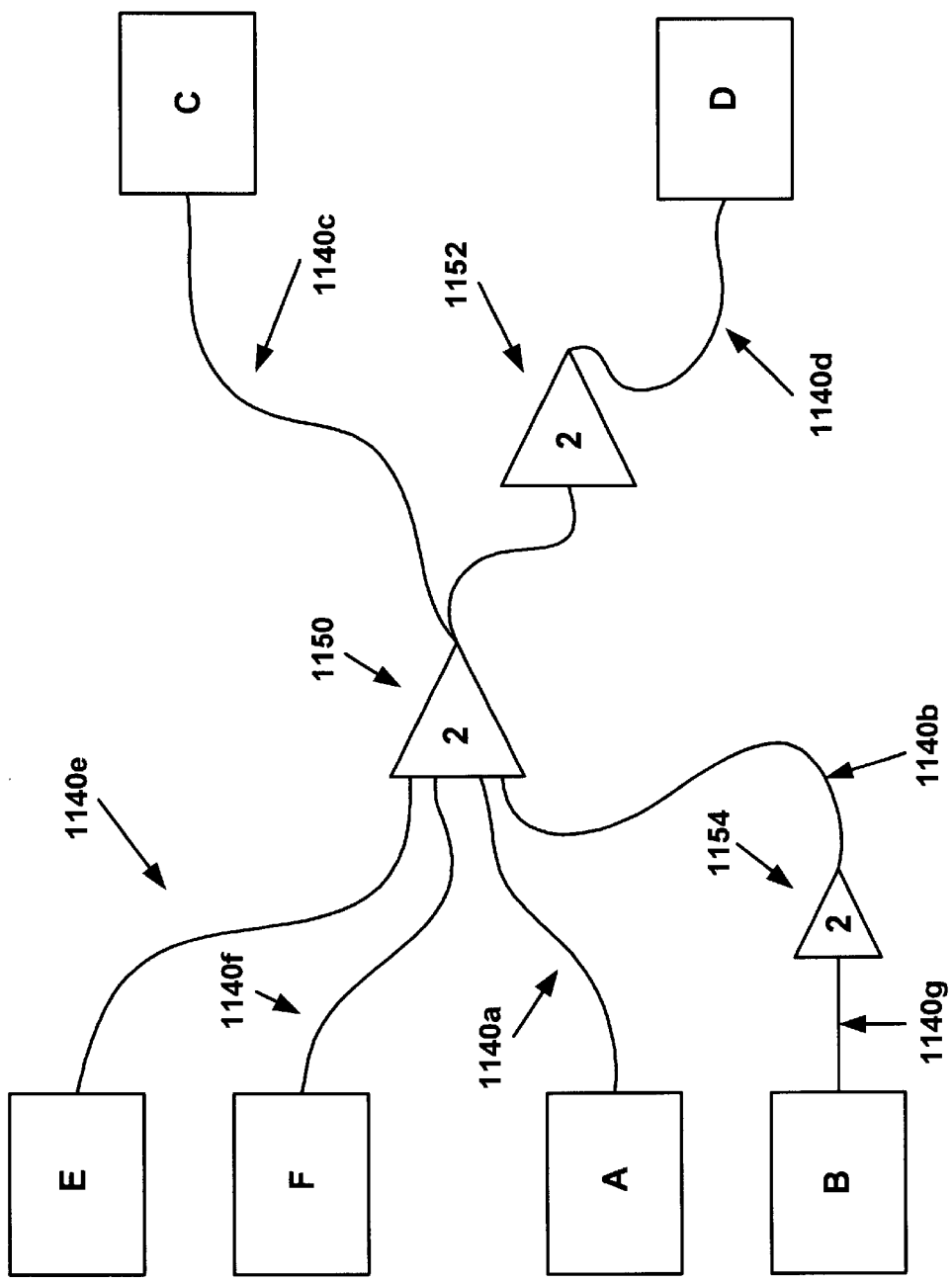
FIG. 13 is an exemplary circuit showing multiple paths to illustrate a number of timing exceptions.

FIG. 13 illustrates an exemplary circuit 1130 to discuss timing exceptions and the manner in which tags are used to separate arrival and required times for separate timing exceptions. Arrival times and required times are computed for particular timing exceptions which are generally defined along circuit paths. Signal timing information is tracked and computed separately by a static timing analysis process for each defined timing exception. There is a default timing exception that applies to all circuit paths that are not specifically defined within another timing exception. Often a defined timing exception is made to modify the default timing exception. This modification can be made to either expand or shorten allowed timing constraints for a given circuit path.

For instance, assuming all circuits of FIG. 13 are clocked by the same clock, a timing exception can be defined for the path of FIG. 13 that starts from circuit B and ends at circuit D. This can be established by the command:

set_max_delay-label-from B-to D#

Which defines a timing exception called "label." Although not shown above, a command defining a timing exception can also give a timing value (e.g., #) which is used to modify the default timing constraint. The above timing exception might be defined because the timing between circuit B and D is not relevant to the circuit design or a designer wants the path to have a larger or smaller timing constraint compared to the default timing constraint. A default timing exception applies to all other paths of the circuit 1130 of FIG. 13 (e.g., any path from A, F or E to D or C) and uses the default timing constraint. For example, assume the default timing constraint is 15 ns and the command below is given:

set_max_delay-label-from B-to D 12

This case results in the path from circuit B to circuit D having a smaller timing constraint (12 ns) from the default (15 ns).

Since a particular timing exception is defined above, and the default timing exception also exists, each circuit point of circuit 1130 can have two arrival times (one for each timing exception) and also two required times (one for each timing exception). An example is presented below.

The exemplary delay for gate 1150 is 2 ns and for gate 1152 is also 2 ns and for gate 1154 is also 2 ns. The arrival times at point 1140*c* of circuit 1130 can be expressed as the following arrival tags:

2(others)
4(B)

where (others) represents the default timing exception and (B) represents the above defined timing exception from circuit B to circuit D. These labels and associated values are called "tags." A tag is defined for a given timing exception. At point 1140*c*, it takes signals 4 ns to arrive from circuit B, but only 2 ns to arrive from the other circuits (e.g., circuit E, F and A). The arrival times at circuit C of circuit 1130 can be expressed as the following arrival tags:

2(others)
4(B)

At circuit C, it takes signals 4 ns to arrive from circuit B, but only 2 ns to arrive from the other circuits. The arrival times at point 1140*d* of circuit 1130 can be expressed as the following arrival tags:

4(others)
6(B)

At point 1140*d*, it takes signals 6 ns to arrive from circuit B, but only 4 ns to arrive from the other circuits. The arrival time for point 1140*b* is 2(B).

Regarding required times, the required times at point 1140*a* of circuit 1130 can be expressed as the following required tags:

2(others)
4(D)

where (others) represents the default timing exception and (D) represents the above defined timing exception from circuit D of the defined timing exception. At point 1140*a*, a signal needs to arrive 4 ns before the capture clock at circuit D, but 2 ns before the capture clock for the others (e.g., circuit C). The required times at point 1140*b* of circuit 1130 can be expressed as the following required tags:

2(others)
4(D)

At point 1140*b*, a signal needs to arrive 4 ns before the capture clock at circuit D, but 2 ns before the capture clock for the others (e.g., circuit C). The required times at point 1140*g* of circuit 1130 can be expressed as the following required tags:

4(others)
6(D)

At point 1140*g*, a signal needs to arrive 6 ns before the capture clock at circuit D, but 4 ns before the capture clock for the others (e.g., circuit C). The required times at point 1140*c* of circuit 1130 can be expressed as the following required tags:

0(others)
2(D)

At point 1140*c*, a signal needs to arrive 2 ns before the capture clock at circuit D, but 0 ns before the capture clock for the others (e.g., circuit C).

As shown above, each circuit point can have multiple arrival times and multiple required times defined for it. For example, point 1140*c* has the following "tags" defined:

Arrival tags: 4(B) and 2(others)
Required tags: 2(D) and 0(others)

With respect to the default case, the static timing analysis process maintains the worst arrival time and the worst required time for all paths through the given point while the other defined timing exceptions allow other information to be maintained at the given point. An example of arrival tag computation is found in copending U.S. patent application Ser. No. 09/093,817, filed Jun. 8, 1998, entitled, "Method and Apparatus for Tag-based Static Timing Analysis with Exceptions," assigned to the assignee of the present invention, and hereby incorporated by reference.

Modeling Tag Information at the Circuit Block Boundary

The present invention captures tag information at a circuit block's boundary in order to produce a circuit model having timing exception information. This timing exception information can then be used in a circuit optimizer, in one embodiment of the present invention. By eliminating the internal circuitry of the modeled circuit, but retaining timing exception information, the present invention offers a highly efficient circuit model that can yet be used effectively in circuit optimizations.

Figure 14A:
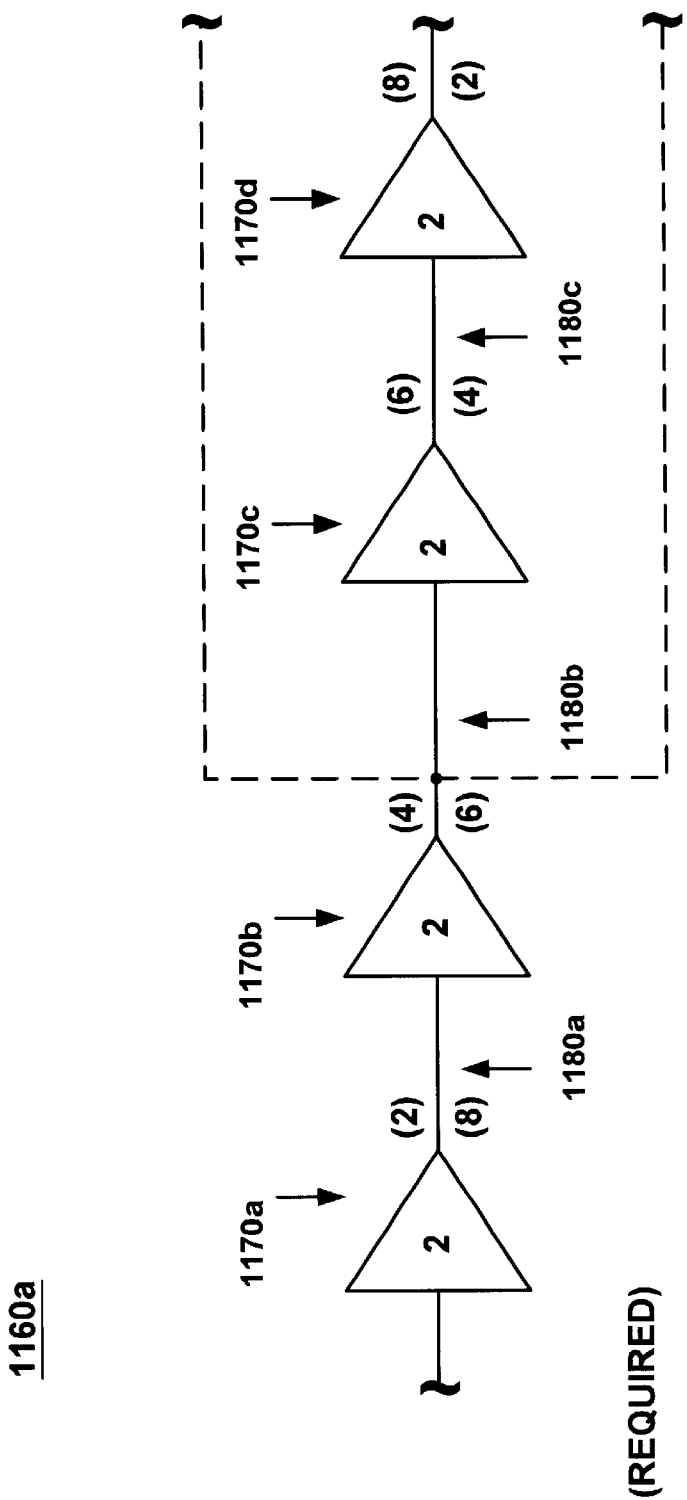
FIG. 14A is a circuit diagram illustrating a circuit path entering an exemplary circuit block at an input pin of the circuit block.
Figure 14B:
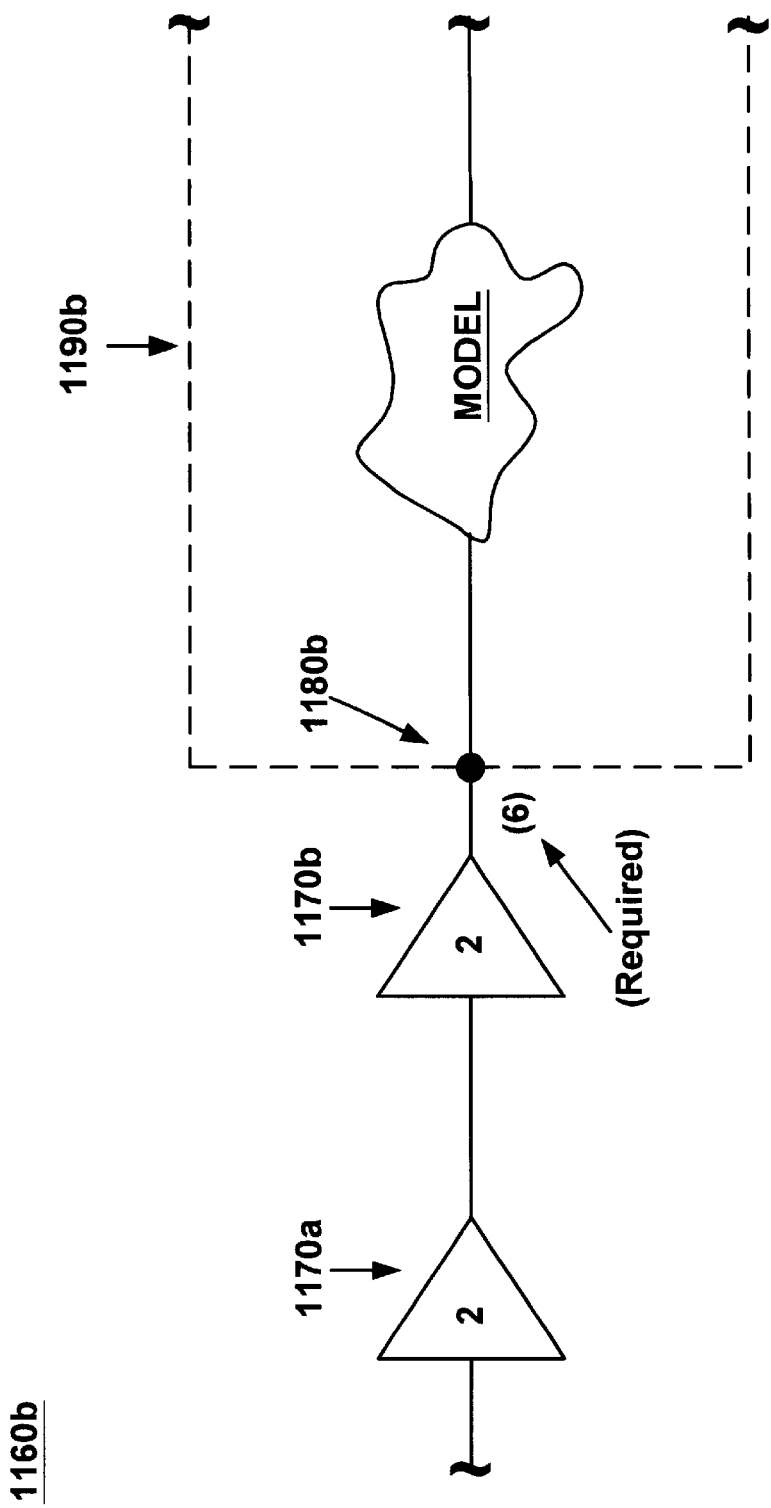
FIG. 14B is a circuit diagram illustrating the circuit path of FIG. 14A and a required time (and required tag) that is recorded by the present invention and associated with the input pin.

FIG. 14A illustrates an exemplary circuit portion 1160*a* including the input boundary of a circuit block 1190*a*. Input pin 1180*b* is shown. Arrival times are shown on top of the wire segments and required times are shown below. These values are computed from static timing analysis. In this example, the arrival time at the input pin 1180*b* is 4 ns and the required time is 6 ns assuming the signal delays for exemplary gates 1170*a*–1170*d* are each 2 ns. The circuit block 1190*a* is to be modeled by a circuit model 1190*b* as shown in FIG. 14B where the internal circuitry (e.g., gates 1170*c*–1170*d*) of the circuit block 1190*a* is removed to simplify the circuit description. Therefore, gate 1170*b* supplies the model 1190*b*.

For input pins to a circuit model, the present invention captures the required times associated with the model's input pins. In this case, the 6 ns required time along with its associated required tag is captured by the present invention and associated with the input pin 1180*b* of model 1190*b*. At inputs, required times are captured because they can be used in timing constraint computations. Arrival times are not captured at input pins because the circuitry they supply is no longer present within the model 1190*b*.

Figure 15A:
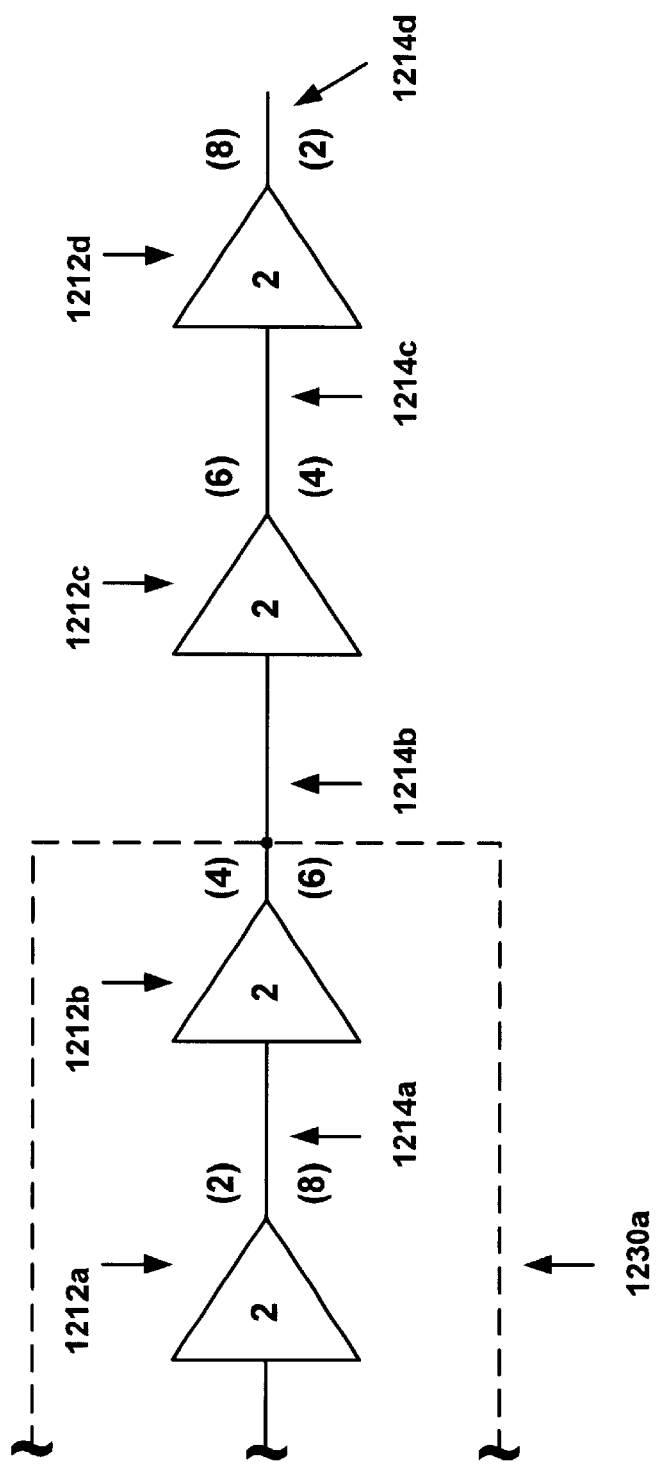
FIG. 15A is a circuit diagram illustrating a circuit path exiting an exemplary circuit block at an output pin of the circuit block.
Figure 15B:
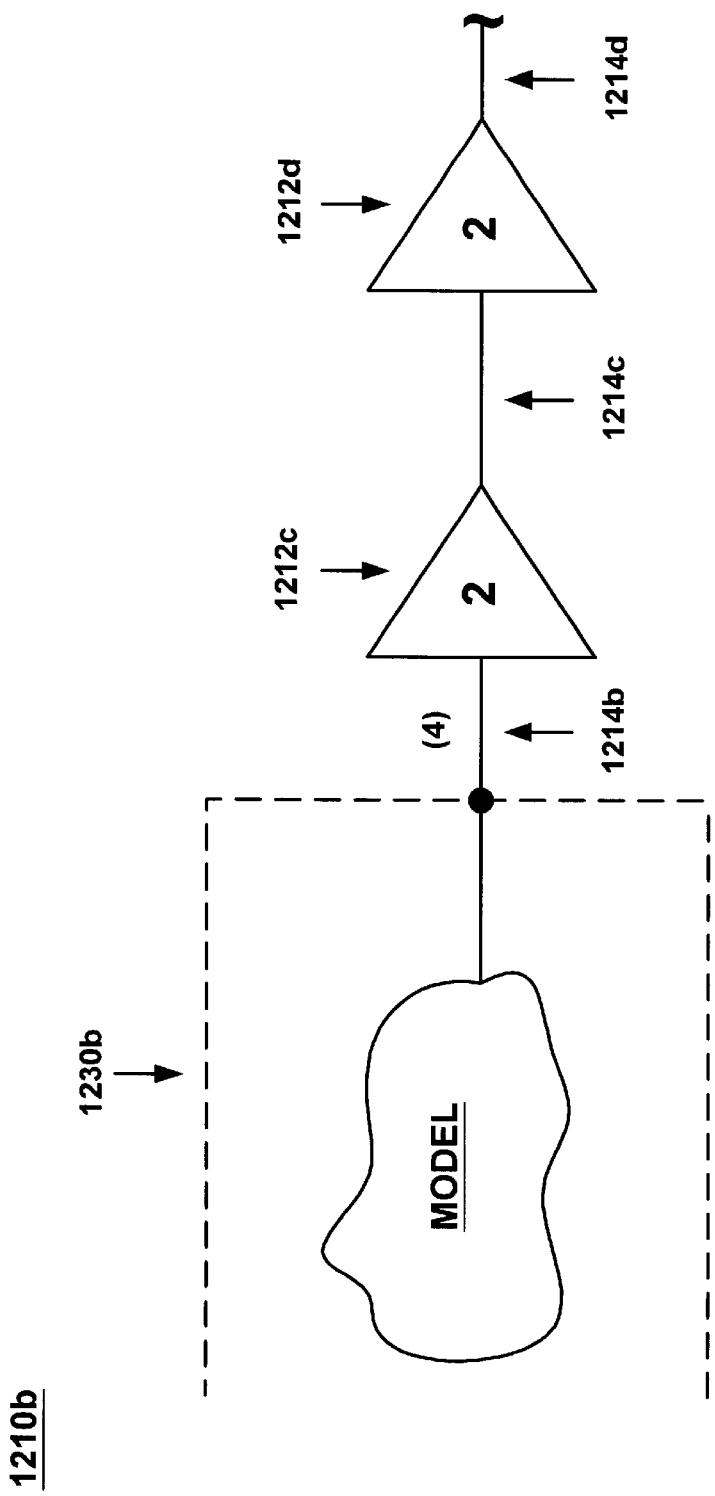
FIG. 15B is a circuit diagram illustrating the circuit path of FIG. 15A and an arrival time (and arrival tag) that is recorded by the present invention and associated with the output pin.

FIG. 15A illustrates an exemplary circuit portion 1210*a* including the output boundary of a circuit block 1230*a*. Output pin 1214*b* is shown. Arrival times are shown on top of the wire segments and required times are shown below. These values are computed from static timing analysis. In this example, the arrival time at the output pin 1214*b* is 4 ns and the required time is 6 ns assuming the signal delays for exemplary gates 1212*a*–1212*d* are each 2 ns. The circuit block 1230*a* is to be modeled by a circuit model 1230*b* as shown in FIG. 15B where the internal circuitry (e.g., gates 1212*a*–1212*b*) of the circuit block 1230*a* is removed to simplify the circuit description. Therefore, gate 1212*c* receives signals from the model 1230*b*.

For output pins from a circuit model, the present invention captures the arrival times associated with the model's output pins. In this case, the 4 ns arrival time along with its associated arrival tag is captured by the present invention and associated with the output pin 1214*b* of model 1230*b*. At outputs, arrival times are captured because they can be used in timing constraint computations. Required times are not captured at output pins because the circuitry for which they are relevant along their path is no longer present within the model 1230*b*.

Figure 16A:
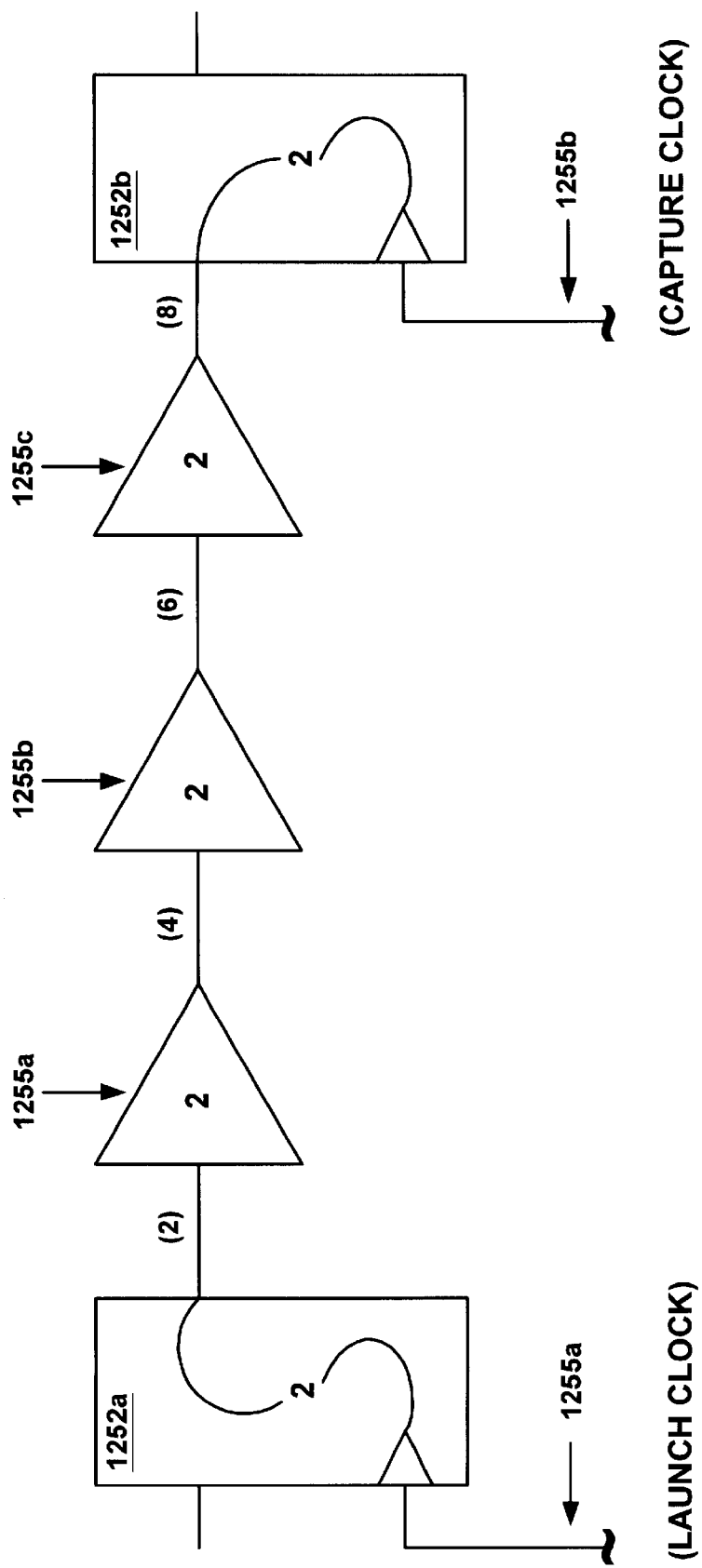
FIG. 16A illustrates an exemplary circuit and an arrival tag associated with a launch clock in accordance with an embodiment of the present invention.

FIG. 16A is used to describe launch and capture clocks. FIG. 16A illustrates an exemplary circuit 1250 having two sequential elements 1252*a* and 1252*b*. Arrival and required tags are defined with respect to an associated clock. Arrival tags are associated with a launch clock and required tags are associated with a capture clock. For instance, an arrival tag originating from element 1252*a* is defined with respect to launch clock 1255*a*. A required tag originating from element 1252*b* is defined with respect to capture clock 1255*b*.

Figure 16B:
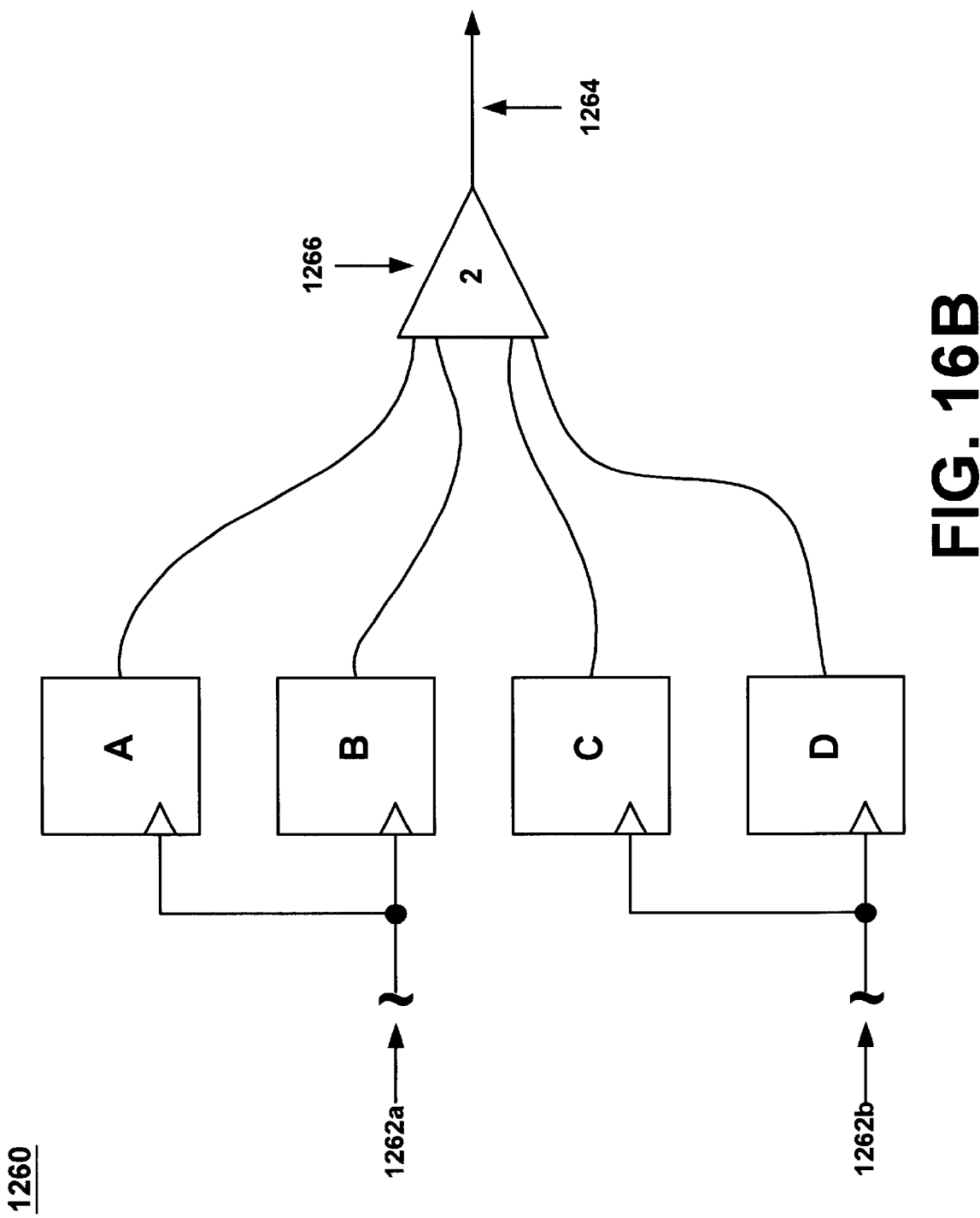
FIG. 16B illustrates an exemplary circuit having some circuit paths associated with a first launch clock and other circuit paths associated with a second launch clock in accordance with an embodiment of the present invention.

FIG. 16B illustrates a multiple clock circuit 1260 to illustrate that default timing exceptions are distinguished based on their common clock. For instance, FIG. 16B illustrates four clocked elements A, B, C and D feeding the same gate 1266. Clocked elements A and B are clocked by clock 1262*a* ("clock1"). Clocked elements C and D are clocked by clock 1262*b* ("clock2"). Assume a timing user-defined exception is defined from element D to gate 1266. Because tags are clock specific, this situation creates the following three timing exceptions:

| CLOCK | TYPE OF EXCEPTION | TAG NAME |
|---|---|---|
| (A and B) - clock 1 | default | arrival tag1 |
| (C) - clock2 | default | arrival tag2 |
| (D) - clock2 | user-defined | arrival tag3 |

In this case, it is appreciated that the default timing exception includes two different tags because different clocks are involved with the gates on the default paths. For instance, tag1 is the default timing exception for signals from elements A and B for clock1. Tag2 is the default timing exception for signals from element C for clock. Tag3 is the defined timing exception for signals from element D for clock2. The same is true for required tags with respect to elements being clocked by different capture clocks.

Model Generation Process of the Present Invention

Figure 17A:
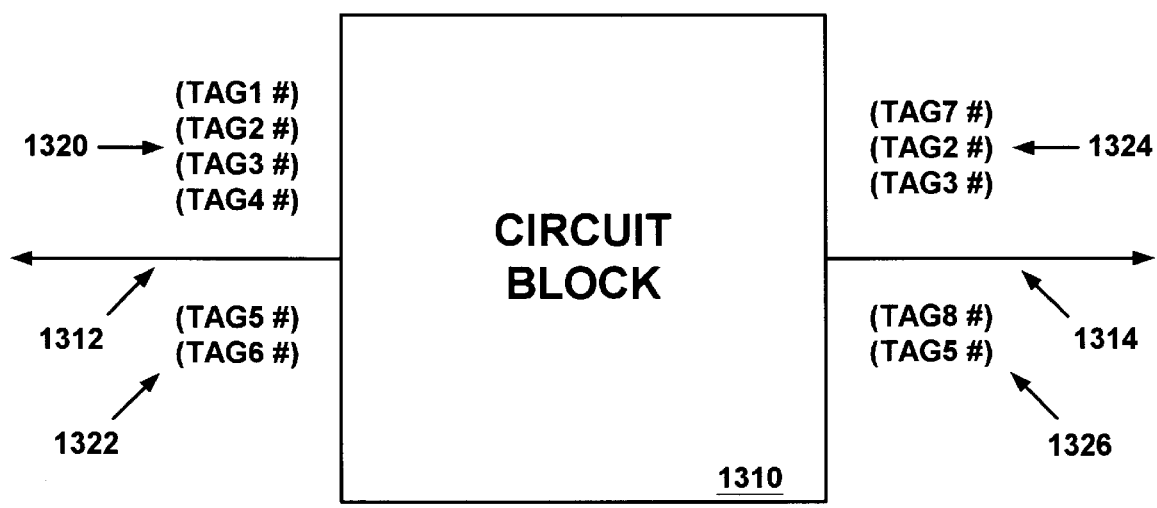
FIG. 17A is a block diagram of an exemplary circuit block having at least one input pin and one output pin and various arrival and required tags associated with each pin as generated by a static timing analysis process.
Figure 17B:
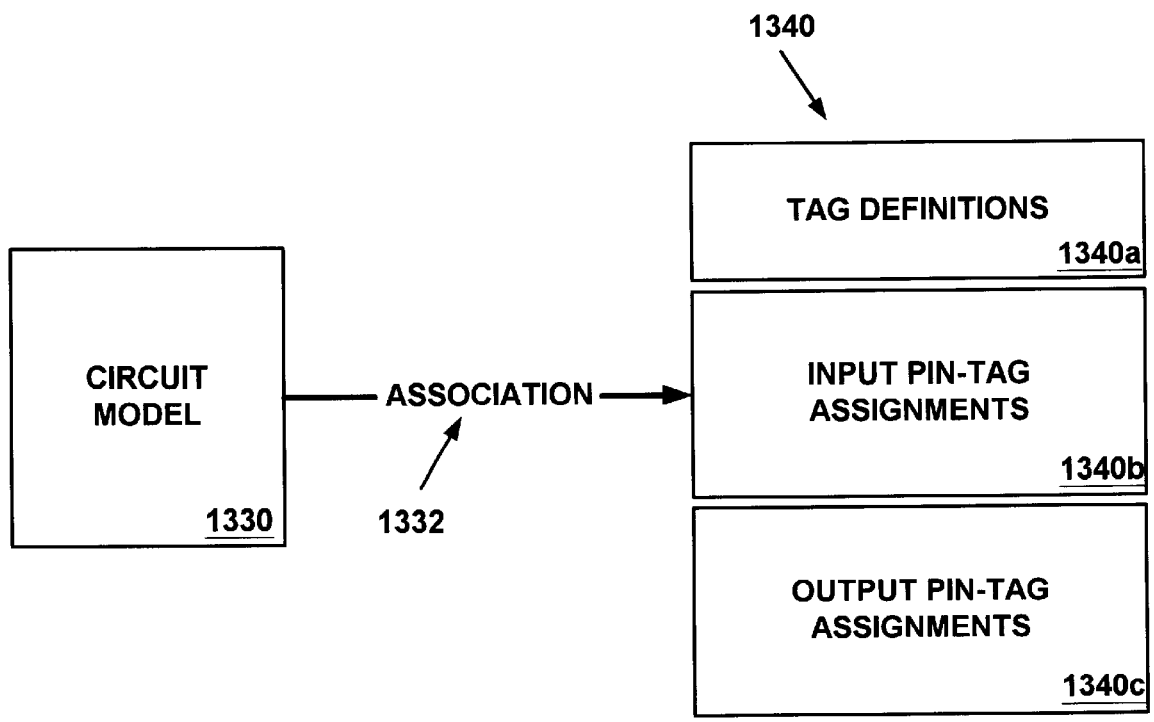
FIG. 17B is a block diagram of a circuit model in accordance with one embodiment of the present invention having an associated timing data structure which contains textual commands describing timing exception information.

FIG. 17A illustrates an exemplary circuit block 1210 having an input 1312 and an output 1314. Associated with the input 1312 are a number of arrival tags 1320 and a number of required tags 1322. Associated with the output 1314 are a number of arrival tags 1324 and a number of required tags 1326. Each tag has a tag name and a value "#." This information comes from static timing analysis. In creating the new models from circuit blocks, the present invention copies the original circuit block 1310 to form a model 1330 as shown in FIG. 17B and removes most of its contents thereby leaving a "shell." In one embodiment, only the pins of the original circuit would be left in the model 1330. In another embodiment, some of the internal components of the circuit block 1310 may be left in tact in the model 1330, although this is not required. Once this model shell 1330 has been created, new data is associated with the model 1330 to make up for some of the information that was lost by the removal of the block's internal circuitry. It is appreciated that the new information can be added directly in the model definition 1330 or can be associated, e.g., linked, to the model using a pointer 1332 or other association tool.

Optional information added to the model 1330 of FIG. 17B, in one embodiment of the present invention, includes: (1) the circuit block size; (2) for each model pin, recorded is the electrical capacitance which the corresponding block pin imposed on the circuit which was outside the circuit block; (3) for each model output, recorded is the electrical current (drive) which the corresponding block pin gave to the circuit which was outside the circuit block; and (4) and for each model pin, recorded the physical position that the corresponding block pin occupied. It is appreciated that other data could be included, depending on the application for which the model is intended.

In accordance with the present invention, the next step in creating the model 1330 of FIG. 17B is to record information on the model which represents exception path information. In accordance with an embodiment of the present invention, exception information is added to a model through the use of "commands" which are associated with the inputs and outputs of the model. These commands can be "textual" commands, but can take any syntax. In an alternate embodiment, one could annotate the model with binary data in a computer program data structure. Specifically, the present invention associates required tags with the circuit inputs and ignores the arrival tags at the circuit inputs. The present invention associates arrival tags with the circuit outputs and ignores the required tags at the circuit outputs. In this example of FIG. 17A, the present invention associates required tags 1322 with input 1312 and arrival tags 1324 are associated with output 1314.

As shown in FIG. 17B, a data structure 1340 of the above commands is associated with the model 1330. The data structure 1340 contains tag definitions 1340a for arrival tags that are associated with the output pins of the original circuit block and for required tags that are defined with respect to the input pins of the original circuit block. The data structure 1340 also contains an association 1340b of all required tags associated with each input pin and an association 1340c of all arrival tags associated with each output pin.

Figure 18A:
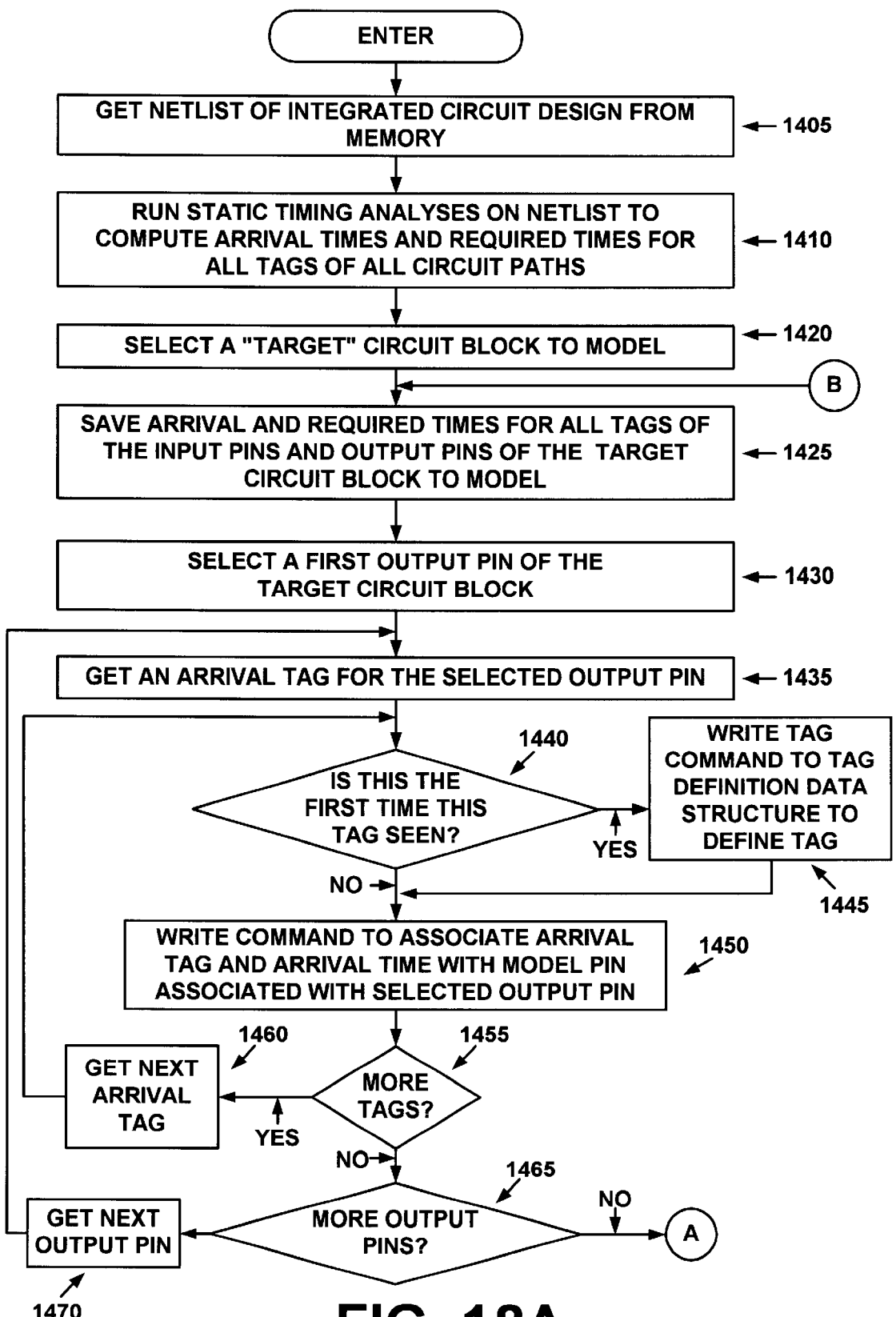
FIG. 18A and FIG. 18B are steps in a process in accordance with one embodiment of the present invention for automatically generating circuit models from input circuit blocks and related information generated from a static timing analysis process.
Figure 18B:
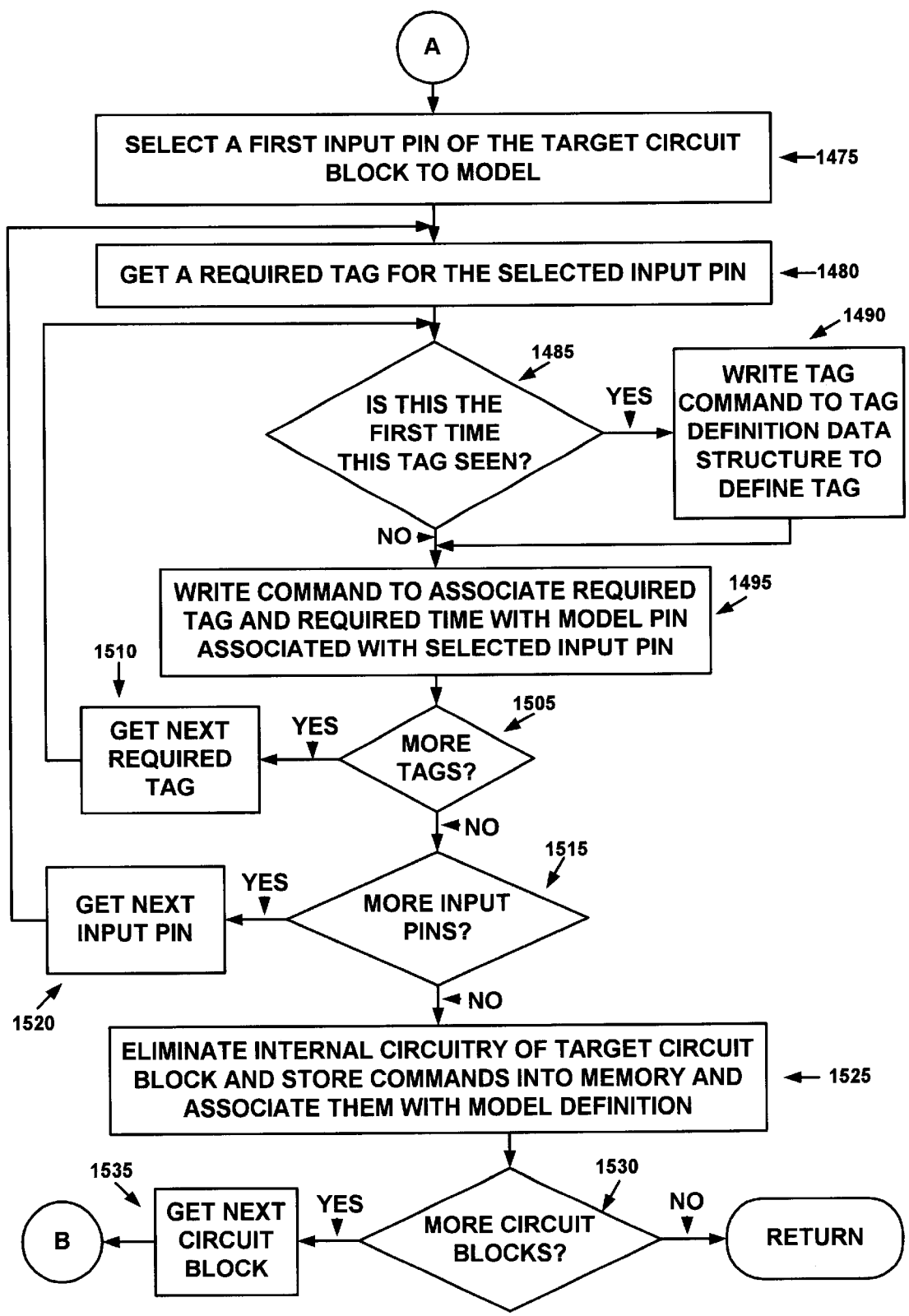

The process 1400 for generating the circuit models of one embodiment of the present invention with their associated data structure 1340 is shown in FIG. 18A and FIG. 18B. Process 1400 is realized as computer instructions stored in computer readable memory units of system 212 (FIG. 2) and executed by processor 201. Process 1400 begins at step 1405 where an integrated circuit netlist containing circuit blocks is accessed from computer memory. At step 1410, static timing analysis is run on the netlist so that arrival and required times (e.g., "values") are computed for all arrival and required tags for the points of the circuit. It is appreciated that the above analysis can be performed on the entire netlist at once, or, alternatively, it can be performed circuit block by circuit block, e.g., as the circuit blocks are being individually selected. In any case, the timing exception information is annotated into the netlist at each point along the circuit paths. At step 1420, a target circuit block is selected to model.

At step 1425, the present invention saves the arrival and required times for all tags of the input and output pins of the target circuit block. At step 1430, the present invention selects an output pin of the target circuit block. At step 1435, the present invention selects an arrival tag associated with the selected output pin. At step 1440, a check is made to determine if this tag has been previously processed with respect to this target circuit block. If not, then at step 1445 the present invention writes a command to the data structure 1340a (FIG. 17B) defining this tag. In one embodiment, this command is a textual command and it includes a tag label, a timing exception and a clock. The timing exception defines a path that crosses the boundary of the circuit block. Step 1450 is then entered. At step 1440, if the tag has already been processed by step 1445, then it is not duplicated (to conserve memory resources) and step 1450 is directly entered.

At step 1450 of FIG. 18A, the present invention writes out a command that associates the selected arrival tag value (with associated arrival tag label and arrival time) with the selected output pin. In one embodiment, this command is a textual command that is placed into data structure 1340c (FIG. 17b) and includes the tag label and the arrival time. The command references the tag definition in 1340a. At step 1455, a check is made to determine if there are more arrival tags associated with the selected output pin that need to be incorporated into the circuit model. If so, then a next arrival tag is selected at step 1460 and step 1440 is entered again. At step 1455, if all arrival tags for the selected output pin have been processed, then step 1465 is entered. At step 1465, a check is made to determine if there are more output pins associated with the target circuit block that need to be processed. If so, then a next output pin is selected at step 1470 and step 1435 is entered again. At step 1465, if all output pins for the target circuit block have been processed, then step 1475 of FIG. 18B is entered. At this point, the circuit model has all the arrival tag information of the output boundary of the target circuit block.

FIG. 18B illustrates the steps of process 1400 used to capture the timing exception information at the input boundary of the target circuit block. At step 1475, the present invention selects an input pin of the target circuit block. At step 1480, the present invention selects a required tag associated with the selected input pin. At step 1485, a check is made to determine if this tag has been previously processed with respect to this selected target block (e.g., by either step 1490 or step 1445). If not, then at step 1490, the present invention writes a command to the data structure 1340a (FIG. 17B) defining this tag. In one embodiment, the command is a textual command and it includes a tag label, a timing exception and a clock. The timing exception defines a path that crosses the boundary of the circuit block. Step 1495 is then entered. At step 1485, if the tag has already been processed by step 1445 or by step 1490, then it is not duplicated and step 1495 is directly entered. At this point, the circuit model also has all the required tag information of the input boundary of the target circuit block.

At step 1495 of FIG. 18B, the present invention writes out a command that associates the selected required tag (with tag label and required time) with the selected input pin. In one embodiment, this command is a textual command that is placed into data structure 1340b (FIG. 17b) and includes a required tag label and a required time. This command references the associated tag in 1340a. At step 1505, a check is made to determine if there are more required tags associated with the selected input pin that need to be processed. If so, then a next required tag is selected at step 1510 and step 1485 is entered again. At step 1505, if all required tags for the selected input pin have been processed, then step 1515 is entered. At step 1515, a check is made to determine if there are more input pins associated with the target circuit block that need to be processed. If so, then a next input pin is selected at step 1520 and step 1480 is entered again. At step 1515, if all input pins for the target circuit block have been processed, then step 1525 of FIG. 18B is entered.

At step 1525 of FIG. 18B, the present invention copies the target circuit block as a model into computer memory and eliminates from the model the internal circuitry of the target circuit block but saves the input and output pin designations. This can be performed using a "create_model_shell" command. At step 1525, the present invention associates the data structures 1340a–1340c (stored within computer memory) with the model of the target circuit block. Other information is then optionally added to the model including: (1) the circuit block size; (2) for each model pin, recorded is the electrical capacitance which the corresponding block pin imposed on the circuit which was outside the circuit block; (3) for each model output, recorded is the electrical current (drive) which the corresponding block pin gave to the circuit which was outside the circuit block; and (4) and for each model pin, recorded the physical position that the corresponding block pin occupied.

At step 1530, the present invention checks if there are more circuit blocks of the netlist to process. If so, then process 1400 gets the next circuit block as the target circuit block at step 1535 and returns to step 1425 of FIG. 18A. At step 1530, if models have been made of all of the circuit blocks, then process 1400 returns. It is appreciated that although the input pins are processed after the output pins in process 1400, this sequence can be reversed within the scope of the present invention. Below is a listing of pseudo code that can be used in one embodiment of the present invention to realize process 1400. It is appreciated that the listed psuedo code is exemplary only and that other alternatives are available. The example should not be construed as limiting the scope of the invention to any particular computer language or subroutine architecture or structure.

Example Pseudo Code for Process 1400

Call the circuit block that is desired to model "the target block"
Run static timing analysis on the circuit which contains the target block and save arrival and required totals and tags which are calculated for the target block's pins.

```
for each output pin of the target block {
    for each set of arrival totals at the output pin of the
        target block {
        get the arrival tag associated with the total
        If this is the first time we have encountered this
        particular tag {
            write the tag data as a textual command to be
            applied to the model
        }
        get the model pin associated with the output pin of
        the target block
        write a command which associates the tag and the
        totals data with the model pin
    }
}
for each input pin of the target block {
    for each set of required totals at the input pin of the
        target block {
        get the required tag associated with the total
        If this is the first time we have encountered this
        particular tag {
            write the tag data as a textual command to be
            applied to the model
        }
        get the model pin associated with the input pin of
        the target block
        write a command which associates the tag and the
        totals data with the model pin
    }
}
```

An example of the textual commands that process 1400 generates in one embodiment of the present invention is given below. Assume that a tag corresponds to timing data launched from "clock1" and is timing for exceptions "exc1" and "exc2." Exceptions are created using the "set_max_delay" or "set_min_delay" commands as described above. The tag is given a label, in this case "tag1." In one embodiment, writing the tag data as a command is performed as:

create_tag-label tag1-clock clock1-exception {exc1, exc2}

This command indicates that the launch clock for tag1 is clock1 and associates the exceptions exc1 and exc2 with the tag. As discussed above, the exception definition defines the "from" and "to" points of the path and also a timing constraint value. Tag and total data are associated with a model output pin. Assume that model pin A has an arrival total which is associated with tag1, and the arrival time in the total is 5.0 nanoseconds. In one embodiment, associating the tag and total data with the model pin is performed as:

set_arrival-pin A-tag tag1 5.0

It is possible that a single pin may have multiple set_arrival commands written for it, e.g., one for each arrival total on the pin.

To associate tag and total data with an input pin, a similar command is written out in accordance with the present invention. Assume that model pin B has a required total which is associated with tag2, and the required time in the total is 6.0 nanoseconds. In one embodiment, associating the tag and total data with the model pin is performed as:

set_required-pin B-tag tag2 6.0

It is possible that a single pin may have multiple set_required commands written for it, e.g., one for each required total on the pin.

Another example of the textual commands that process 1400 generates is given below with reference to an example circuit block of FIG. 19A. Process 1400 is used to create model commands for block 1545 of FIG. 19A, then it replaces block 1545 with its model 1560 (FIG. 19B). Block 1545 contains input pin X and output pin Y. The timing paths of block 1545 are not self-contained within circuit block 1545. For the purpose of this example, it is assumed that the exception paths of the example above have been given at 10.0 nanoseconds. These are called the exception paths "exc1" and "exc2." An example of the commands that define the exception paths is given below:

set_max_delay-label exc1-from from1-to to1 10.0
set_max_delay-label exc2-from from2-to to2 10.0

It is also assumed that the default timing constraint for all other circuit paths is 15.0 nanoseconds.

In any timing path, the starting clock and ending clock will depend on the details of the circuit. For the purpose of this example, it is assumed that all of the timing paths which end in block 1545 of FIG. 19A have a clock of "clock1" at the end point. It is also assumed that all paths that start in block 1545 have a starting clock of "clock2."

When static timing analysis is applied to circuit 1540 of the example, it calculates one or more arrival totals and one or more required totals for each point in the circuit. For the purpose of modeling in accordance with the present invention, only the required totals at point X and the arrival totals at point Y are used. At point X, there are two required totals:

| | |
|---|---|
| Required total value: 4 (e.g., 2+2=4) | Tag: clock1 no exceptions |
| Required total value: 5 (e.g., 3+2=5) | Tag: clock1 exc1 |
| At point Y, there are two arrival totals: | |
| Arrival total value: 5 (3+2) | Tag: clock2 no exceptions |
| Arrival total value: 4 (2+2) | Tag: clock2 exc2 |

When process 1400 models block 1545, the result is the model 1560 shown in FIG. 19B and this model is associated with a data structure 1340 that contains the following commands:

| Command Text | Data Structure | Generated by Step |
|---|---|---|
| create_tag - label tag1 -clock clock1 | in 1340a | 1490 |
| create_tag - label tag2 -clock clock1 -exception exc1 | in 1340a | 1490 |
| set_required -tag tag1 -pin X 11.0 | in 1340b | 1495 |
| set_required -tag tag2 -pin X 5.0 | in 1340b | 1495 |
| create_tag - label tag3 - clock clock2 | in 1340a | 1445 |
| create_tag - label tag4 - clock clock2 -exception exc2 | in 1340a | 1455 |

-continued

| Command Text | Data Structure | Generated by Step |
|---|---|---|
| set_arrival - tag tag3 - pin Y 5.0 | in 1340c | 1450 |
| set_arrival -tag tag4 - pin Y 4.0 | in 1340c | 1450 |

Figure 19A:
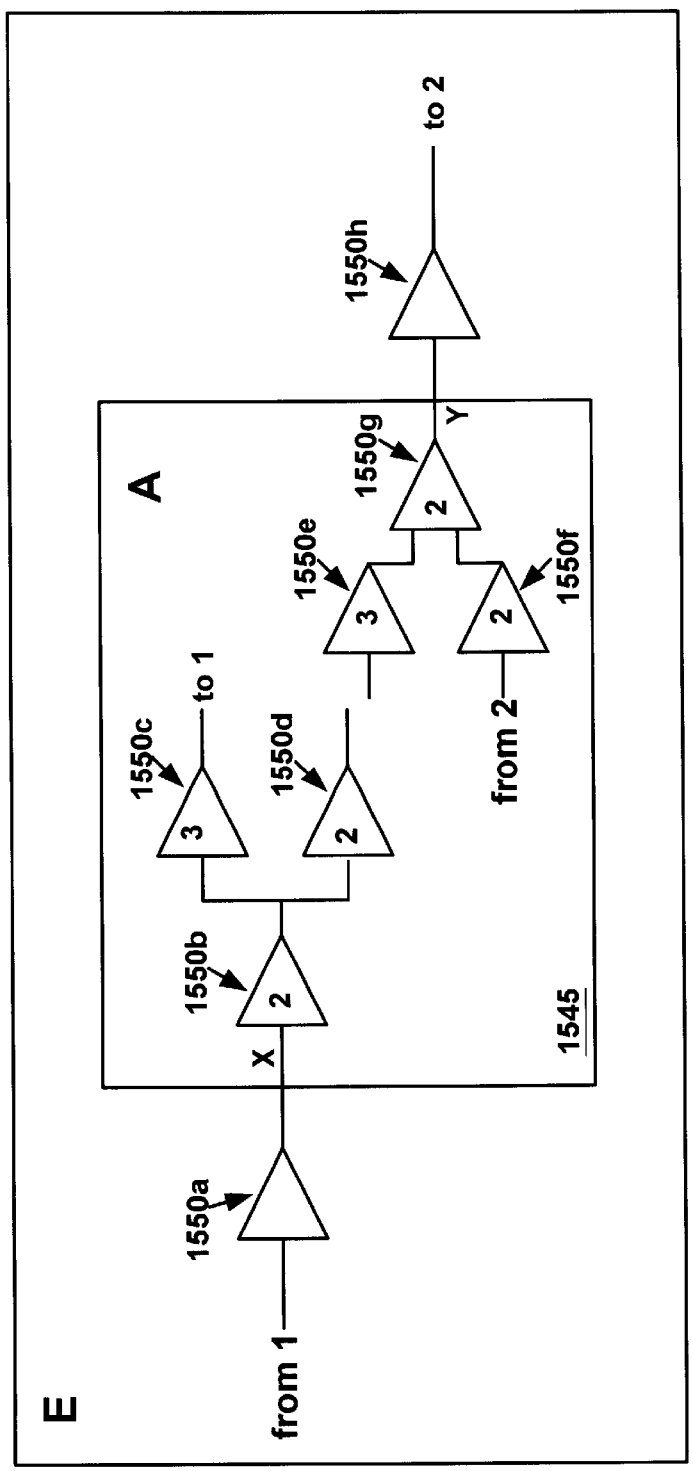
FIG. 19A is a circuit diagram of an exemplary circuit block that can be processed by embodiments of the present invention.
Figure 19B:
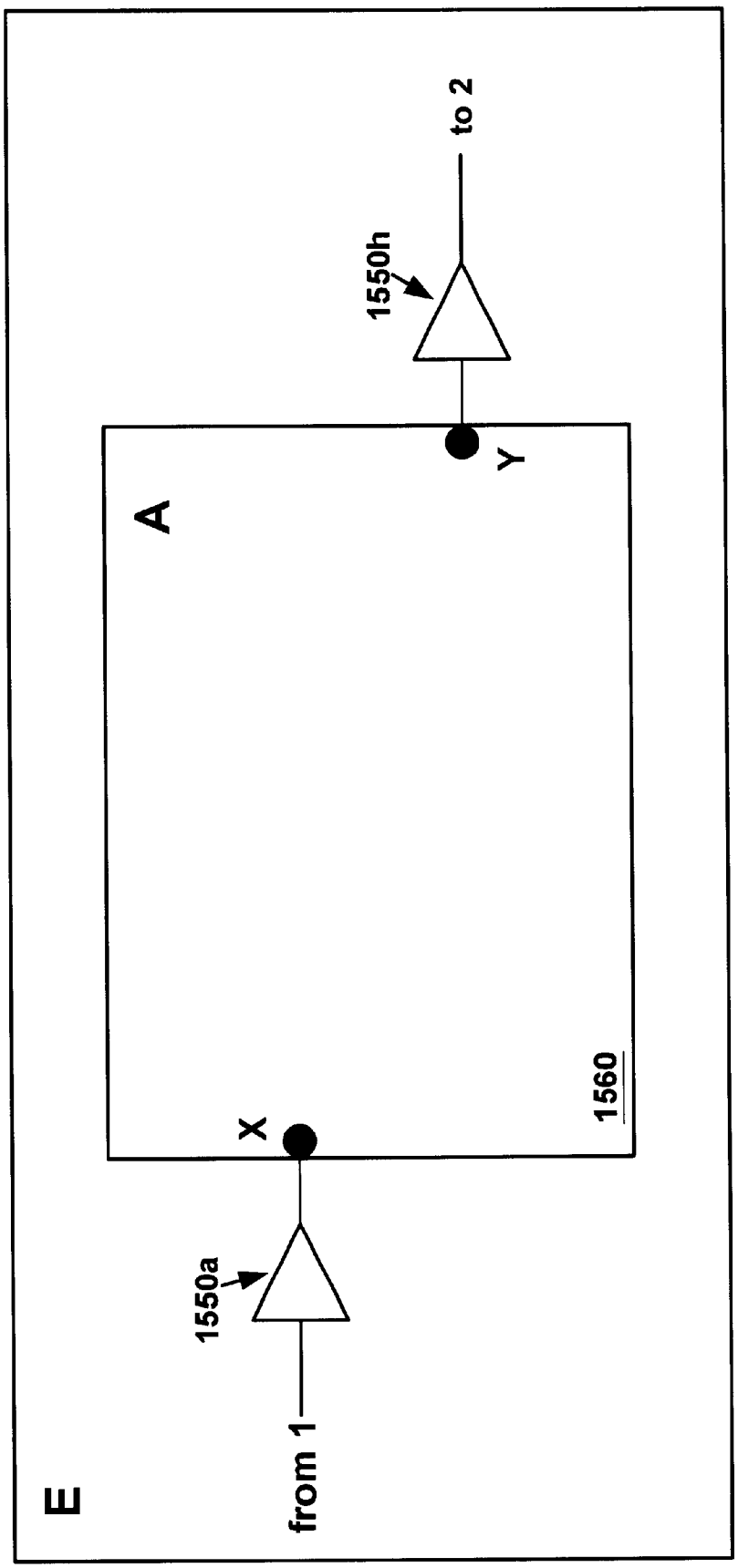
FIG. 19B is the circuit model generated by an embodiment of the present invention based on the exemplary circuit block of FIG. 19A.

In one embodiment of the present invention, when a circuit block is replaced by its model, some points along an exception path may be truncated, as are "to1" and "from2" in the FIG. 19A.

The first task in processing the inserted model is to account for points in exception paths which are removed when the model is inserted. To do this, the exception path definitions can be modified. In the example, this requires the modification of the set_max_delay statements:

set_max_delay-label exc1-from from1-to { } 10.0
set_max_delay-label exc2-from { }-to to2 10.0.

The { } symbol represents an empty set of points. When { } exists in an exception path definition, it means that the exception path cannot be satisfied in the circuit. However, the exception path definition is not removed entirely because it will be referred to be tag definitions later on in the process. It is appreciated that { } is not always used in the exception path definition. For example, if the original definition for exc1 was:

set_max_delay-label exc1-from from1-to {to1, another_point} 10.0 then the corrected definition would be:

set_max_delay-label exc1-from from1-to {another_point} 10.0

In another embodiment, the exception path definition is not modified as a textual description. Instead, the internal data structure of the computer program is modified which processes the command. In the preferred embodiment, data from the definition is not removed, rather specified exception points which have been removed by models are merely ignored. Also, new create_tag, set_arrival and set_required commands are applied to the existing circuit and need to be _processed. These issues are discussed separately.

Use of the Models in Static Timing Analysis and Synthesis

Once the models are created and commands are written in accordance with the present invention to annotate exception path data, the models can be used in static timing analysis and optimization. Optimization uses models in the same way as static timing analysis. Therefore, using a model which contains information about exceptions for optimization follows an analogous process as it does for static timing analysis.

For instance, continuing with the example used above, when the model 1560 (FIG. 19B) for block 1545 (FIG. 19A) is inserted into the circuit, the applied commands cause 4 tags to be generated in the circuit's data structure 1340, each corresponding to a create_tag statement. It is possible that a tag which is identical to the specified tag will already exist in the circuit. In that case, a new tag is not created, rather the given label from the create_tag statement is simply used as an alias for the existing tag. This is done to conserve computer memory resources.

Two arrival totals are generated in the circuit at pin Y, corresponding to the set_arrival commands above. The tags associated with the totals will be tag3 and tag4, respectively. The timing values in the total will be 5.0 and 4.0. When timing analysis propagates delays forward, it treats these totals in the exact same manner as totals which are propagated from timing start points. But unlike totals at timing start points, whose arrival time is zero nanoseconds, the totals at pin Y will be given the value specified by the set_arrival commands of the model.

Two required totals are generated in the circuit at pin X, corresponding to the set_required commands above. The tags associated with the totals will be tag1 and tag2, respectively. The timing values in the total will be 4.0 and 5.0. When timing analysis propagates delays backwards, it treats these totals in the exact same manner as totals which are propagated backward from timing end points. But unlike totals at timing end points, whose required time is equal to the constraint or exception time allowed, the totals at pin X will be given the value specified by the set_required commands of the model.

Once the process of applying commands is done, the following totals will be annotated:

At point X:
    Required total value: 4    Tag: tag1 clock1    no exceptions
    Required total value: 5    Tag: tag2 clock1    exc1
At point Y:
    Arrival total value: 5    Tag: tag3 clock2    no exceptions
    Arrival total value: 4    Tag: tag4 clock2    exc2 .

This tag information matches the tag information which was calculated by timing analysis when the model was created, e.g., when using the pre-modeled circuit block. The tags now have labels, where the original timing analysis may not have, but this is not important to the operation of the model itself or the timing analysis that uses models, e.g., for optimization. Since the timing analysis which uses models contains the same total information as the original timing analysis, both will create the same result when they process the entire circuit.

It is appreciated that encapsulating modeling information as commands is useful because one computer program can generate model information which a separate computer program can then use. Without the use of commands, the program would be forced to share a common data representation for tags and exception information.

Using Virtual Clocks to Create Models in Accordance with an Embodiment of the Present Invention This section introduces another embodiment of the present invention for creating models. This embodiment of the present invention utilizes the command "create_clock" in the model definition. The command "create_clock" is supported in commercially available EDA tools by Synopsys, Inc. of Mountain View, Calif. This embodiment is similar to the embodiment presented above except that the information from the tags in the internal data structure 1340 (FIG. 17B) is conveyed differently in the model. In this embodiment, the use of the create_tag command is replaced by the use of the "create_clock" command. In this embodiment, generally, a model shell is created using the analogous process used above for the models which use create_tag. Next, virtual clocks are created, and arrival and required information is created.

The create_clock command is used to declare clocks. Clocks are used to define the start points and end points that are used in static timing analysis. Part of the definition of a tag is the start clock (for arrival tags) or the end clock (for required tags). If there are a multitude of clocks, then timing analysis will create a multitude of tags which correspond to them. The create_clock command can be used to define what is referred herein as a "virtual clock," which has no corresponding instance in the actual circuit. In accordance with this embodiment of the present invention, the creation of virtual clocks, as described above, in turn will cause tags to be defined by timing analysis, without the direct use of a create_tag command.

Figure 20A:
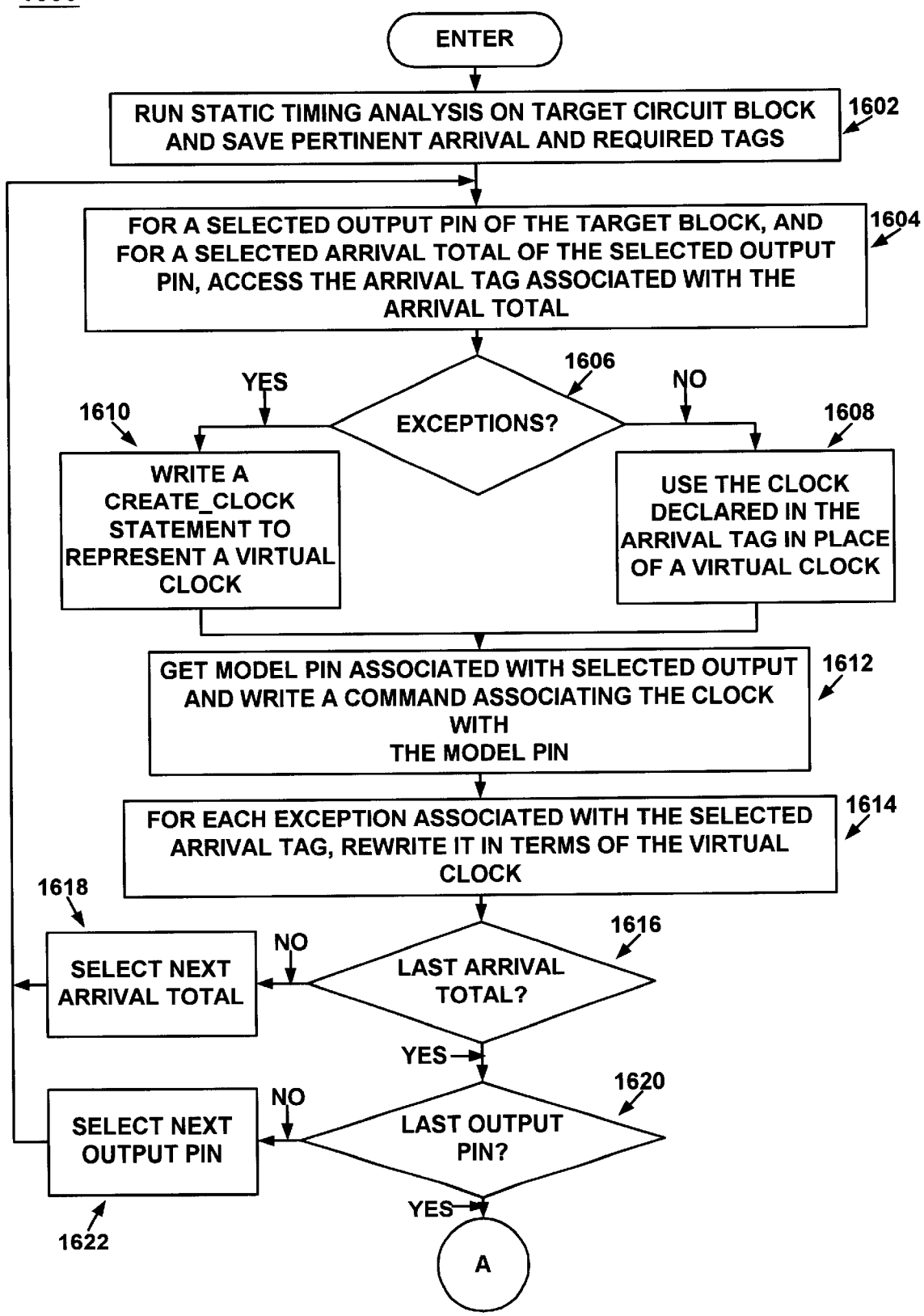
FIG. 20A and FIG. 20B are steps in a process in accordance with a virtual clock embodiment of the present invention for automatically generating circuit models from input circuit blocks and related information generated from a static timing analysis process.
Figure 20B:
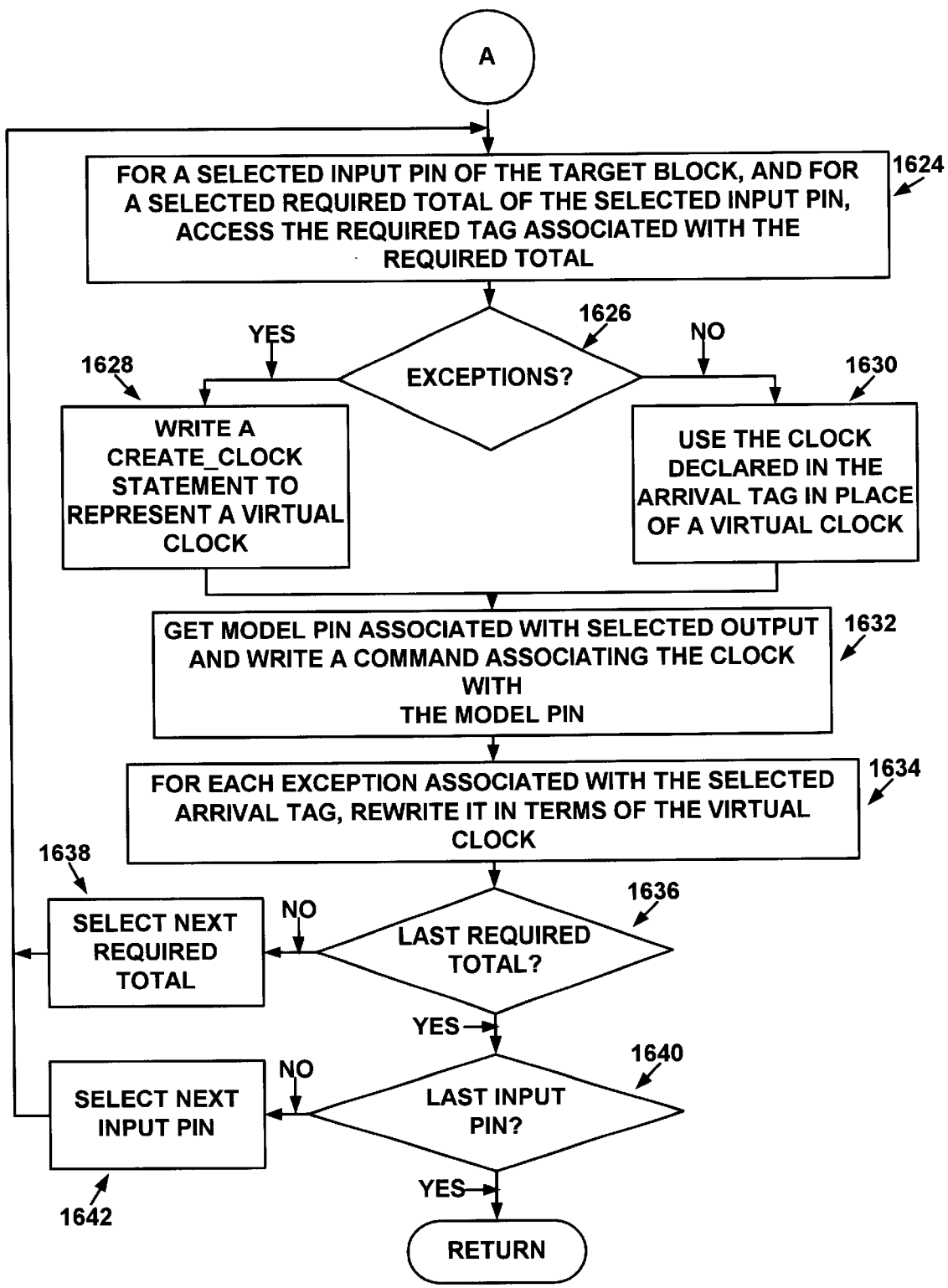

FIG. 20A and FIG. 20B illustrate a process 1600 in accordance with this embodiment of the present invention. Process 1600 is represented as instruction code stored in computer readable memory units of system 212 (FIG. 2) and executed by processor 201. It is appreciated that process 1600 is described with respect to a single circuit block and can be used, iteratively, to process all circuit blocks of the netlist. At step 1602, static timing analysis is run on a selected circuit block and arrival times for the output pins are saved in computer memory and required times for the input pins are saved in computer memory. At 1604, for a selected output pin of the selected or "target" circuit block a selected arrival total is selected and its arrival tag is accessed. At step 1606, if the arrival tag has exceptions associated with it, then step 1610 is entered, else step 1608 is entered. At step 1610, a create_clock statement is written to represent a virtual clock which, except for its label, mimics the clock declared in the arrival tag. At step 1608, the present invention does not write a create_clock command, but rather uses the clock declared in the arrival tag in place of a virtual clock.

At step 1612 of FIG. 20A, the model pin associated with the selected output pin of the target circuit block is obtained and a command is written out that associates the clock with the model pin. At step 1614, for each exception associated with the arrival tag, it is rewritten in terms of the virtual clock. Steps 1616–1622 perform the above process for each arrival tag of each output pin of the target circuit block and then step 1624 of FIG. 20B is entered.

At step 1624, for a selected input pin of the selected or "target" circuit block, a selected required total is selected and its required tag is accessed. At step 1626, if the required tag has exceptions associated with it, then step 1628 is entered, else step 1630 is entered. At step 1628, a create_clock statement is written to represent virtual clock which, except for its label, mimics the clock declared in the required tag. At step 1630, the present invention does not write a create_clock command, but rather uses the clock declared in the required tag in place of a virtual clock.

At step 1632 of FIG. 20B, the model pin associated with the selected input pin of the target circuit block is obtained and a command is written out that associates the clock with the model pin. At step 1634, for each exception associated with the required tag, it is rewritten in terms of the virtual clock. Steps 1636–1642 perform the above process for each required tag of each input pin of the target circuit block.

The above commands (e.g., exception data) are then associated with the new model along with the following other information: (1) the circuit block size; (2) for each model pin, recorded is the electrical capacitance which the corresponding block pin imposed on the circuit which was outside the circuit block; (3) for each model output, recorded is the electrical current (drive) which the corresponding block pin gave to the circuit which was outside the circuit block; and (4) and for each model pin, recorded the physical position that the corresponding block pin occupied. Below is a listing of pseudo code that can be used in one embodiment of the present invention to realize process 1600. It is appreciated that the listed psuedo code is exemplary only and that other alternatives are available. The example should not be construed as limiting the scope of the invention to any particular computer language or subroutine architecture or structure.

Example Pseudo Code for Process 1600

Call the circuit block that is be modeled "the target block"
Run static timing analysis on the circuit which contains the
    target block and save arrival and required totals and tags
    which are calculated for the target block's pins.

```
for each output pin of the target block {
        for each set of arrival totals at the output pin of the target
    block {
            Get the arrival tag associated with the total
            if the tag has exceptions associated with it {
                Write a create_clock statement to represent a
                virtual clock which, except for its label, exactly
                mimics the clock declared in the arrival tag.
            } else {
                Do not write a create_clock statement. Use
                the clock declared in the arrival tag in place
                of a virtual clock.
            }
            Get the model pin associated with the output pin of the
        target block
            Write a command which associates the clock with the model
                pin
            For each exception associated with the arrival tag,
                rewrite it in terms of the virtual clock.
        }
}
```

```
for each input pin of the target block {
        for each set of required totals at the output pin of the
        target block {
                Get the required tag associated with the total
                if the tag has exceptions associated with it {
                        Write a create_clock statement to represent a
                        virtual clock which, except for its label, exactly
                        mimics the clock declared in the required tag.
                } else {
                        Do not write a create_clock statement. Use the
                        clock declared in the arrival tag in place of
                        a virtual clock.
                }
                Get the model pin associated with the input pin of the
        target block
                Write a command which associates the clock with the model
        pin
                For each exception associated with the required tag,
        rewrite it in terms of the virtual clock.
        }
}
```

The following illustrates an example and references the example of FIG. 19A and FIG. 19B. The tags in that example are defined as follows:

At point X, there are two required totals:
    Required total value: 4 (2+2)    Tag: clock1 no exceptions    (tag1)
    Required total value: 5 (3+2)    Tag: clock1 exc1    (tag2)
At point Y, there are two arrival totals:
    Arrival total value: 5 (3+2)    Tag: clock2 no exceptions    (tag3)
    Arrival total value: 4 (2+2)    Tag: clock2 exc2    (tag4)

Also, the clock definitions in the example of the previous section are:

create_clock-label clock1-period 15-waveform {0, 7} create_clock-label clock2-period 15-waveform {5, 10}

When block 1545 of FIG. 19A is modeled using process 1600, the following exemplary commands are generated. Note that the virtual clock called "virtual1" is created for the purpose of representing tag2 above. The virtual clock "virtual2" is created for the purpose of representing tag4 above.

arrival tag, the virtual clock is placed in the "from" list of the exception declaration(s) to which the tag points (step 1614 of FIG. 20A). In the example, the exception declarations would be:

set_max_delay-label exc1-from from1-to {to1, virtual1} 10.0 set_max_delay-label exc2-from {from2, virtual2}-to to2 10.0

Optionally, the circuit points could be removed from the exception declaration which are removed when the model is inserted. In the example below, the "to1" and "from2" are removed:

set_max_delay-label exc1-from from1-to virtual1 10.0 set_max_delay-label exc2-from virtual2-to to2 10.0

Once the model is created, it can be inserted into the top-level circuit in place of block 1545. When timing analysis processes the model and the associated commands, it will create tags at pins X and Y which are similar to those of the timing analysis used to create the model, e.g., using the pre-modeled circuit block 1545.

Figure 21A:
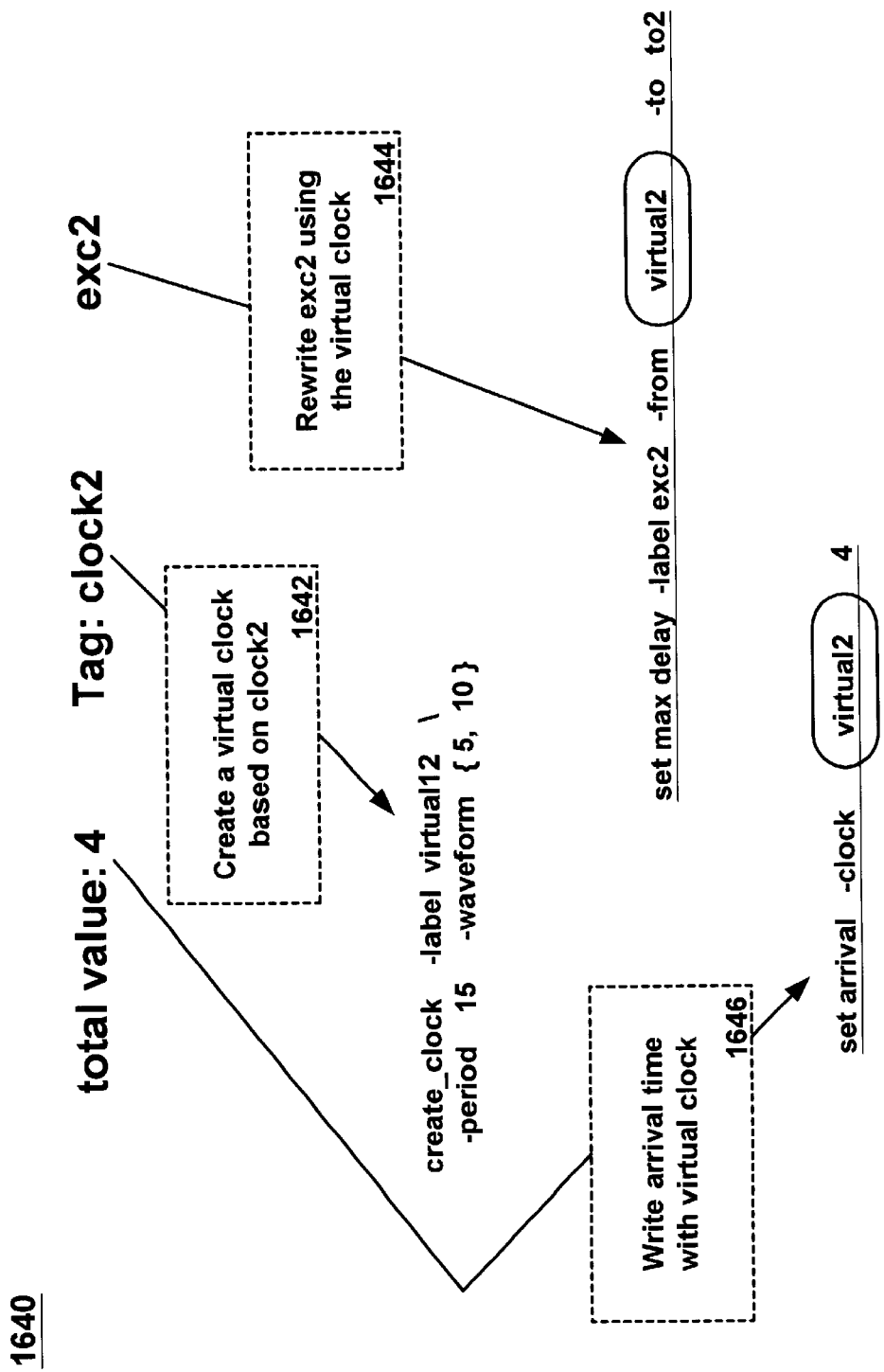
FIG. 21A is a diagram illustrating the manner in which tags are converted into create_clock and set_arrival terms in accordance with the embodiment of the present invention of FIG. 20A and FIG. 20B.
Figure 21B:
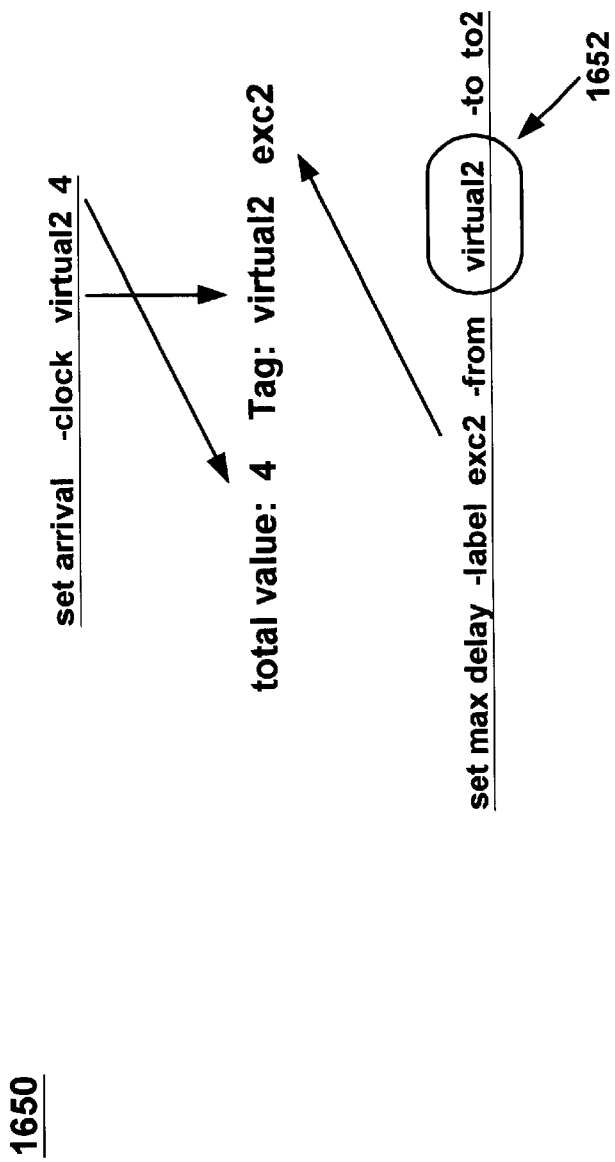
FIG. 21B is a diagram illustrating the manner in which an arrival tag is created by the timing analysis process in accordance with the embodiment of the present invention of FIG. 20A and FIG. 20B.

FIG. 21B illustrates a diagram 1650 of the manner in which the tag is created by the timing analysis process for an

| Command | Data Structure | Generated by Step |
| --- | --- | --- |
| create_clock -label virtual1 - period 15 -waveform {0, 7} | in 1340a | 1628 |
| set_required -clock clock1 -pin X 4.0 | in 1340b | 1632 |
| set_required -clock virtual1 - pin X 5.0 | in 1340b | 1632 |
| create_clock -label virtual2 - period 15 -waveform {5, 10} | in 1340a | 1610 |
| set_arrival -clock clock2 -pin Y 5.0 | in 1340c | 1612 |
| set_arrival -clock virtual2 - pin Y 4.0 | in 1340c | 1612 |

FIG. 21A illustrates a diagram 1640 of the manner in which the tags are converted into create_clock commands and set_arrival commands. At 1642, a virtual clock is created based on "clock2." At 1644, the exception, "exc2," is rewritten using the virtual clock. At 1646, the arrival time is written using the created virtual clock.

Exception declarations are rewritten in terms of the virtual clocks. For a virtual clock which was generated for a required tag, the virtual clock is placed in the "to" list of the exception declaration(s) to which the tag points (step 1634 of FIG. 20B). For a virtual clock which was generated for an arrival time of the model, e.g., when the model is being used for optimization. Each set_arrival command creates a total on the specified pin. The value specified by set_arrival will be used in the total. A tag will automatically be generated for the total which will point to the virtual clock which is specified by set_arrival. If one of the rewritten exceptions has the virtual clock in its "to" field, the tag also includes that exception in its exception list.

With respect to the example, one set_arrival command generates a tag with an exception, the other one generates a tag without an exception:

At point Y:
    Arrival total value: 5    Tag: clock2    no exceptions
    Arrival total value: 4    Tag: virtual2    exc2

Figure 21C:
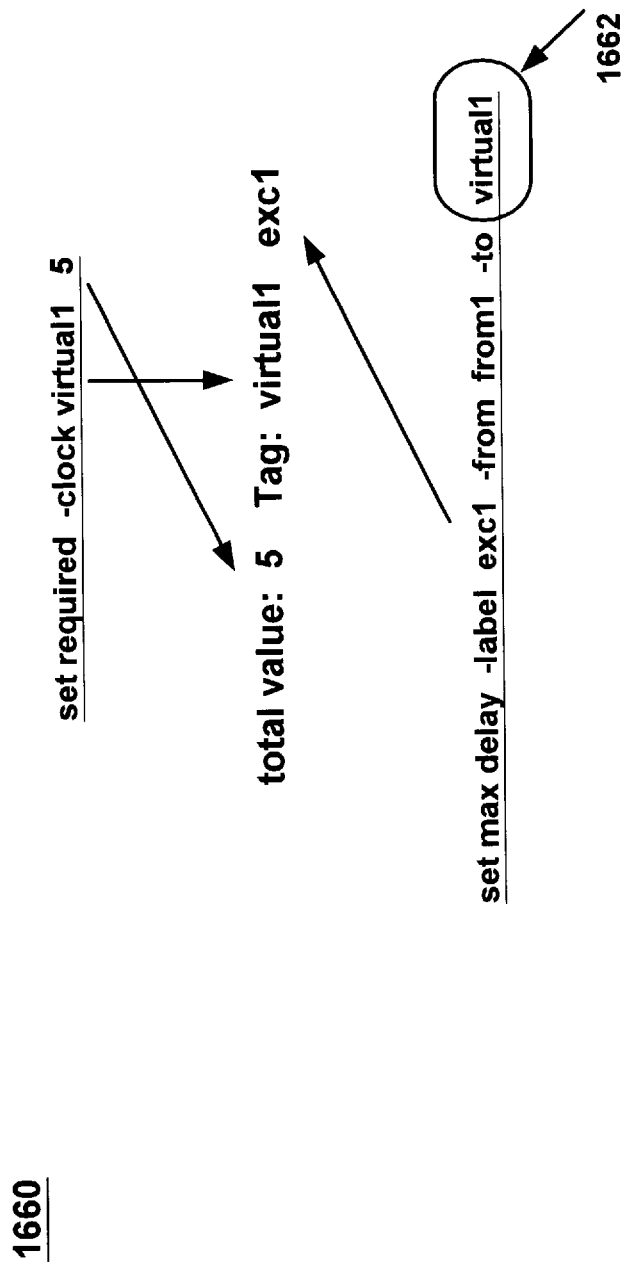
FIG. 21C is another diagram illustrating the manner in which a required tag is created by the timing analysis process in accordance with the embodiment of the present invention of FIG. 20A and FIG. 20B.

FIG. 21C illustrates a diagram 1660 of the manner in which the tag is created by the timing analysis process for a required time of the model, e.g., when the model is being used for optimization. Each set_required command creates a total on the specified pin. The value specified by set_required will be used in the total. A tag will automatically be generated for the total which will point to the virtual clock which is specified by set_required. If one of the rewritten exceptions has the virtual clock in its "from" field, the tag also includes that exception in its exception list.

With respect to the example, one set_required generates a tag with an exception, the other generates a tag without an exception:

At point X:
    Arrival total value: 4    Tag: clock1    no exceptions
    Arrival total value: 5    Tag: virtual1    exc1

This tag information derived from the new commands matches the tag information which was calculated by timing analysis when the model was created. Some clocks which are associated with the tags are now virtual clocks instead of clocks from the original circuit. However the virtual clocks are direct copies of the original clocks and contain the same information, except for their labels. The labels do not change the results of timing analysis. Since the timing analysis which uses models contains the same total information as the original timing analysis, both will create the same result when they process the entire circuit.

CONCLUSION

The circuit models of the present invention can be used in any circuit optimizer technology to provide a more effective and efficient optimization result. In one embodiment, the models of the present invention can be used within the optimization processes discussed herein, e.g., within block and top optimization, within bottle optimization and within in-context optimization.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the Claims appended hereto and their equivalents.

What is claimed is:

1. A method of optimizing a design of an integrated circuit device comprising the steps of:
    a) accessing a netlist representing said integrated circuit design, the netlist including a top-level block coupled to at least a first circuit block and a second circuit block;
    b) creating a first model of the first circuit block and a second model of the second circuit block, the first model and the second model abstracting circuitry of the first circuit block and the second circuit block respectively; and
    c) optimizing the netlist by optimizing the first circuit block, the second circuit block, and the top-level block to yield an optimized netlist the step c) comprising the steps of:
        c1) optimizing the first and second circuit blocks;
        c2) replacing the first and second circuit blocks in the top-level block with the first and second models respectively;
        c3) optimizing the top-level block with the first and second models included therein; and
        c4) generating the optimized netlist by combining the optimized first and second circuit blocks from step c1) and the optimized top-level block from step c3), and wherein step c1 and step c3 are performed in parallel.

2. The method of claim 1 wherein the top-level block includes glue logic for the integrated circuit design.

3. The method of claim 1 wherein the first and second models require less memory to store than the respective first and second circuit blocks.

4. The method of claim 1 wherein the first and second circuit blocks are optimized using characterization.

5. The method of claim 1 wherein the first and second models are configured to include timing exception information for the respective first and second circuit blocks.

6. The method of claim 5 further comprising the step of replacing the first and second circuit blocks in the top-level block with the first and second models respectively, wherein the timing exception information included in the first and second models is configured to allow the top-level block to be optimized with the first and second models included therein.

7. The method of claim 1 wherein step c1 comprises the step of the first circuit block with a portion of the top-level block.

8. The method of claim 1 wherein step c1 comprises the step of optimizing the first circuit block with a portion of the top-level block wherein the portion extends from the first circuit block up to the inputs of the second circuit block.

9. The method of claim 1 wherein step c1 comprises the step of optimizing the first circuit block with a portion of the top-level block wherein the portion extends from the first circuit block to the second circuit block and including a portion of the second circuit block.

10. The method of claim 1 wherein the first circuit block is optimized with the top-level block, the second circuit block being replaced with the second model.

11. A method of optimizing a design of an integrated circuit device comprising the steps of:
    a) accessing a netlist representing the integrated circuit design wherein the netlist includes a top-level block and at least a first circuit block and a second circuit block, the top-level block including glue logic for coupling the first and second circuit blocks;
    b) creating a first model of the first circuit block and a second model of the second circuit block each operable for abstracting circuitry of the first circuit block and the second circuit block respectively, wherein the first and second models require less memory to store than the respective first and second circuit blocks, and wherein the first and second models include timing exception data for the respective first and second circuit blocks; and c) optimizing the netlist by optimizing the first circuit block, the second circuit block, and the top-level block to yield an optimized netlist step c comprising the steps of:
  c1) optimizing the first and second circuit blocks independent of each other;
  c2) replacing the first and second circuit blocks in the top-level block with the first and second models respectively;
  c3) optimizing the top-level block with the first and second models included therein; and
  c4) combining the optimized first and second circuit blocks from step c1) and the optimized top-level block from step c3), and wherein step c1) and step c3) are performed in parallel.

12. The method of claim 11 further comprising the step of replacing the first and second circuit blocks in the top-level block with the first and second models respectively, wherein the timing exception information included in the first and second models is configured to allow the top-level block to be optimized with the first and second models included therein.

13. The method of claim 11 wherein step c1 comprises the step of optimizing the first circuit block with a portion of the top-level block.

14. The method of claim 11 wherein step c1 comprises the step of optimizing the first circuit block with a portion of the top-level block, the portion extending from the first circuit block up to the inputs of the second circuit block.

15. The method of claim 11 wherein step c1 comprises the step of optimizing the first circuit block with a portion of the top-level block, the portion extending from the first circuit block to the second circuit block and including a portion of the second circuit block.

16. The method of claim 11 wherein the first circuit block is optimized with the top-level block, the second circuit block being replaced with the second model.

17. The method of claim 11 comprising the step of optimizing the first and second circuit blocks again after the top-level block is optimized such that changes in timing exceptions from the optimization of the top-level block are accounted for.

18. A computer-implemented synthesis system including a digital computer for processing computer readable instructions, which when executed cause the digital computer to implement a method for optimizing the design of the integrated circuit design, the method comprising the steps of:
  a) accessing a netlist representing the integrated circuit design wherein the netlist includes a top-level block and at least a first and a second circuit block, the top-level block including glue logic for coupling the first and second circuit blocks;
  b) creating a first model of the first circuit block and a second model of the second circuit block each abstracting circuitry of the first circuit block and the second circuit block respectively, wherein the first and second models require less memory to store than the respective first and second circuit blocks, and wherein the first and second models are configured to include timing exception data for the respective first and second circuit blocks; and
  c) optimizing the netlist by independently optimizing the first circuit block, the second circuit block, and the top-level block to yield an optimized netlist the step c) comprising the steps of:
    c1) optimizing the first and second circuit blocks using characterization;
    c2) replacing the first and second circuit blocks in the top-level block with the first and second models respectively;
    c3) optimizing the top-level block with the first and second models included therein; and
    c4) generating the optimized netlist by combining the optimized first and second circuit blocks from step c1) and the optimized top-level block from step c3), and wherein step c1) and step c3) are performed in parallel.

19. The system of claim 18 wherein the method comprises further the step of replacing the first and second circuit blocks in the top-level block with the first and second models respectively, wherein the timing exception data included in the first and second models is configured to allow the top-level block to be optimized with the first and second models included therein.

20. The system of claim 18 wherein the method further comprises the step of optimizing the first circuit block with a portion of the top-level block.

21. The system of claim 18 wherein the method further comprises the step of optimizing the first circuit block is optimized with a portion of the top-level block, the portion extending from the first circuit block up to the inputs of the second circuit block.

22. The system of claim 18 wherein the method further comprises the step of optimizing the first circuit block is optimized with a portion of the top-level block, the portion extending from the first circuit block to the second circuit block and including a portion of the second circuit block.

23. The system of claim 18 wherein the method further comprises the step of optimizing the first circuit block is optimized with the top-level block, the second circuit block being replaced with the second model.

24. The system of claim 18 comprising the step of optimizing the first and second circuit blocks again after the top-level block is optimized such that changes in timing exceptions from the optimization of the top-level block are optimized in the first and second circuit blocks.

25. A method of optimizing a design of an integrated circuit device comprising the steps of:
  a) accessing a netlist representing said integrated circuit design, the netlist including a top-level block coupled to at least a first circuit block and a second circuit block;
  b) creating a first model of the first circuit block and a second model of the second circuit block, the first model and the second model abstracting circuitry of the first circuit block and the second circuit block respectively; and
  c) optimizing the netlist by optimizing the first circuit block, the second circuit block, and the top-level block to yield an optimized netlist the step c) comprising the steps of:
    c1) replacing the first circuit block in the top-level block with the first model;
    c2) optimizing the top-level block and the second circuit block by optimizing the top level block with the first model and the second circuit block included therein;
    c3) replacing the second circuit block in the top level block with the second model;
    c4) optimizing the top-level block and the first circuit block by optimizing the top level block with the first circuit block and the second model included therein; and
    c5) generating the optimized netlist by combining the optimized first circuit block from step c2) and the second optimized circuit block from step c4) and the optimized top-level block from step c4), and wherein step c2) and step c4) are performed in parallel.

26. The method of claim 25 wherein the top-level block includes glue logic for the integrated circuit design.

27. The method of claim 25 wherein the first and second models require less memory to store than the respective first and second circuit blocks.

28. The method of claim 25 wherein the first and second models are configured to include timing exception information for the respective first and second circuit blocks.

* * * * *